(12) United States Patent
Wang et al.

(10) Patent No.: US 12,266,309 B2
(45) Date of Patent: Apr. 1, 2025

(54) DISPLAY SUBSTRATE AND DRIVING METHOD THEREOF, AND DISPLAY DEVICE

(71) Applicant: BOE Technology Group Co., Ltd., Beijing (CN)

(72) Inventors: Yanyan Wang, Beijing (CN); Lujiang Huangfu, Beijing (CN); Wenjing Tan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/158,254

(22) Filed: Jan. 23, 2023

(65) Prior Publication Data

US 2023/0162683 A1 May 25, 2023

Related U.S. Application Data

(63) Continuation of application No. 17/578,175, filed on Jan. 18, 2022, now Pat. No. 11,600,230, which is a
(Continued)

(30) Foreign Application Priority Data

| Jun. 20, 2018 | (CN) | ......................... 201810638716.2 |
| Jun. 20, 2018 | (CN) | ......................... 201810639832.6 |
| Jun. 29, 2018 | (CN) | ......................... 201810714668.0 |

(51) Int. Cl.
*G09G 3/3258* (2016.01)
*H10K 59/35* (2023.01)

(52) U.S. Cl.
CPC ............ *G09G 3/3258* (2013.01); *H10K 59/35* (2023.02); *G09G 2300/0443* (2013.01); *G09G 2310/027* (2013.01)

(58) Field of Classification Search
CPC ... G09G 2300/0452; G09G 2300/0426; G09G 2300/0443; G09G 2300/0819;
(Continued)

(56) References Cited

U.S. PATENT DOCUMENTS

| 7,205,713 B2 | 4/2007 | Kiguchi |
| 9,564,477 B2 | 2/2017 | Kim |

(Continued)

FOREIGN PATENT DOCUMENTS

| CN | 1550846 A | 12/2004 |
| CN | 103886809 A | 6/2014 |

(Continued)

OTHER PUBLICATIONS

Mar. 26, 2021—CN—First Office Action Appn 201980000805.7.
(Continued)

*Primary Examiner* — Dong Hui Liang
(74) *Attorney, Agent, or Firm* — Banner & Witcoff, Ltd.

(57) ABSTRACT

A display substrate, a driving method thereof, and a display device. The display substrate includes: a first display sub-region including a plurality of first repeating regions each including a first pixel unit and a second pixel unit disposed adjacently, the first pixel unit including a first sub-pixel and a second sub-pixel, and the second pixel unit including a second sub-pixel and a third sub-pixel; and a second display sub-region including a plurality of second repeating regions each including a third pixel unit and a first transparent pixel, the third pixel unit including a first sub-pixel, a second sub-pixel and a third sub-pixel; the first transparent pixel is configured such that a pixel density of the second display sub-region is less than a pixel density of the first display sub-region, and a light transmittance of the second display sub-region is greater than a light transmittance of the first display sub-region.

16 Claims, 41 Drawing Sheets

Related U.S. Application Data continuation of application No. 16/644,791, filed as application No. PCT/CN2019/090404 on Jun. 6, 2019, now Pat. No. 11,263,968.

(58) Field of Classification Search
CPC ............. G09G 2340/0407; G09G 3/20; G09G 3/2074; G09G 3/2003; G09G 3/3266; G09G 3/3208; G09G 2310/027
See application file for complete search history.

(56) References Cited

U.S. PATENT DOCUMENTS

| | | |
|---|---|---|
| 9,576,519 B2 | 2/2017 | Guo et al. |
| 9,697,760 B2 | 7/2017 | Wang |
| 9,728,588 B2 * | 8/2017 | Peng ................... H10K 59/353 |
| 10,043,483 B2 | 8/2018 | Song et al. |
| 10,192,498 B2 | 1/2019 | Cao et al. |
| 10,274,654 B2 | 4/2019 | Jin et al. |
| 10,373,546 B2 | 8/2019 | Huang |
| 10,388,680 B2 | 8/2019 | Zheng et al. |
| 10,552,696 B2 | 2/2020 | Cho et al. |
| 10,586,511 B2 | 3/2020 | Yang et al. |
| 10,606,541 B2 | 3/2020 | Yanagisawa et al. |
| 11,138,927 B2 | 10/2021 | Jung et al. |
| 2004/0227703 A1 | 11/2004 | Lamvik et al. |
| 2005/0046341 A1 | 3/2005 | Ikeda et al. |
| 2006/0033422 A1 | 2/2006 | Chao et al. |
| 2006/0152531 A1 | 7/2006 | Lin et al. |
| 2007/0262916 A1 | 11/2007 | Kee et al. |
| 2008/0211757 A1 | 9/2008 | Weng et al. |
| 2009/0267868 A1 | 10/2009 | Takatani et al. |
| 2010/0039011 A1 | 2/2010 | Karaki et al. |
| 2010/0066655 A1 | 3/2010 | Uh et al. |
| 2012/0092397 A1 | 4/2012 | DeLuca |
| 2014/0285642 A1 | 9/2014 | Hwang et al. |
| 2015/0029208 A1* | 1/2015 | Kim ..................... G09G 3/2074 345/590 |
| 2015/0091953 A1 | 4/2015 | Wu |
| 2015/0371612 A1 | 12/2015 | DeLuca |
| 2016/0020374 A1 | 1/2016 | Aketa et al. |
| 2016/0027359 A1 | 1/2016 | Guo et al. |
| 2016/0078807 A1 | 3/2016 | Sun et al. |
| 2016/0120005 A1 | 4/2016 | Wu et al. |
| 2016/0155391 A1 | 6/2016 | Takesue et al. |
| 2016/0203748 A1 | 7/2016 | Matsueda et al. |
| 2016/0240594 A1 | 8/2016 | Zhu |
| 2016/0267847 A1 | 9/2016 | Chen et al. |
| 2016/0293120 A1 | 10/2016 | Yang et al. |
| 2017/0076654 A1 | 3/2017 | Wang |
| 2018/0012566 A1 | 1/2018 | Lin et al. |
| 2018/0026218 A1 | 1/2018 | Kobayashi et al. |
| 2018/0040676 A1 | 2/2018 | Hack et al. |
| 2018/0088260 A1 | 3/2018 | Jin et al. |
| 2018/0165533 A1* | 6/2018 | Cho ....................... G09G 5/003 |
| 2018/0190741 A1* | 7/2018 | Lou ..................... H10K 50/824 |
| 2018/0374426 A1 | 12/2018 | Chen et al. |
| 2019/0057644 A1 | 2/2019 | Yan |
| 2019/0130822 A1 | 5/2019 | Jung et al. |
| 2019/0212788 A1 | 7/2019 | Kwak et al. |
| 2019/0251895 A1 | 8/2019 | Zhang et al. |
| 2019/0310724 A1* | 10/2019 | Yeke Yazdandoost ..................... H10K 59/121 |
| 2019/0326366 A1 | 10/2019 | Fan et al. |
| 2019/0333434 A1 | 10/2019 | Chen |
| 2019/0373166 A1* | 12/2019 | Jia ........................ G09G 3/2003 |
| 2020/0034100 A1 | 1/2020 | Fan et al. |
| 2020/0043994 A1 | 2/2020 | Chen et al. |
| 2020/0052059 A1 | 2/2020 | Chen et al. |
| 2020/0066809 A1 | 2/2020 | Liu |
| 2020/0175905 A1 | 6/2020 | Yamazaki et al. |
| 2021/0013277 A1 | 1/2021 | Liu et al. |
| 2021/0358379 A1 | 11/2021 | Li et al. |
| 2023/0154366 A1 | 5/2023 | Lee et al. |

FOREIGN PATENT DOCUMENTS

| | | |
|---|---|---|
| CN | 104157246 A | 11/2014 |
| CN | 104241295 A | 12/2014 |
| CN | 104465714 A | 3/2015 |
| CN | 104615395 A | 5/2015 |
| CN | 104658499 A | 5/2015 |
| CN | 104795016 A | 7/2015 |
| CN | 205355055 U | 6/2016 |
| CN | 106324875 A | 1/2017 |
| CN | 106530994 A | 3/2017 |
| CN | 206194742 U | 5/2017 |
| CN | 106921767 A | 7/2017 |
| CN | 106935615 A | 7/2017 |
| CN | 107422517 A | 12/2017 |
| CN | 107633802 A | 1/2018 |
| CN | 107808627 A | 3/2018 |
| CN | 107819018 A | 3/2018 |
| CN | 107819020 A | 3/2018 |
| CN | 107920142 A | 4/2018 |
| CN | 107945767 A | 4/2018 |
| CN | 107948354 A | 4/2018 |
| CN | 207264695 U | 4/2018 |
| CN | 207338380 U | 5/2018 |
| CN | 108520888 A | 9/2018 |
| CN | 208507679 U | 2/2019 |
| EP | 2843466 A1 | 3/2015 |
| EP | 3241236 A1 | 11/2017 |
| EP | 3813044 A1 | 4/2021 |
| JP | 2009169070 A | 7/2009 |
| JP | 2011048962 A | 3/2011 |
| JP | 2016195782 A | 11/2016 |
| JP | 2017037274 A | 2/2017 |
| JP | 2017058671 A | 3/2017 |
| JP | 2017533475 A | 11/2017 |
| KR | 20070067962 A | 6/2007 |
| KR | 20150107883 A | 9/2015 |
| KR | 20170024182 A | 3/2017 |
| KR | 20170113066 A | 10/2017 |
| KR | 20180067196 A | 6/2018 |
| WO | 2014114178 A1 | 7/2014 |
| WO | 2021215561 A1 | 10/2021 |

OTHER PUBLICATIONS

Jul. 8, 2022—(US)—Non-Final Office Action U.S. Appl. No. 17/578,175.
Dec. 22, 2023 (US) Non-Final Office Action U.S. Appl. No. 18/321,850.
Dec. 5, 2023 (EP) Oral Proceedings Appn 19826064.8-1207.
Apr. 25, 2024—(KR) Office Action No. 10-2024-7003790 with English Translation.
May 21, 2024—(US)—Non-Final Office Action U.S. Appl. No. 18/100,427.
May 7, 2020—(CN) First Office Action Appn 201810638716.2 with English Translation.
Wang, et al., "Parameters Analysis of Single Pixel of Active Matrix Array for Amorphous Silicon Thin Film Transistor Organic LED", School of Materials Science and Engineering, Shanghai University, Shanghai 201800; 2. Shanghai Guangdian NEC Liquid Crystal Display Co., Ltd., Shanghai 201108, vol. 28 No. 2, Apr. 2007.
Feb. 12, 2021—(US) Non-Final Office Action U.S. Appl. No. 16/644,791.
Feb. 3, 2022—(US) Non-Final Office Action U.S. Appl. No. 16/615,971.
Dec. 9, 2021—(US) Non-Final Office Action U.S. Appl. No. 16/615,996.
Sep. 22, 2021—(US) Non-Final Office Action U.S. Appl. No. 16/616,522.
Feb. 10 2022—(EP) Extended European Search Report Appn 19821969.3.
Feb. 10 2022—(EP) Extended European Search Report Appn 19826064.8.
Mar. 28, 2022—(KR) First Office Action Appn 20207017998 with English translation.
May 28, 2021—(IN) First Office Action Appn 201947049910 with English translation.

(56) References Cited

OTHER PUBLICATIONS

Jun. 8, 2022—(US) Final Office Action U.S. Appl. No. 16/615,996.
Sep. 3, 2022—(KR) Office Action No. 20207018044 with English Translation.
Feb. 7, 2023—(JP)—Office Action Appn 2019-559768, with English Translation.
Jun. 19, 2019—(CN) International Search Report Appn PCTCN2019078866.
Jun. 12, 2019—(CN) International Search Report Appn PCTCN2019078871.
May 30, 2019—(CN) International Search Report Appn PCTCN2019078879.
Aug. 28, 2019—(CN) International Search Report Appn PCTCN2019090404.

\* cited by examiner

| 10 | 11 | 12 | 13 | 14 | 15 | 16 | 17 | 18 | 19 |
|----|----|----|----|----|----|----|----|----|----|
| 20 | 21 | 22 | 23 | 24 | 25 | 26 | 27 | 28 | 29 |
| 30 | 31 | 32 | 33 | 34 | 35 | 36 | 37 | 38 | 39 |
| 40 | 41 | 42 | 43 | 44 | 45 | 46 | 47 | 48 | 49 |
| 50 | 51 | 52 | 53 | 54 | 55 | 56 | 57 | 58 | 59 |
| 60 | 61 | 62 | 63 | 64 | 65 | 66 | 67 | 68 | 69 |
| 70 | 71 | 72 | 73 | 74 | 75 | 76 | 77 | 78 | 79 |
| 80 | 81 | 82 | 83 | 84 | 85 | 86 | 87 | 88 | 89 |

FIG. 11

| 10 | | 12 | | 14 | | 16 | | 18 | |
|----|----|----|----|----|----|----|----|----|----|
| | | | | | | | | | |
| 30 | | 32 | | 34 | | 36 | | 38 | |
| | | | | | | | | | |
| 50 | | 52 | | 54 | | 56 | | 58 | |
| | | | | | | | | | |
| 70 | | 72 | | 74 | | 76 | | 78 | |
| | | | | | | | | | |

|    |    |    |    |    |
|----|----|----|----|----|
| 11 | 13 | 15 | 17 | 19 |
| 31 | 33 | 35 | 37 | 39 |
| 51 | 53 | 55 | 57 | 59 |
| 71 | 73 | 75 | 77 | 79 |

FIG. 12C

|    |    |    |    |    |
|----|----|----|----|----|
| 20 | 22 | 24 | 26 | 28 |
| 40 | 42 | 44 | 46 | 48 |
| 60 | 62 | 64 | 66 | 68 |
| 80 | 82 | 84 | 86 | 88 |

|    |    |    |    |    |
|----|----|----|----|----|
| 21 | 23 | 25 | 27 | 29 |
| 41 | 43 | 45 | 47 | 49 |
| 61 | 63 | 65 | 67 | 69 |
| 81 | 83 | 85 | 87 | 89 |

FIG. 12D

DISPLAY SUBSTRATE AND DRIVING METHOD THEREOF, AND DISPLAY DEVICE

CROSS-REFERENCE TO RELATED APPLICATIONS

This application is a continuation of U.S. application Ser. No. 17/578,175, filed Jan. 18, 2022, which is a continuation of U.S. application Ser. No. 16/644,791, filed Mar. 5, 2020, which is a U.S. National Phase Entry of International Application No. PCT/CN2019/090404 filed on Jun. 6, 2019, designating the United States of America and claiming priority to Chinese patent application No. 201810638716.2, filed on Jun. 20, 2018, Chinese patent application No. 201810639832.6, filed on Jun. 20, 2018, and Chinese patent application No. 201810714668.0, filed on Jun. 29, 2018, the entire disclosures of which are hereby incorporated by reference.

TECHNICAL FIELD

At least one embodiment of the present disclosure relates to a display substrate, a driving method thereof, and a display device.

BACKGROUND

With the development of electronic display products such as mobile phones, increasing the screen-to-body ratio of the display screen has become a product trend, and the necessary functional components of mobile phones such as front camera are bound to become a major factor restricting the increase of the screen-to-body ratio.

SUMMARY

At least one embodiment of the present disclosure provides a display substrate, a driving method thereof, and a display device.

At least one embodiment of the present disclosure provides a display substrate, including: a first display sub-region, the first display sub-region including a plurality of first repeating regions, each of the plurality of first repeating regions including a first pixel unit and a second pixel unit disposed adjacently, the first pixel unit including a first sub-pixel and a second sub-pixel, the second pixel unit including a second sub-pixel and a third sub-pixel; and a second display sub-region, the second display sub-region including a plurality of second repeating regions, each of the plurality of second repeating regions including a third pixel unit and a first transparent pixel, the third pixel unit including a first sub-pixel, a second sub-pixel and a third sub-pixel; the first transparent pixel is configured such that a pixel density of the second display sub-region is less than a pixel density of the first display sub-region, and such that a light transmittance of the second display sub-region is greater than a light transmittance of the first display sub-region.

For example, an area of the first transparent pixel is greater than or equal to an area of at least one of the first sub-pixel and the second sub-pixel of the first pixel unit, and the area of the first transparent pixel is greater than or equal to an area of at least one of the second sub-pixel and the third sub-pixel of the second pixel unit.

For example, an area of the first transparent pixel is greater than or equal to a sum of areas of one first sub-pixel, one second sub-pixel and one third sub-pixel in the first display sub-region.

For example, an area of the first transparent pixel is greater than or equal to an area of at least one selected from the group consisting of one first sub-pixel, one second sub-pixel and one third sub-pixel in the second display sub-region.

For example, the area of the first transparent pixel is greater than or equal to a sum of areas of the first sub-pixel, the second sub-pixel and the third sub-pixel in the third pixel unit.

For example, one first transparent pixel is provided between third pixel units adjacent in a row direction, so as to form a first transparent pixel column.

For example, an area and a shape of the first transparent pixel are respectively the same as an area and a shape of one second sub-pixel in the first display sub-region.

For example, one first transparent pixel is provided between adjacent third pixel units in a column direction, so as to form a first transparent pixel row.

For example, a plurality of first transparent pixels are disposed on both sides of the third pixel unit in a row direction and on both sides of the third pixel unit in a column direction.

For example, a plurality of first transparent pixels are disposed on both sides of at least one selected from the group consisting of the first sub-pixel, the second sub-pixel and the third sub-pixel in the third pixel unit, in both of a row direction and a column direction.

For example, sub-pixels in the second display sub-region are located in a same column as part of sub-pixels in the first display sub-region.

For example, sub-pixels in the second display sub-region are located in a same row as part of sub-pixels in the first display sub-region.

For example, the first transparent pixel includes a first transparent sub-pixel, a second transparent sub-pixel, and a third transparent sub-pixel.

For example, the first transparent sub-pixel and the first sub-pixel in the first display sub-region have a same area and a same shape; the second transparent sub-pixel and the second sub-pixel in the first display sub-region have a same area and a same shape; the third transparent sub-pixel and the third sub-pixel in the first display sub-region have a same area and a same shape.

For example, the display substrate includes a plurality of first transparent pixels, the plurality of first transparent pixels form a least one of, a plurality of transparent sub-pixel columns and a plurality of transparent sub-pixel rows.

For example, the plurality of first transparent pixels form a plurality of transparent sub-pixel columns and a plurality of transparent sub-pixel rows; and the plurality of transparent sub-pixel columns are intersected with the plurality of transparent sub-pixel rows.

For example, each third pixel unit is surrounded at least by two first transparent sub-pixels, four second transparent sub-pixels and two third transparent sub-pixels, except for the third pixel unit at an edge position of the second display sub-region.

For example, at least one of the first sub-pixel, the second sub-pixel and the third sub-pixel in each third pixel unit is surrounded at least by one first transparent sub-pixels, two second transparent sub-pixels and one third transparent sub-pixels, except for that in the third pixel unit at an edge position of the second display sub-region.

For example, a connecting line between centers of two sub-pixels adjacent in a row direction passes through a center of a transparent sub-pixel located between the two sub-pixels; the two sub-pixels adjacent in the row direction includes at least one of, two adjacent first sub-pixels, two adjacent second sub-pixels and two adjacent third sub-pixels; the transparent sub-pixel includes the first transparent sub-pixel, the second transparent sub-pixel or the third transparent sub-pixel.

For example, a connecting line between centers of two sub-pixels adjacent in a column direction passes through a center of a transparent sub-pixel located between the two sub-pixels.

For example, an orthographic projection of a center of the third sub-pixel of the second pixel unit on a connecting line between, a midpoint of a line of centers of the second sub-pixel of the first pixel unit and the second sub-pixel of the second pixel unit, and, a center of the first sub-pixel of the first pixel unit, coincides with a midpoint of a connecting line between the midpoint of the line of centers and the center of the first sub-pixel of the first pixel unit.

For example, in the first display sub-region, each first repeating region is adjacent to six first repeating regions and surrounded by the six first repeating regions.

For example, in the first repeating region, an area of at least one of the first sub-pixel and the third sub-pixel is greater than an area of at least one of the second sub-pixel of the first pixel unit and the second sub-pixel of the second pixel unit.

For example, in the third pixel unit, the second sub-pixel and the first sub-pixel are arranged in a direction parallel to an extending direction of the third sub-pixel.

For example, in the second repeating region, the second sub-pixel and the first sub-pixel of the third pixel unit are located between the first transparent pixel and the third sub-pixel.

For example, the first sub-pixel, the second sub-pixel and the third sub-pixel in the third pixel unit are sequentially arranged; or, connecting lines of centers of the first sub-pixel, the second sub-pixel and the third sub-pixel in the third pixel unit form a triangle.

For example, the display substrate further includes a first power line and a second power line; the first power line is connected to the first pixel unit and the second pixel unit; the second power line is connected to the third pixel unit; and the first power line and the second power line are insulated from each other.

For example, the display substrate further includes a power voltage adjusting portion, the power voltage adjusting portion is configured to adjust a first voltage signal of the third pixel unit in the case where a display grayscale is greater than a first grayscale, so that the first voltage signal is adjusted to be increased or decreased.

For example, the display substrate further includes a transition display sub-region, the transition display sub-region is located between the second display sub-region and the first display sub-region, the transition display sub-region includes a plurality of third repeating regions, each of the plurality of third repeating regions includes a fourth pixel unit and a second transparent pixel, the fourth pixel unit includes a first sub-pixel, a second sub-pixel and a third sub-pixel, and an area of the second transparent pixel is smaller than an area of the first transparent pixel.

For example, the light transmittance of the second display sub-region is less than a light transmittance of the transition display sub-region.

For example, a distribution density of the second transparent pixel is less than a distribution density of the first transparent pixel.

For example, the area of the second transparent pixel is greater than or equal to an area of at least one selected from the group consisting of the first sub-pixel, the second sub-pixel and the third sub-pixel in the fourth pixel unit.

For example, the display substrate includes a plurality of second transparent pixels, and areas of the plurality of second transparent pixels are the same.

For example, in the fourth pixel unit, the third sub-pixel, the first sub-pixel and the second sub-pixel are sequentially arranged, and an area of the second sub-pixel is smaller than an area of at least one of the third sub-pixel and the first sub-pixel.

For example, the area and a shape of the second transparent pixel are respectively the same as an area and a shape of the second sub-pixel in the first display sub-region.

For example, the first sub-pixel in the transition display sub-region and the first sub-pixel in the first display sub-region have a same area and a same shape; an area of the first sub-pixel in the second display sub-region is smaller than an area of the first sub-pixel in the first display sub-region.

For example, the second sub-pixel in the first display sub-region, the second sub-pixel in the second display sub-region and the second sub-pixel in the transition display sub-region have a same area and a same shape; the third sub-pixel in the first display sub-region, the third sub-pixel in the second display sub-region and the third sub-pixel in the transition display sub-region have a same area and a same shape.

For example, the display substrate includes a plurality of second transparent pixels, the plurality of second transparent pixels include a first portion and a second portion sequentially arranged in a direction pointing from a position close to the first display sub-region to a position close to the second display sub-region, and an area of the first portion is larger than an area of the second portion.

For example, the display substrate includes a plurality of second transparent pixels, the plurality of second transparent pixels include a first portion, a second portion and a third portion sequentially arranged in a direction pointing from a position close to the first display sub-region to a position close to the second display sub-region, and areas of the first portion, the second portion and the third portion are sequentially reduced.

For example, the display substrate further includes a grayscale voltage adjusting portion, the grayscale voltage adjusting portion is configured to adjust a grayscale voltage of at least one selected from the group consisting of the first sub-pixel, the second sub-pixel and the third sub-pixel in the third pixel unit, and the first sub-pixel, the second sub-pixel and the third sub-pixel in the fourth pixel unit in the case where a display grayscale is less than or equal to a first grayscale.

For example, the display substrate further includes a first power line and a second power line; the first power line is connected to the first pixel unit and the second pixel unit; the second power line is connected to the third pixel unit and the fourth pixel unit; and the first power line and the second power line are insulated from each other.

For example, sub-pixels in the transition display sub-region are located in a same row as part of sub-pixels in the first display sub-region.

For example, sub-pixels in the transition display sub-region are located in a same column as part of sub-pixels in the first display sub-region.

For example, one of the first sub-pixel and the third sub-pixel is a blue sub-pixel, and the other one of the first sub-pixel and the third sub-pixel is a red sub-pixel; and the second sub-pixel is a green sub-pixel.

At least one embodiment of the present disclosure further provides a display device, including any of the display substrates described above.

At least one embodiment of the present disclosure further provides a driving method of the display substrate, including: driving the first pixel unit and the second pixel unit by means of sub-pixel rendering; and driving the first sub-pixel, the second sub-pixel and the third sub-pixel in the third pixel unit to respectively display a corresponding sub-pixel with a higher brightness, of a same color, of two adjacent pixels in an image to be displayed corresponding to the third pixel unit.

For example, the driving method further includes: adjusting a grayscale voltage of at least one selected from the group consisting of the first sub-pixel, the second sub-pixel and the third sub-pixel in the third pixel unit in the case where a display grayscale is less than or equal to a first grayscale.

For example, the driving method further includes: adjusting a first voltage signal of the third pixel unit in the case where a display grayscale is greater than a first grayscale, so that the first voltage signal is adjusted to be increased or decreased.

At least one embodiment of the present disclosure further provides a driving method of the display substrate, including: driving the first pixel unit and the second pixel unit by means of sub-pixel rendering; driving the first sub-pixel, the second sub-pixel and the third sub-pixel in the third pixel unit to respectively display a corresponding sub-pixel with a higher brightness, of a same color, of two adjacent pixels in an image to be displayed corresponding to the third pixel unit; and driving the first sub-pixel, the second sub-pixel and the third sub-pixel in the fourth pixel unit to respectively display a corresponding sub-pixel with a higher brightness, of a same color, of two adjacent pixels in an image to be displayed corresponding to the fourth pixel unit.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

FIG. 11 is a schematic diagram of pixels in initial image pixel data corresponding to respective sub-pixels in the second display sub-region in a display method according to an embodiment of the present disclosure;

FIG. 12A is a first schematic diagram of reference pixels in the initial image pixel data corresponding to respective sub-pixels in the second display sub-region in a display method according to an embodiment of the present disclosure.

FIG. 12B is a second schematic diagram of reference pixels in the initial image pixel data corresponding to respective sub-pixels in the second display sub-region in a display method according to an embodiment of the present disclosure.

FIG. 12C is a third schematic diagram of reference pixels in the initial image pixel data corresponding to respective sub-pixels in the second display sub-region in a display method according to an embodiment of the present disclosure; and FIG. 12D is a fourth schematic diagram of reference pixels in the initial image pixel data corresponding to respective sub-pixels in the second display sub-region in a display method according to an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In full-screen display technology, when an under-screen camera scheme is adopted, in order to improve a light transmittance of a region provided with the camera on a display screen/display substrate, a partial transparency is realized by reducing a pixel distribution density of the region provided with the camera on the display substrate.

Figure 1A:
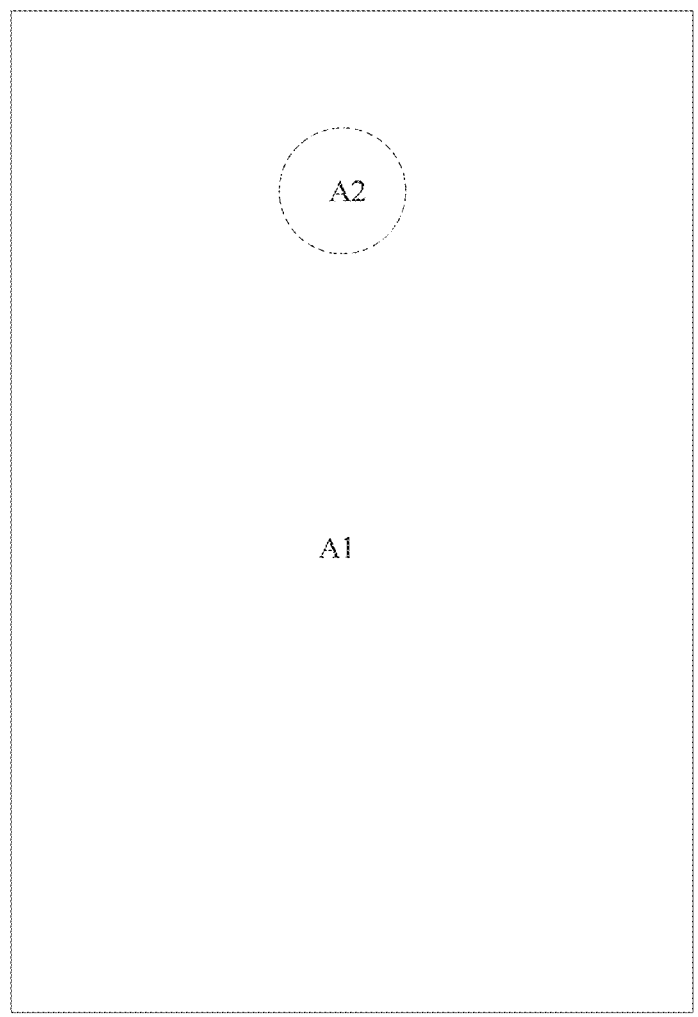
FIG. 1A is a schematic diagram of a display substrate according to an embodiment of the present disclosure.

FIG. 1A is a schematic diagram of a display substrate. As shown in FIG. 1A, the display substrate includes a first display sub-region A1 and a second display sub-region A2. To achieve the objective of increasing the screen-to-body ratio, the under-screen camera scheme can be adopted, that is, the camera is set under the second display sub-region A2 of the display substrate in a manner of reducing the pixel distribution density of the second display sub-region A2 to increase the light transmittance of the screen. However, because the pixel distribution density of the second display sub-region A2 decreases, a brightness of the second display sub-region A2 will be lower than that of a surrounding region (the first display sub-region A1), resulting in that the second display sub-region A2 becomes a dark region with an obviously visible boundary.

The embodiment of the present disclosure shown in FIG. 1A will be described by taking that the second display sub-region A2 is a circular region and is located in the medium-upper part of the display substrate as an example, but is not limited thereto. For example, in other embodiments, the second display sub-region A2 may be of other shapes, or the position of the second display sub-region A2 may be adjusted. For example, in other embodiments, the display substrate may be adjusted to have other shapes.

At least one embodiment of the present disclosure provides a display substrate, which can reduce the boundary between the second display sub-region A2 and the first display sub-region A1 and/or, increase the light transmittance of the screen.

For example, in the embodiment of the present disclosure, the pixel distribution density in the first display sub-region A1 is greater than that in the second display sub-region A2.

In the display substrate according to the embodiment of the present disclosure, the display region is designed to include a first display sub-region with high pixel distribution density (i.e., high resolution) and a second display sub-region with low pixel distribution density (i.e., low resolution). Because the pixel distribution density in the second display sub-region is low, components such as a camera, a sensor, an earpiece and the like can be arranged in the second display sub-region, that is, the screen-to-body ratio of the display substrate can be increased by increasing the light transmittance of the screen through reducing a partial pixel distribution density.

It should be noted that, a pixel distribution density can refer to the number of the pixels uniformly arranged in a unit area. If the number of the pixels arranged in a unit area is large, the pixel distribution density is large and the resolution is high. On the contrary, if the number of the pixels arranged in a unit area is small, the pixel distribution density is small and the resolution is low.

For example, in the embodiment of the present disclosure, a specific computing formula of the pixel distribution density is:

$$\rho = \frac{\sqrt{x^2 + y^2}}{S}.$$

For example, in the above computing formula, $\rho$ represents the pixel distribution density, X represents the number of the display pixels in a row direction, Y represents the number of the display pixels in a column direction, and S represents a screen area.

For example, in the display substrate provided by the embodiment of the present disclosure, the number of the second display sub-region can be one or more. Moreover, the first display sub-region can be a continuous region or the first display sub-region can be a discontinuous region, which can be designed and determined according to actual application environment and is not limited here.

For example, in the display substrate provided by the embodiment of the present disclosure, the pixel distribution density in the second display sub-region is determined according to the elements to be disposed in the second display sub-region and the display requirements, and is not limited here. For example, taking that a camera is set in the second display sub-region as an example, when the pixel distribution density is too high, a good display effect can be ensured, but an imaging definition is affected; when the pixel distribution density is too low, a high imaging definition can be ensured, but the display is affected. For example, according to the current resolution capability of the display substrate, the pixel distribution density of the second display sub-region is generally not less than ¼ of the pixel distribution density of the first display sub-region. For example, the pixel distribution density of the second display sub-region is ½, ⅓ or ¼ of the pixel distribution density of the first display sub-region. Of course, when the resolution of the display substrate can be made higher, the ratio of the pixel distribution density of the second display sub-region to the pixel distribution density of the first display sub-region can be set smaller.

In the display substrate provided by the embodiment of the present disclosure, as shown in FIG. 1A, the area of the second display sub-region A2 can be made smaller than the area of the first display sub-region A1. Of course, in practical applications, the area of the second display sub-region can be designed according to the elements arranged in the second display sub-region, and is not limited here.

Generally, pixel units are arranged in a display region, and a plurality of sub-pixels are arranged in a pixel unit. In the embodiment of the present disclosure, a pixel refers to a combination of sub-pixels capable of independently displaying a pixel point, for example, a pixel may refer to a pixel unit.

Figure 1B:
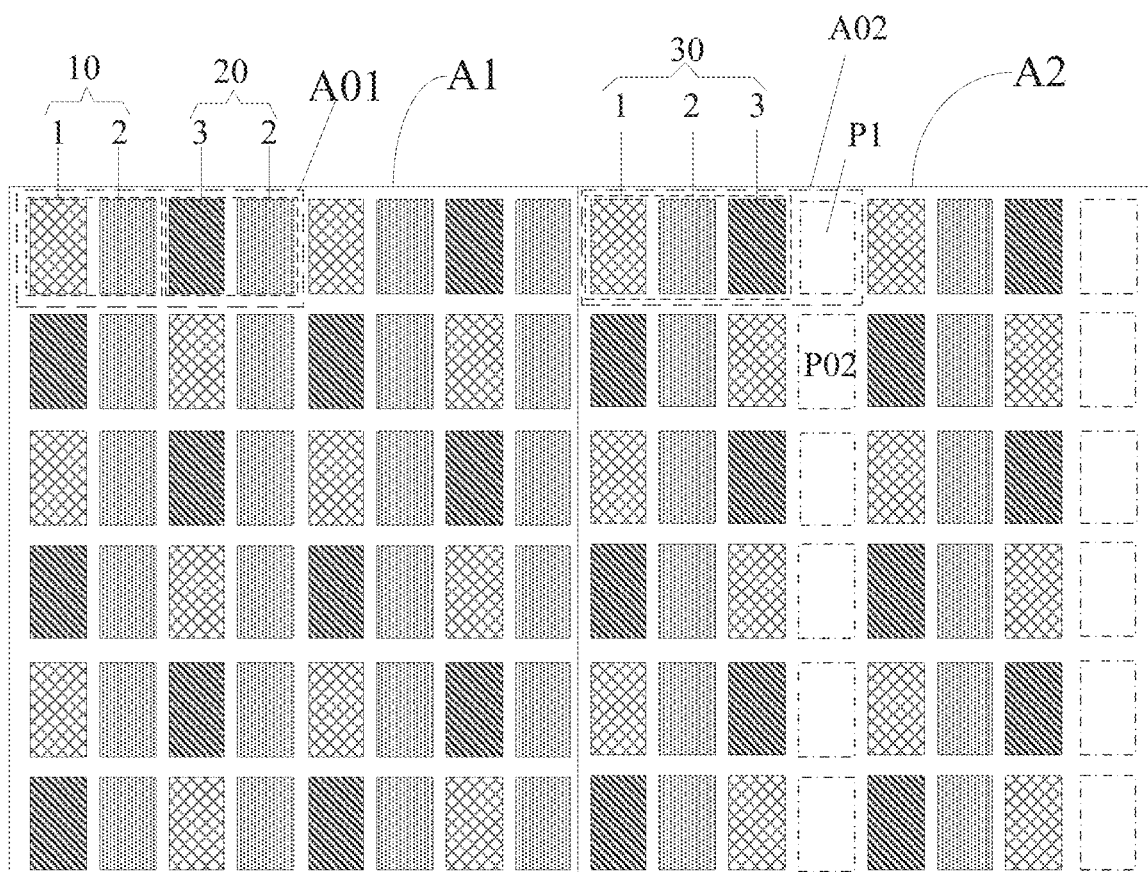
FIGS. 1B-1S are schematic diagrams of a display substrate according to some embodiments of the present disclosure.
Figure 1C:
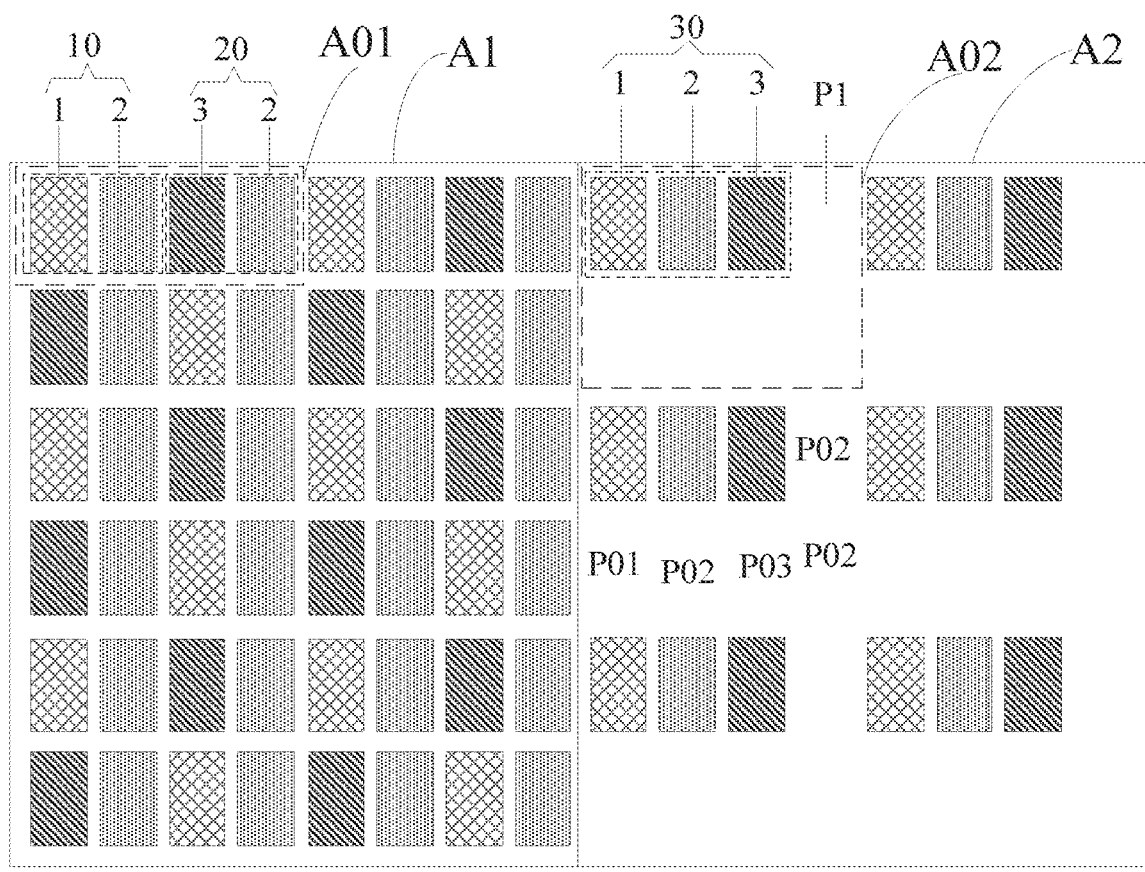
Figure 1D:
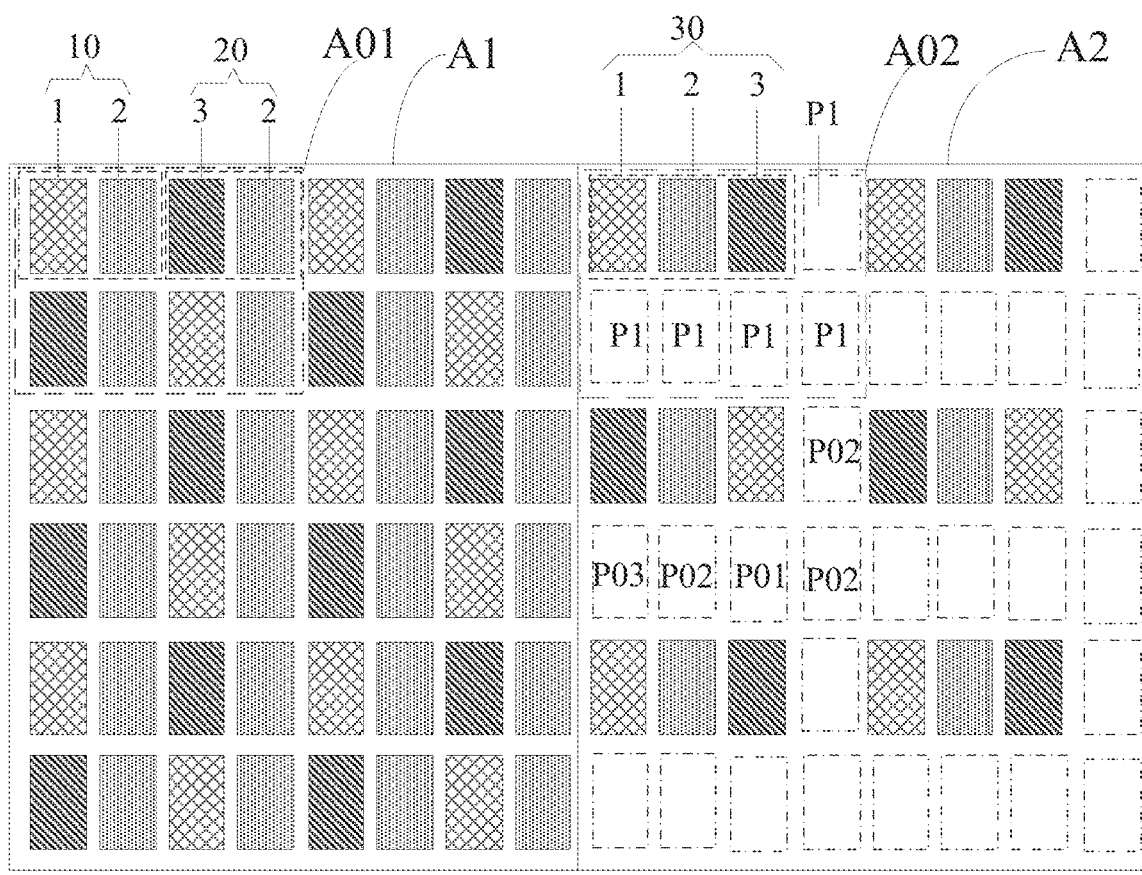
Figure 1E:
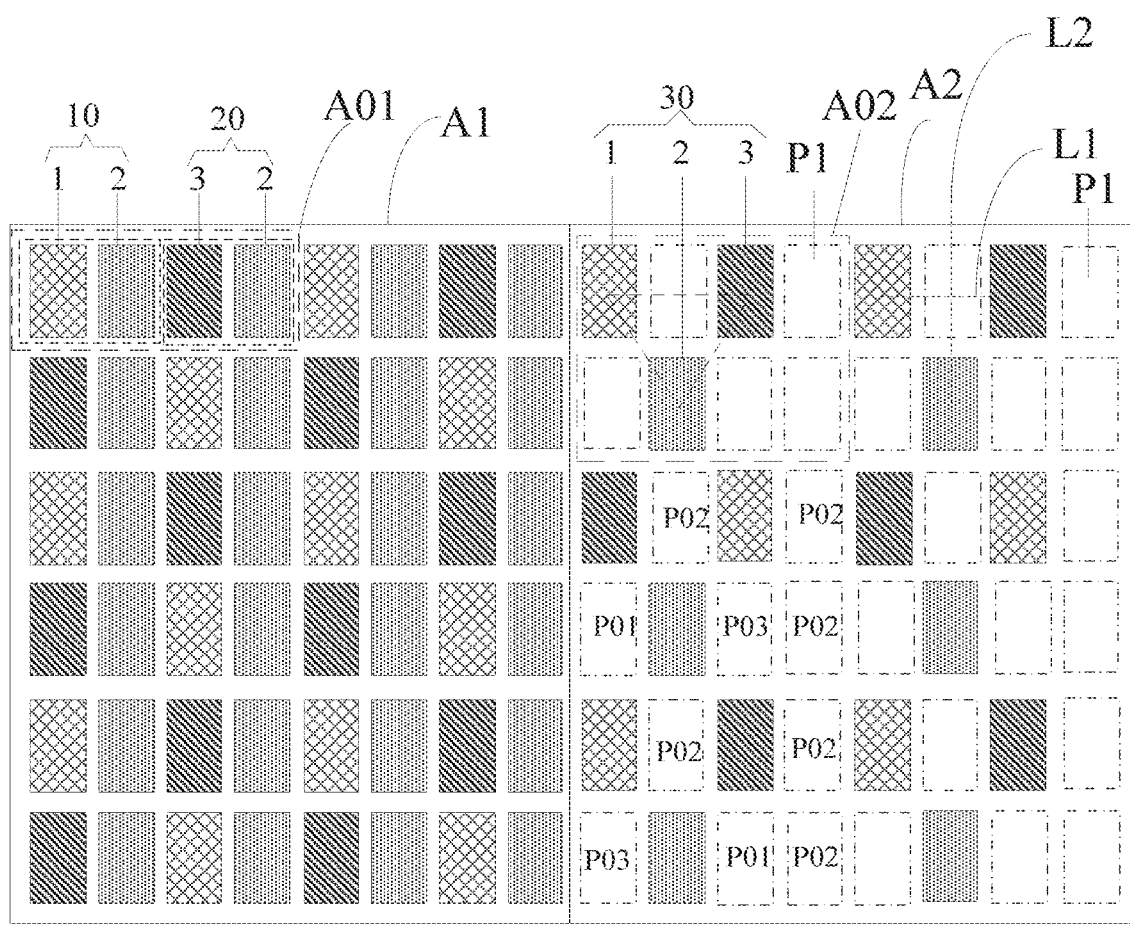
Figure 1F:
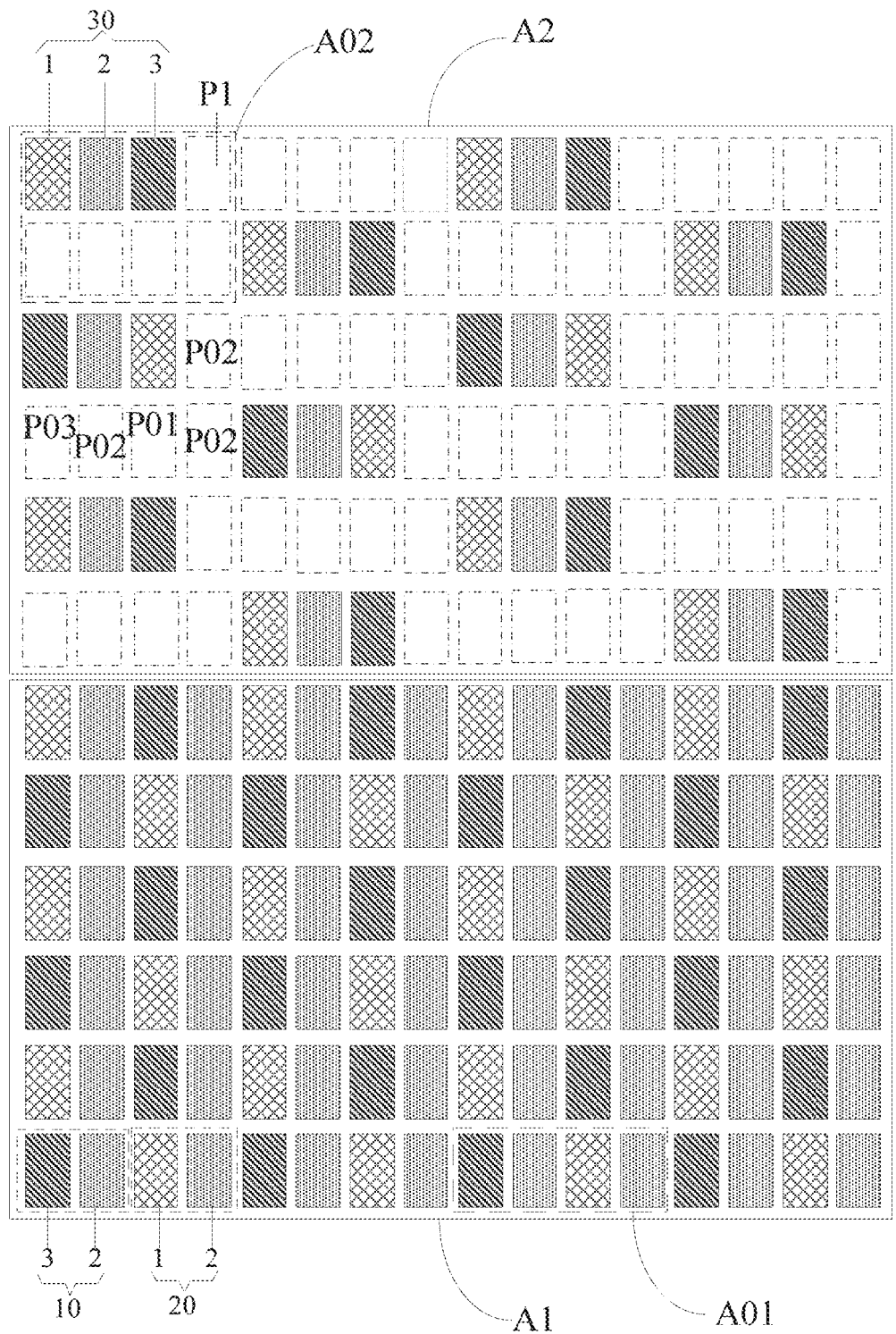
Figure 1G:
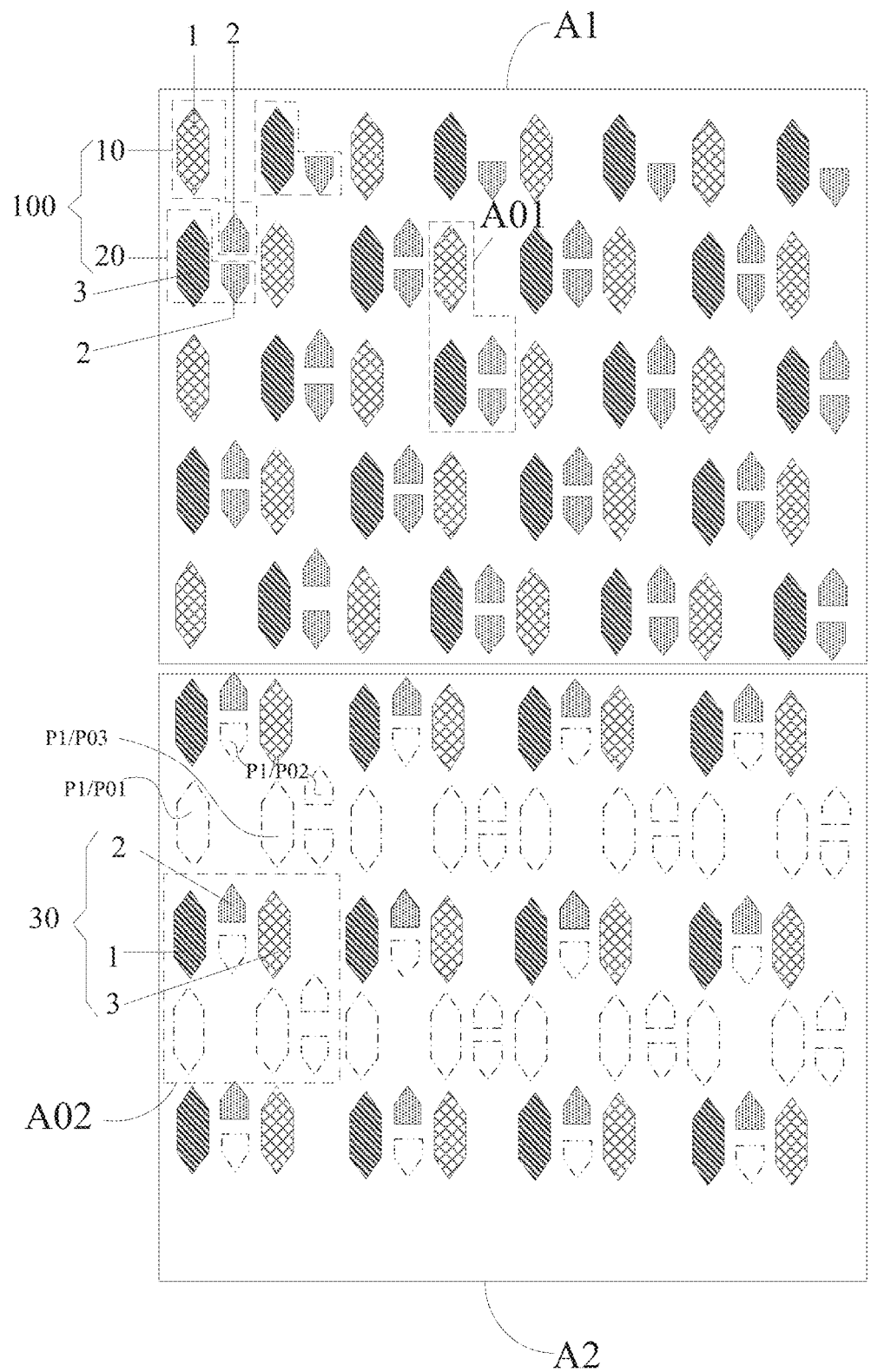
Figure 1H:
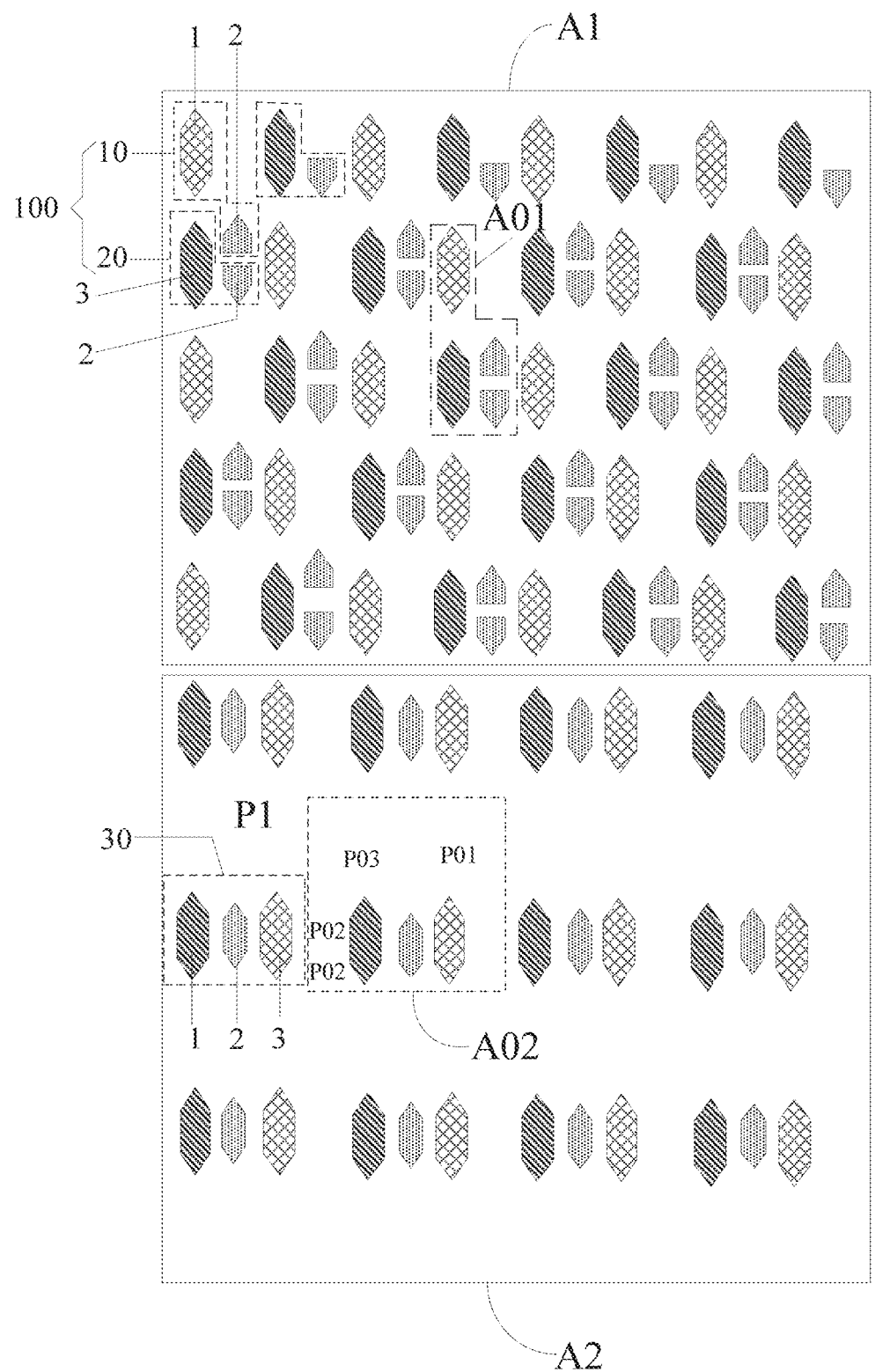
Figure 1I:
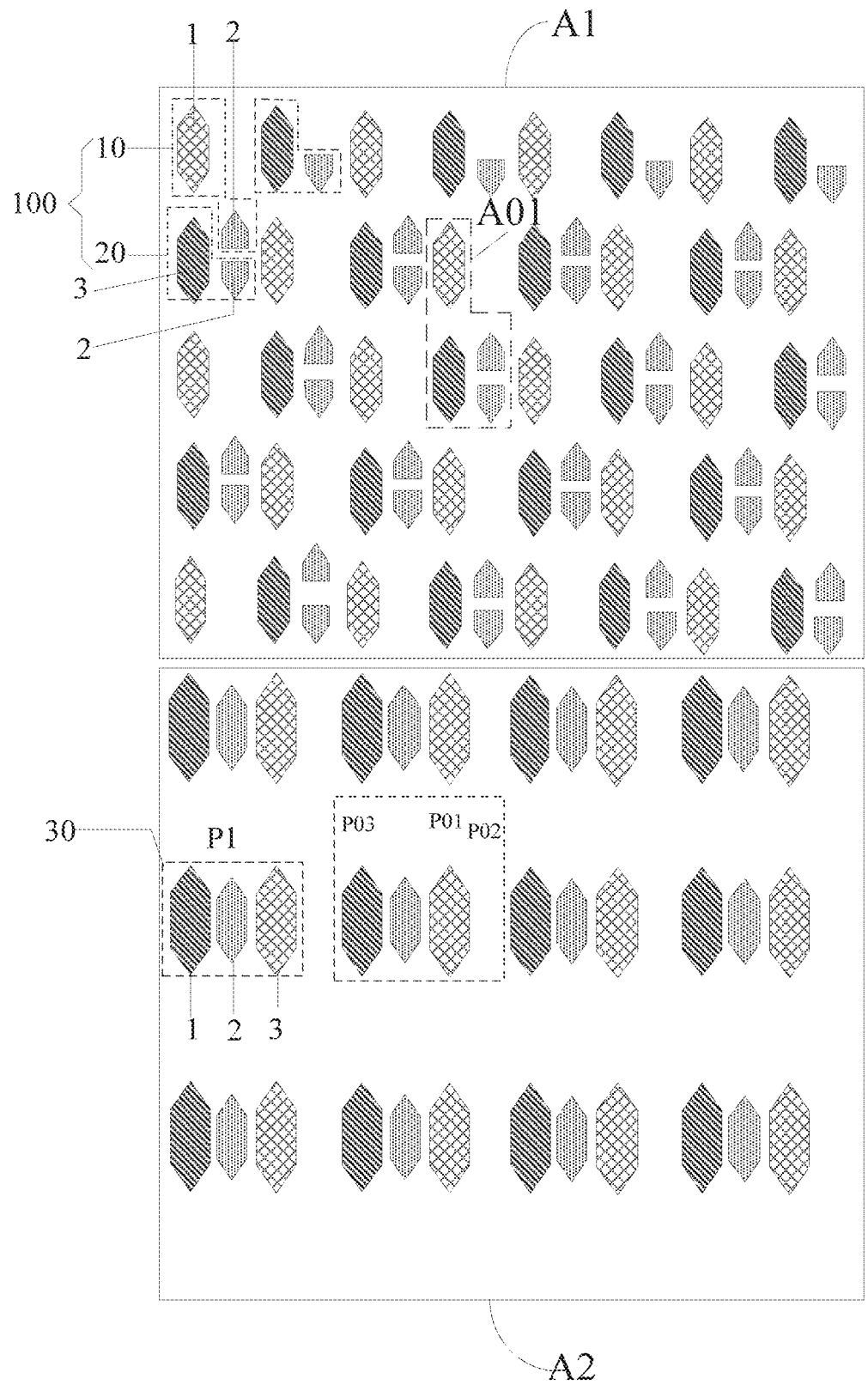
Figure 1J:
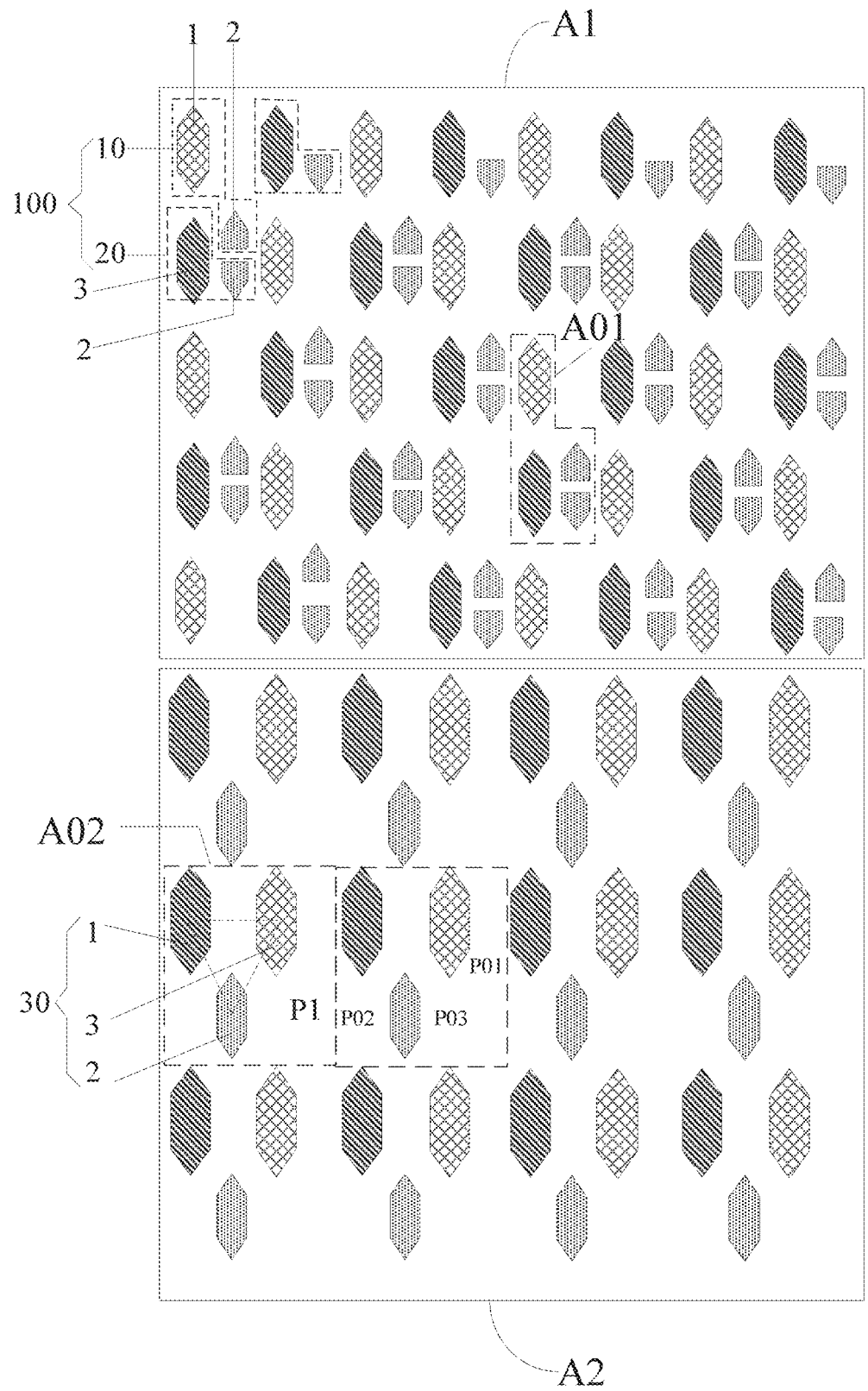
Figure 1K:
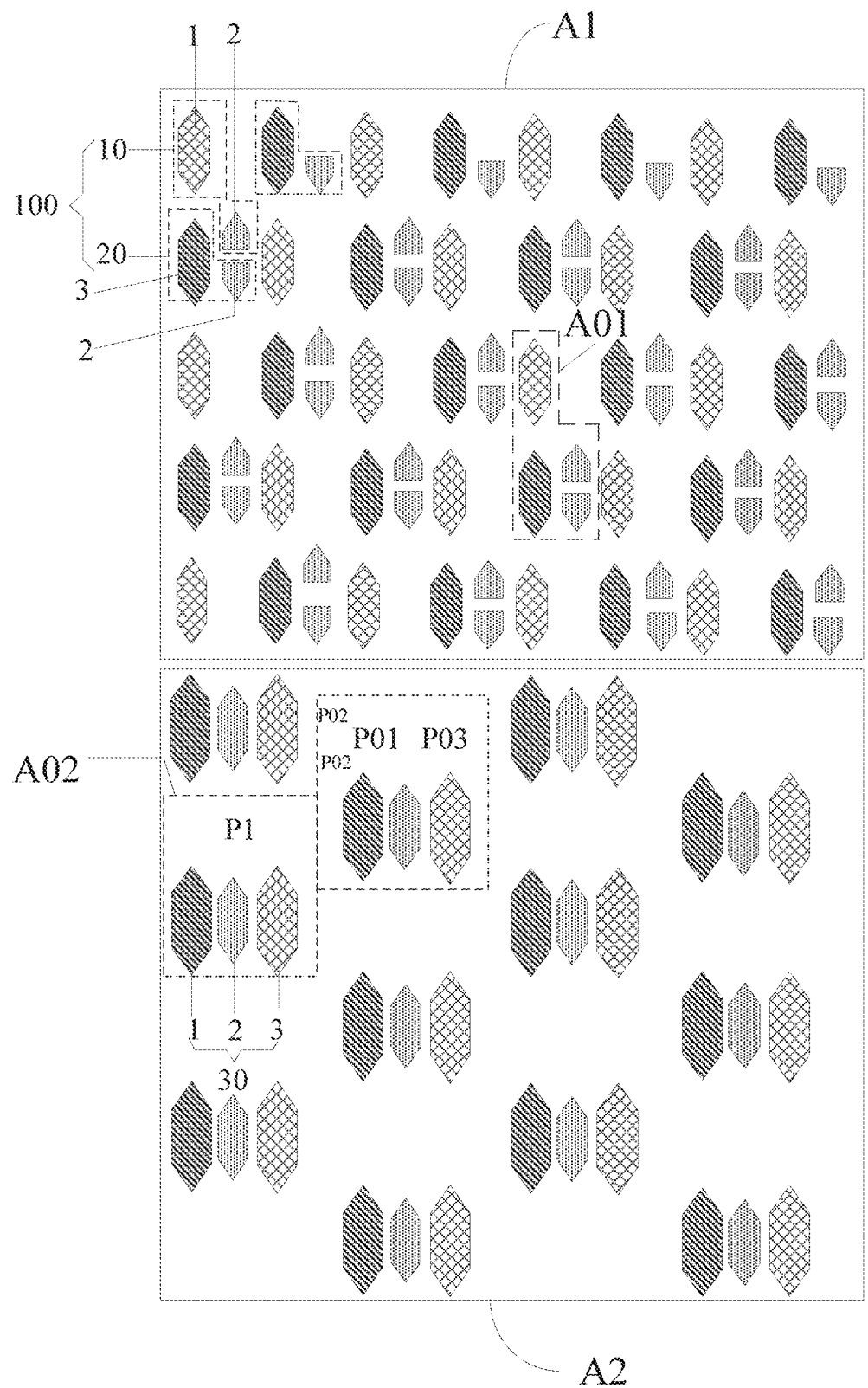
Figure 1L:
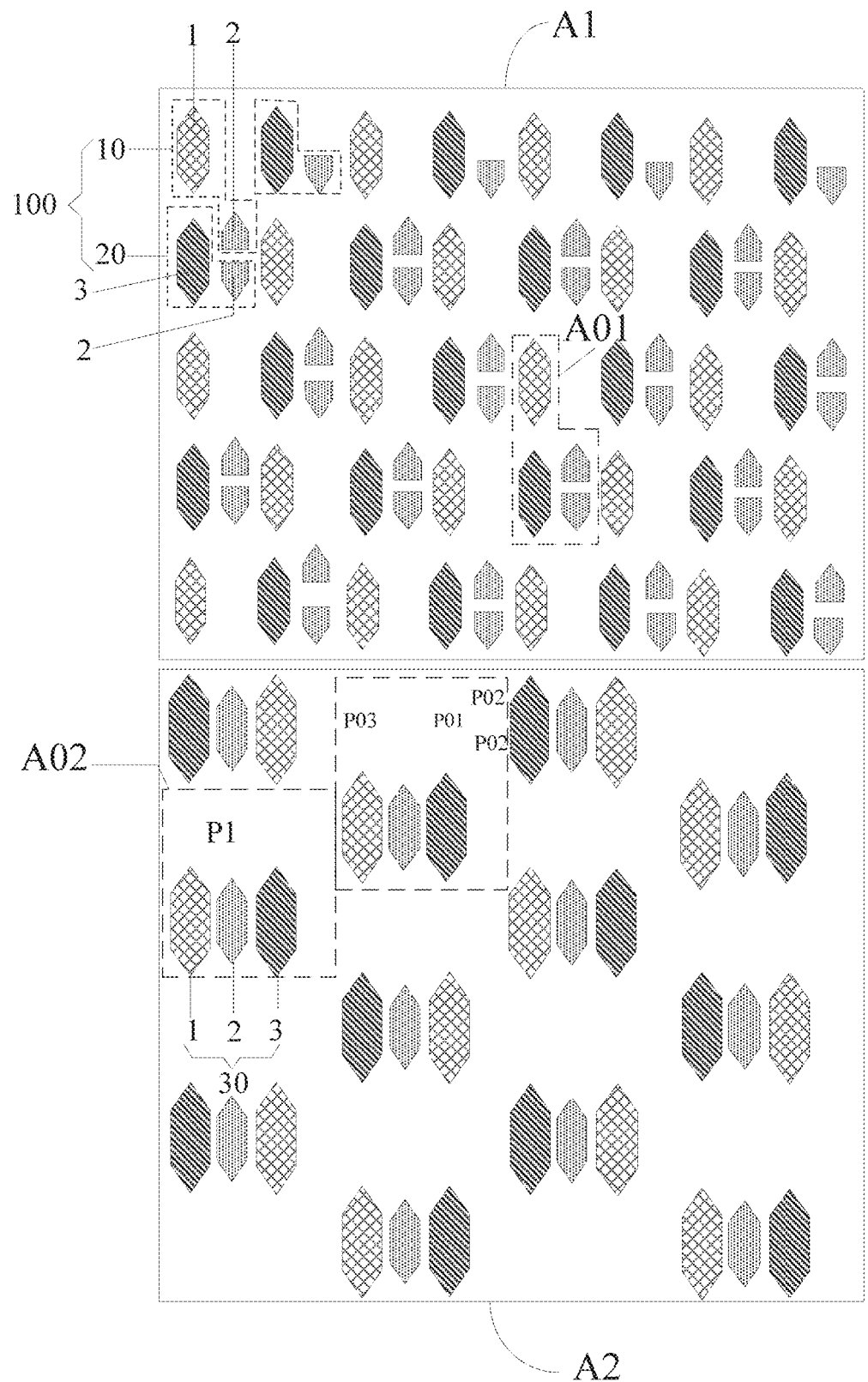
Figure 1M:
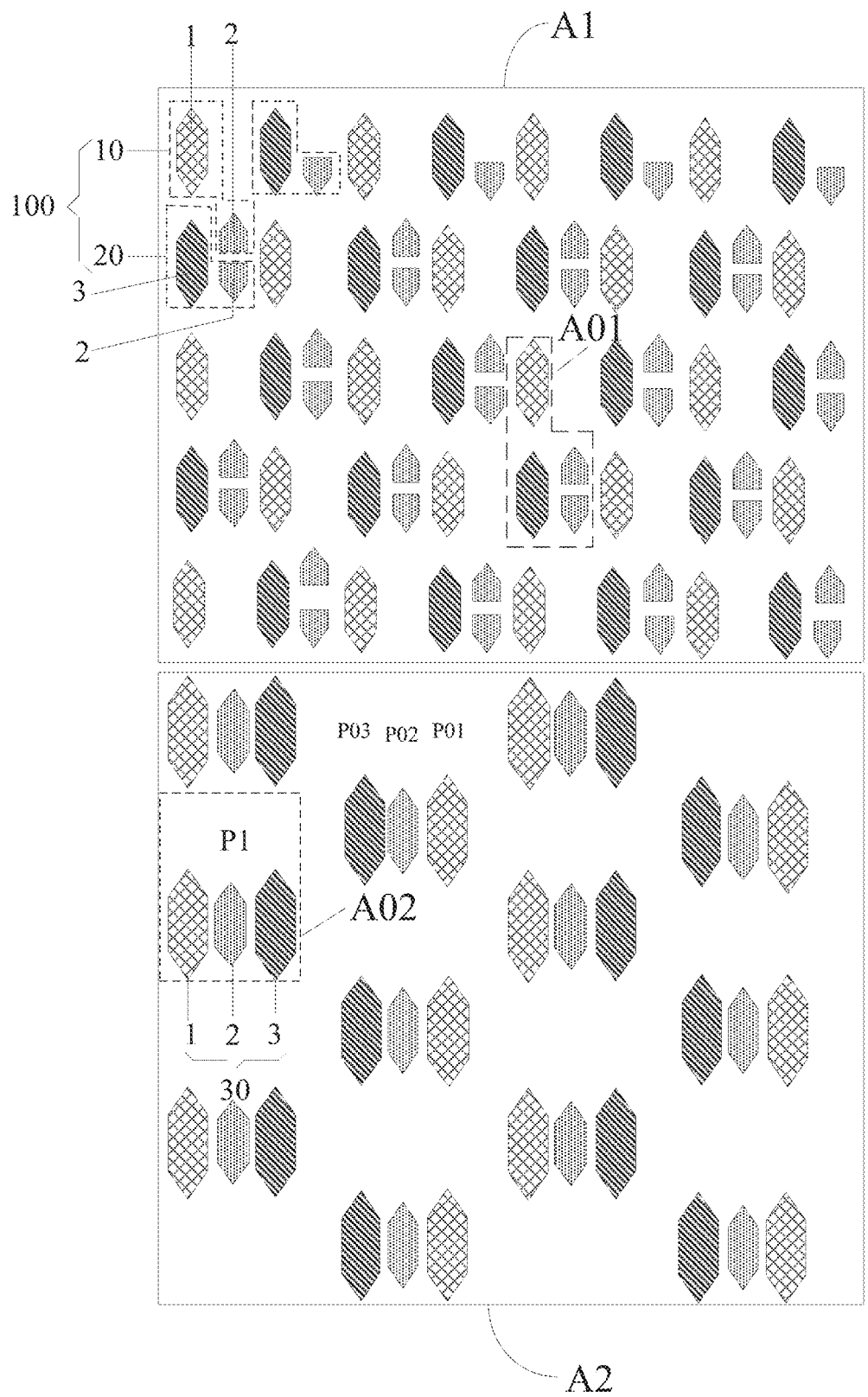
Figure 1N:
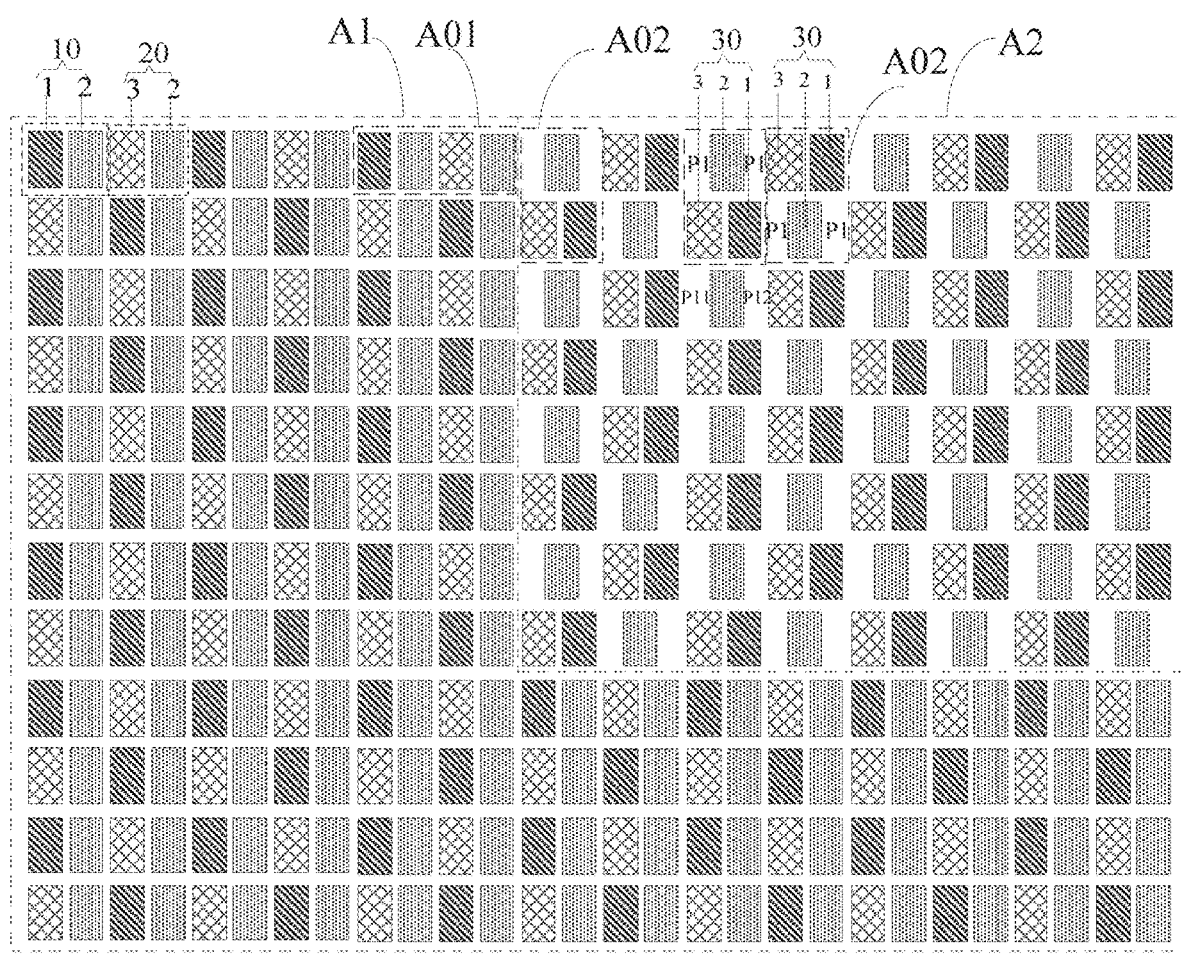
Figure 10:
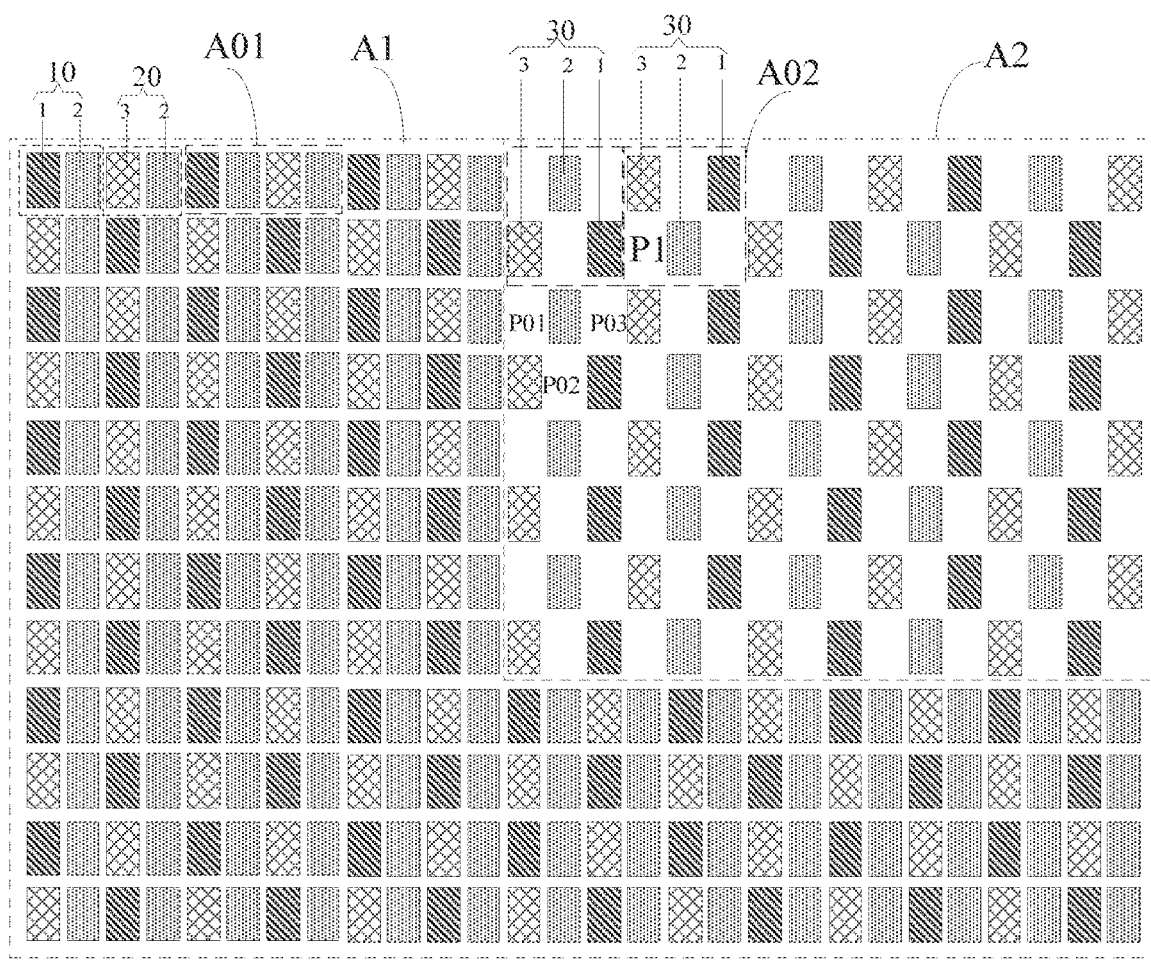
FIG. 10 is a schematic structural diagram of a high-precision metal mask according to an embodiment of the present disclosure.
Figure 1P:
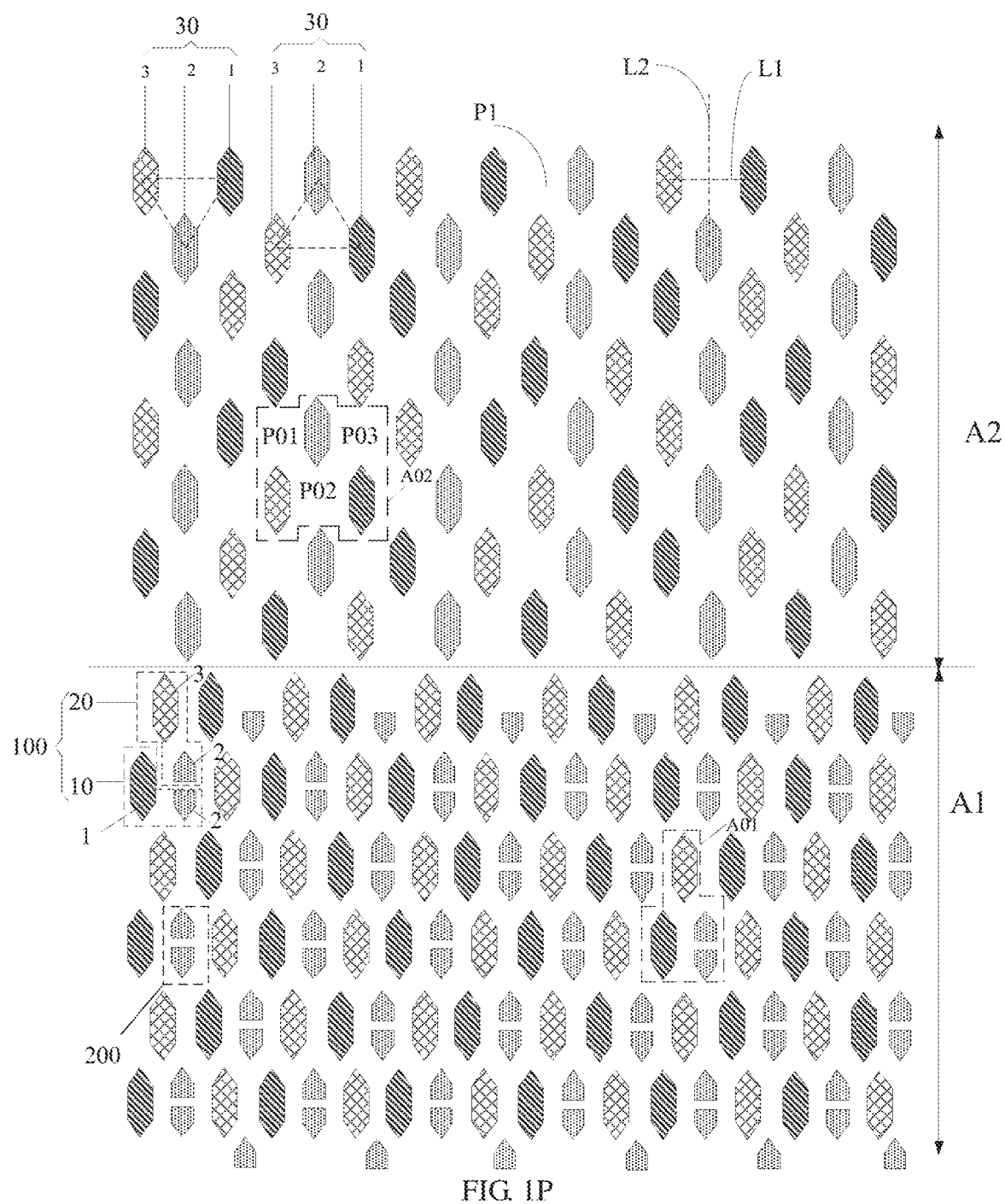
Figure 1Q:
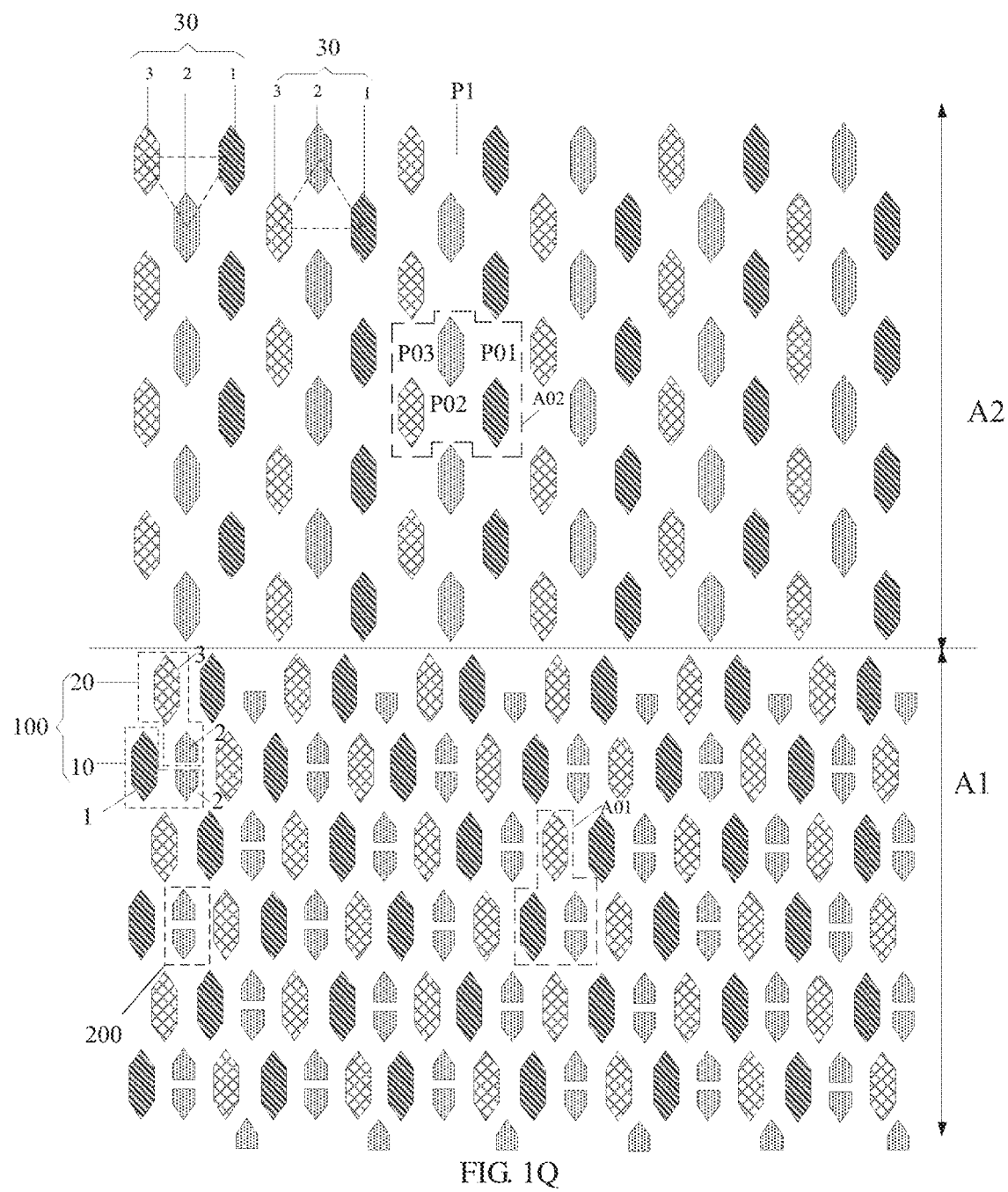
Figure 1R:
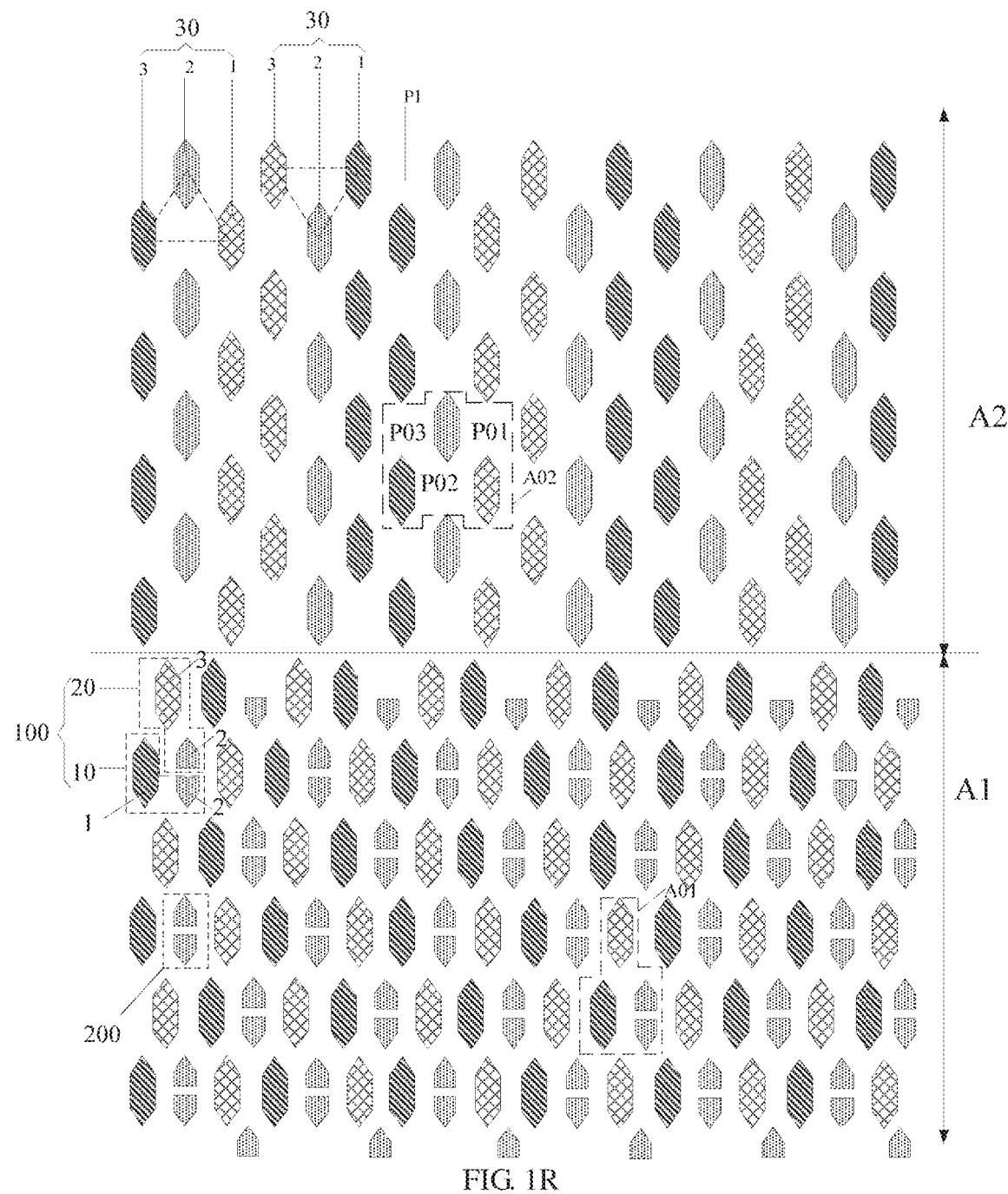
Figure 1S:
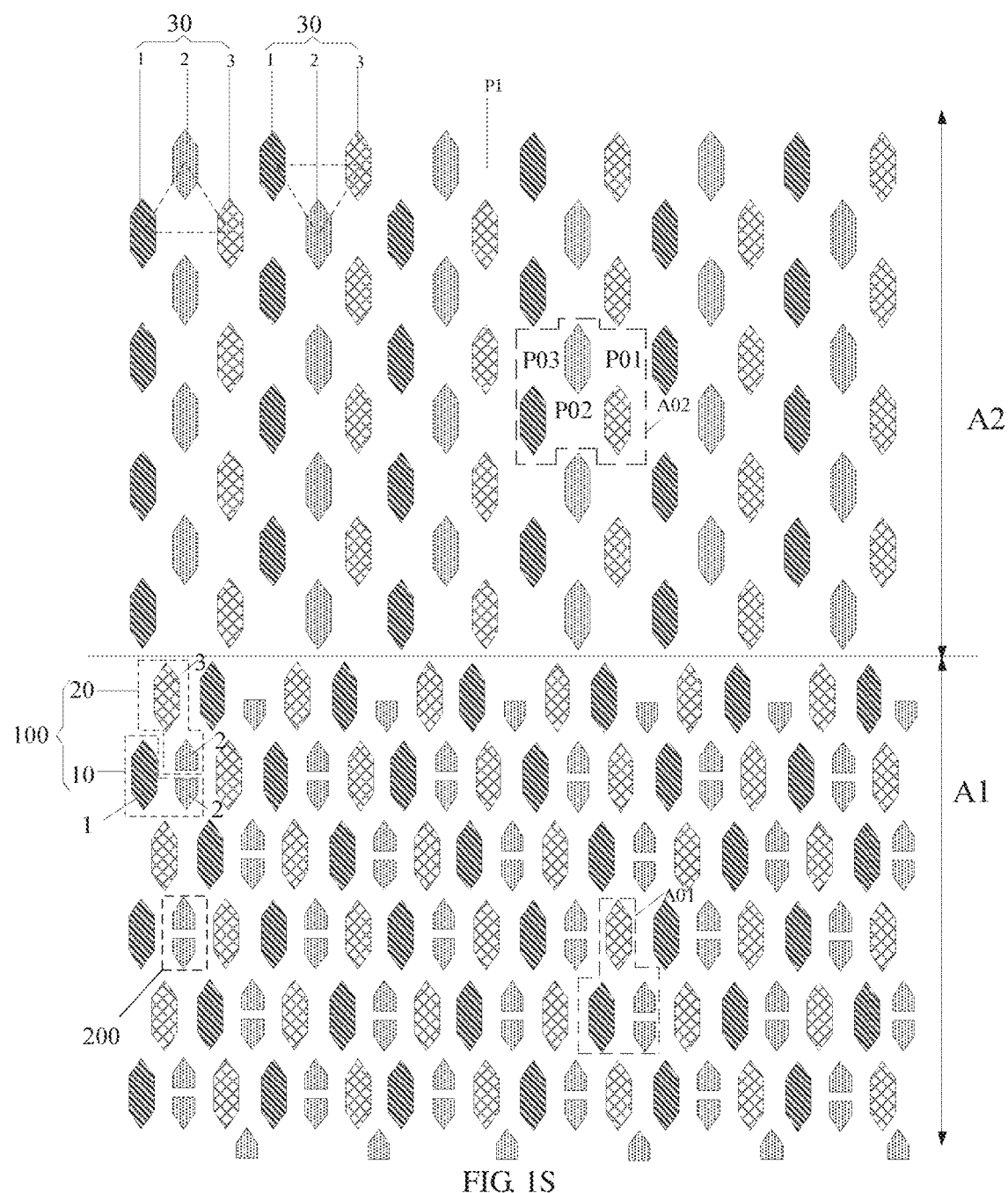

FIGS. 1B-1S are partial structural diagrams of a display substrate provided by an embodiment of the present disclosure.

Optionally, in the display substrate provided by the embodiment of the present disclosure, as shown in FIGS. 1B-1M, a plurality of first pixel units 10 and a plurality of second pixel units 20 arranged adjacently are included in the first display sub-region A1. The first pixel unit 10 includes a first sub-pixel 1 and a second sub-pixel 2, and the second pixel unit 20 includes a third sub-pixel 3 and a second sub-pixel 2. During display, the number of the pixels in the first display sub-region A1 is equal to the sum of the number of the first pixel units 10 and the number of the second pixel units 20. That is, pixels in the first display sub-region A1 are arranged in a Pentile arrangement; and during display, the pixel units can achieve a resolution higher than the physical resolution by borrowing a sub-pixel in adjacent pixel units.

The second display sub-region A2 includes a plurality of third pixel units 30, and the third pixel unit 30 includes a first sub-pixel 1, a second sub-pixel 2 and a third sub-pixel 3. During display, the number of the pixels in the second display sub-region A2 is equal to the number of the third pixel units 30. That is, the physical resolution of the pixels in the second display sub-region A2 is just the display resolution of the second display sub-region A2. In addition, the present embodiment only provides one arrangement manner of the third pixel units 30 in the second display sub-region, and the distribution density of the third pixel units 30 in the second display sub-region A2 is not limited here.

It should be noted that the pixel unit can be a combination of sub-pixels displaying one pixel point, for example, a combination of two, three, four or more sub-pixels selected from the group consisting of red sub-pixels, green sub-pixels and blue sub-pixels. Alternatively, the pixel unit can also be a basic repeating unit or a combination of pixels, for example, a combination of a red sub-pixel, a green sub-pixel and a blue sub-pixel.

For example, in the display substrate provided by the embodiment of the present disclosure, adjacent first and second elements mean that there are no any other first and second elements disposed between the first and second elements. In the case where the first element and the second element are the same elements, no other same element is arranged between the two same elements. For example, other element different from the first and second elements can be disposed between the adjacent first and second elements.

For example, the first sub-pixel, the second sub-pixel and the third sub-pixel are generally one selected from the group consisting of red sub-pixel, green sub-pixel and blue sub-pixel, respectively. Optionally, in the display substrate provided by the embodiment of the present disclosure, the second sub-pixel is a green sub-pixel, the first sub-pixel is one of red sub-pixel and blue sub-pixel, and the third sub-pixel is the other of red sub-pixel and blue sub-pixel.

For example, as shown in FIG. 1B, the first sub-pixel 1, the second sub-pixel 2 and the third sub-pixel 3 in the third pixel unit 30 are sequentially arranged. As shown in FIG. 1B, the plurality of third pixel units 30 include a first type of third pixel unit and a second type of third pixel unit. The first sub-pixel 1, the second sub-pixel 2 and the third sub-pixel 3 in the first type of third pixel unit are sequentially arranged from left to right. The first sub-pixel 1, the second sub-pixel 2 and the third sub-pixel 3 in the second type of third pixel unit are sequentially arranged from right to left. For example, as shown in FIGS. 1B, 1D, 1F, 1L and 1M, in an odd row of sub-pixels, the second display sub-region A2 includes the first type of third pixel unit; in an even row of sub-pixels, the second display sub-region A2 includes the second type of third pixel unit. For example, as shown in FIGS. 1B, 1D, 1F, 1L and 1M, in a column direction, a plurality of third pixel units of the first type and a plurality of third pixel units of the second type are alternately arranged.

Optionally, in the display substrate provided by the embodiment of the present disclosure, as shown in FIGS. 1B-1E, sub-pixels in the second display sub-region A2 and part of sub-pixels in the first display sub-region A1 can be located in a same row. This is equivalent to that the sub-pixels in the second display sub-region A2 correspond to the sub-pixels in the first display sub-region A1 in the row direction, and they are not staggered in rows or columns. In this way, during manufacturing, it is equivalent to removing part of sub-pixels in the second display sub-regions of the sub-pixel masks which are originally regularly arranged in the entire display regions, and the manufacturing process is relatively easy to be realized. Optionally, in the display substrate provided by the embodiment of the present disclosure, as shown in FIGS. 1F-1M, sub-pixels in the second display sub-region A2 and part of sub-pixels in the first display sub-region A1 are located in a same column. This is equivalent to that the sub-pixels in the second display sub-region A2 correspond to the sub-pixels in the first display sub-region A1 in the column direction, and they are not staggered in rows or columns. In this way, during manufacturing, it is equivalent to removing part of sub-pixels in the second display sub-region of the sub-pixel masks which are originally regularly arranged in the entire display regions, and the manufacturing process is relatively easy to be realized. For example, as shown in FIG. 1B, compared with the first display sub-region A1, the second display sub-region A2 is equivalent to a region with half of the second sub-pixels 2 removed, so that the resolution of the second display sub-region A2 is ½ of that of the first display sub-region A1. For example, as shown in FIG. 1C, compared with the first display sub-region A1, the second display sub-region A2 is equivalent to a region with ¾ of the second sub-pixels 2, half of the first sub-pixels 1 and half of the third sub-pixels 3 removed, so that the resolution of the second display sub-region A2 is ¼ of that of the first display sub-region A1. For example, in the embodiment of the present disclosure, the above-mentioned removed sub-pixels are replaced with transparent sub-pixels or first transparent pixels.

Optionally, in the display substrate provided by the embodiment of the present disclosure, as shown in FIGS. 1B-1H, a light emitting area of one first sub-pixel 1 in the second display sub-region A2 is substantially the same as a light emitting area of one first sub-pixel 1 in the first display sub-region A1. A light emitting area of one third sub-pixel 3 in the second display sub-region A2 is substantially the same as a light emitting area of one third sub-pixel 3 in the first display sub-region A1. As shown in FIGS. 1B-1G, a light emitting area of one second sub-pixel 2 in the second display sub-region A2 is substantially the same as a light emitting area of one second sub-pixel 2 in the first display sub-region A1.

In a specific implementation, the pixel distribution density of the second display sub-region is less than that of the first display sub-region, so the brightness of the second display sub-region will be lower than that of the first display sub-region during display, thus there will be obvious dark strips visible to human eyes at the boundary of the first display sub-region and the second display sub-region. Optionally, in order to mitigate the phenomenon of dark strips, in the display substrate provided by the embodiment of the present disclosure, as shown in FIGS. 1I-1M, the light emitting area of one first sub-pixel 1 in the second display sub-region A2 is larger than the light emitting area of one first sub-pixel 1 in the first display sub-region A1; the light emitting area of one second sub-pixel 2 in the second display sub-region A2 is larger than that of one second sub-pixel 2 in the first display sub-region A1; the light emitting area of one third sub-pixel 3 in the second display sub-region A2 is larger than the light emitting area of one third sub-pixel 3 in the first display sub-region A1. That is, the brightness difference between the second display sub-region A2 and the first display sub-region A1 is reduced by increasing the light emitting areas of the sub-pixels in the second display sub-region A2, so as to alleviate the dark strips at the boundary between the second display sub-region A2 and the first display sub-region A1.

Optionally, in the display substrate provided by the embodiment of the present disclosure, as shown in FIGS. 1B-1E and FIGS. 1G-1J, the plurality of third pixel units 30 are arranged in a matrix in the second display sub-region A2.

Optionally, in the display substrate provided by the embodiment of the present disclosure, as shown in FIGS. 1F and 1K-1M, the plurality of third pixel units 30 are arranged in a checkerboard manner in the second display sub-region A2. That is, the plurality of third pixel units 30 are arranged in alternate columns along the row direction and arranged in alternate rows along the column direction. For example, as shown in FIG. 1F, in odd rows, the third pixel units 30 are arranged at positions of odd columns; and in even rows, the third pixel units 30 are arranged at positions of even columns, so that the third pixel units 30 are uniformly distributed in both the row direction and the column direction, thereby ensuring uniform brightness in the second display sub-region A2. It may also be that, for example, in odd rows, the third pixel units 30 are arranged at positions of even columns; and in even rows, the third pixel units 30 are arranged at positions of odd columns, so that any two third pixel units are separated by a certain distance. The distance may be, for example, in the row direction, a length of at least one third pixel unit in the row direction; and in the column direction, a length of at least one third pixel unit in the column direction, which is not limited in the embodiment of the present disclosure.

Optionally, in the display substrate provided by the embodiment of the present disclosure, as shown in FIGS. 1E and 1J, in the third pixel unit 30 of the second display sub-region A2, the first sub-pixel 1 and the third sub-pixel 3 are arranged in the same row, and the second sub-pixel 2 is located in a row adjacent to the row where the first sub-pixel 1 and the third sub-pixel 3 are located, so that the second sub-pixel 2 and the first sub-pixel 1 are arranged in the staggered rows. For example, in a same third pixel unit 30, the first sub-pixel 1 and the third sub-pixel 3 are located in the first row, and the second sub-pixel 2 is located in the second row. In this way, lines of centers of the first sub-pixel, the second sub-pixel and the third sub-pixel in the same third pixel unit 30 can form a triangle. In this way, the occurrence of horizontal dark and bright strips in the second display sub-region can be avoided.

It should be noted that, in the display panel provided by the embodiment of the present disclosure, the center of a sub-pixel refers to the center of the light emitting region of the sub-pixel. Taking OLED display panel as an example, the sub-pixel generally includes a laminated structure composed of an anode layer, a light emitting layer, and a cathode layer. During display, a light emitting region corresponding to the laminated structure is the light emitting region of the sub-pixel. In this way, the area occupied by the light emitting region can be taken as the light emitting area. Of course, the light emitting area can also be, for example, the area occupied by an opening region defined by a pixel defining layer, which is not limited here.

Optionally, in the display substrate provided by the embodiment of the present disclosure, as shown in FIGS. 1E and 1J, in a same third pixel unit 30, an orthographic projection of a center of the second sub-pixel 2 on a connecting line L1 between a center of the first sub-pixel 1 and a center of the third sub-pixel 3 is located between the center of the first sub-pixel 1 and the center of the third sub-pixel 3. For example, the orthographic projection of the center of the second sub-pixel 2 on the connecting line L1 between the center of the first sub-pixel 1 and the center of the third sub-pixel 3 is located at an intersection of the connecting line L1 and a straight line L2. Thus, in the third pixel unit 30, a distance between the center of the second sub-pixel 2 and the center of the first sub-pixel 1 can be made equal to a distance between the center of the second sub-pixel 2 and the center of the third sub-pixel 3, so that the three sub-pixels are arranged in an isosceles triangle, and the occurrence of vertical dark and bright strips in the second display sub-region A2 can be avoided.

In a specific implementation, the distance between the center of the second sub-pixel 2 and the center of the first sub-pixel 1, and the distance between the center of the second sub-pixel 2 and the center of the third sub-pixel 3, may not be exactly the same. In an actual process, due to limitations of process conditions or other factors such as the arrangement of wirings or vias, there may be some deviations, so any shape, position and relative positional relationship that substantially satisfy the above conditions are feasible, which are within the scope of protection of the present disclosure.

Optionally, in the display substrate provided by the embodiment of the present disclosure, as shown in FIGS. 1B-1D, 1F-1I and 1K-1M, in the second display sub-region A2, the first sub-pixel 1, the second sub-pixel 2 and the third sub-pixel 3 in the third pixel unit 30 are arranged in a same row. Alternatively, they can also be arranged in a same column, which is not limited here.

Of course, in a specific implementation, in the display substrate provided by the embodiment of the present disclosure, as shown in FIGS. 1B-1D, 1F-1I, and 1K-1M, in the second display sub-region A2, the first sub-pixel 1, the second sub-pixel 2 and the third sub-pixel 3 in the third pixel unit 30 are sequentially arranged in a same row. Alternatively, they can also be sequentially arranged in a same column, which is not limited here. Further, of course, in a specific implementation, in the display substrate provided by the embodiment of the present disclosure, as shown in FIGS. 1B-1D, 1F-1I, and 1K-1M, in the second display sub-region A2, the first sub-pixel 1, the second sub-pixel 2 and the third sub-pixel 3 in the third pixel unit 30 are sequentially and adjacently arranged in a same row, or they can also be sequentially and adjacently arranged in a same column, which is not limited here.

Optionally, in the display substrate provided by the embodiment of the present disclosure, as shown in FIGS. 1B, 1D-1F and 1L, in the second display sub-region A2, sub-pixels in two third pixel units 30 adjacent in the row direction are arranged in the same order in the row direction, and sub-pixels in two third pixel units 30 adjacent in the column direction are arranged in reversed orders in the row direction. Thus, it is ensured that, in the second display sub-region A2, the first sub-pixel 1 and the third sub-pixel 3 are alternately arranged in the column direction, and the occurrence of color shift in the column direction is avoided. For example, as shown in FIG. 1B, taking the first row of third pixel units 30 as an example, in the row direction, the first sub-pixel 1, the second sub-pixel 2 and the third sub-pixel 3 in any two adjacent third pixel units 30 are sequentially arranged from left to right. Taking the first column of third pixel units 30 as an example, in the column direction, the first sub-pixel 1, the second sub-pixel 2 and the third sub-pixel 3 in the third pixel unit 30 in any odd row are sequentially arranged from left to right; and the third sub-pixel 3, the second sub-pixel 2 and the first sub-pixel 1 in the third pixel unit 30 in any even row are sequentially arranged from left to right. For example, as shown in FIG. 1E, taking the first row of third pixel units 30 as an example, in the row direction, the first sub-pixel 1, the third sub-pixel 3 and the second sub-pixel 2 in any two adjacent third pixel units 30 are arranged in an inverted triangle. Taking the first column of third pixel units 30 as an example, in the column direction, the first sub-pixel 1, the third sub-pixel 3 and the second sub-pixel 2 in the third pixel unit 30 in any odd row are arranged in an inverted triangle; and the third sub-pixel 3, the first sub-pixel 1 and the second sub-pixel 2 in the third pixel unit 30 in any even row are arranged in an inverted triangle.

In a specific implementation, in the display substrate provided by the embodiment of the present disclosure, as shown in FIGS. 1C and 1G-1K, in the second display sub-region A2, the arrangement order of sub-pixels in each third pixel unit can be the same.

For example, in the display substrate provided by an embodiment of the present disclosure, as shown in FIGS. 1B, 1D, 1F and 1L, in a same column, a plurality of third pixel units 30 of the first type and a plurality of third pixel units 30 of the second type are alternately arranged; the first sub-pixel 1, the second sub-pixel 2 and the third sub-pixel 3 in the third pixel unit 30 of the first type are sequentially arranged from left to right; and the third sub-pixel 3, the second sub-pixel 2 and the first sub-pixel 1 in the third pixel unit 30 of the second type are sequentially arranged from left to right.

For example, the arrangement of sub-pixels of the third pixel units shown in FIG. 1I can be adjusted to obtain display substrates of other structures. For example, in a specific implementation, in the display substrate provided by the embodiment of the present disclosure, as shown in FIG. 1M, in the second display sub-region A2, the arrangement order of sub-pixels in each third pixel unit 30 in a same column is the same, and the arrangement orders of sub-pixels in the third pixel units 30 in two adjacent columns are opposite to each other. For example, the first sub-pixel 1, the second sub-pixel 2, and the third sub-pixel 3 in each third pixel unit 30 in an odd column are sequentially arranged from left to right; and the third sub-pixel 3, the second sub-pixel 2, and the first sub-pixel 1 in each third pixel unit 30 in an even column are sequentially arranged from left to right.

In a specific implementation, in the display substrate provided by the embodiment of the present disclosure, as shown in FIGS. 1B-1F and 1H-1M, in the second display sub-region A2, the shapes of the first sub-pixel 1, the second sub-pixel 2 and the third sub-pixel 3 are substantially the same.

In a specific implementation, in the display substrate provided by the embodiment of the present disclosure, in the second display sub-region, a light emitting area of one second sub-pixel is less than or substantially the same as a light emitting area of one first sub-pixel, and the light emitting area of one second sub-pixel is less than or substantially the same as a light emitting area of one third sub-pixel. For example, as shown in FIGS. 1B-1F, in the second display sub-region A2, the light emitting area of one second sub-pixel 2 is substantially the same as the light emitting area of one first sub-pixel 1, and the light emitting area of one second sub-pixel 2 is substantially the same as the light emitting area of one third sub-pixel 3. As shown in FIGS. 1G-1M, in the second display sub-region A2, the light emitting area of one second sub-pixel 2 is smaller than the light emitting area of one first sub-pixel 1, and the light emitting area of one second sub-pixel 2 is smaller than the light emitting area of one third sub-pixel 3. Of course, the relationships between the light emitting area of one second sub-pixel, the light emitting area of one first sub-pixel and the light emitting area of one third sub-pixel in the second display sub-region can be designed and determined according to the actual application environment and are not limited here.

In a specific implementation, in the display substrate provided by the embodiment of the present disclosure, as shown in FIGS. 1B-1M, in the second display sub-region A2, the light emitting area of one first sub-pixel 1 is substantially the same as the light emitting area of one third sub-pixel 3.

Optionally, in the display substrate provided by the embodiment of the present disclosure, as shown in FIGS. 1B-1M, the first pixel unit 10 and the second pixel unit 20 in the first display sub-region A1 can be arranged in any kind of Pentile arrangements, which is not limited here.

Optionally, in the display substrate provided by the embodiment of the present disclosure, as shown in FIGS. 1B-1M, in the first display sub-region A1, the first pixel unit 10 and the second pixel unit 20 are alternately arranged in the column direction, and the first pixel unit 10 and the second pixel unit 20 are alternately arranged in the row direction.

Optionally, in the display substrate provided by the embodiment of the present disclosure, as shown in FIGS. 1B-1F, in the first display sub-region A1, the second sub-pixel 2 and the first sub-pixel 1 in the first pixel unit 10 are arranged in a same row; the second sub-pixel 2 and the third sub-pixel 3 in the second pixel unit 20 are arranged in a same row. And, for the first pixel unit 10 and the second pixel unit 20 adjacent in the row direction, the second sub-pixel 2 in the first pixel unit 10 is not directly adjacent to the second sub-pixel 2 in the second pixel unit 20. For example, for the first pixel unit 10 and the second pixel unit 20 adjacent in the row direction, the second sub-pixel 2 in the first pixel unit 10 and the second sub-pixel in the second pixel unit 20 are separated by the third sub-pixel 3. Of course, the above-mentioned embodiments may have other implementations, and details will not be described here.

Further, in the display substrate provided by the embodiment of the present disclosure, as shown in FIGS. 1B-1F, in the first display sub-region A2, the light emitting area of one first sub-pixel 1, the light emitting area of one second sub-pixel 2, and the light emitting area of one third sub-pixel 3 can be substantially the same.

Optionally, in the display substrate provided by the embodiment of the present disclosure, as shown in FIGS. 1G-1M, in the first display sub-region A1, the second sub-pixel 2 and the first sub-pixel 1 in the first pixel unit 10 are staggered in rows and columns; the second sub-pixel 2 and the third sub-pixel 3 in the second pixel unit 20 are arranged in a same row. Moreover, taking the first pixel unit 10 and the second pixel unit 20 adjacent in the column direction as a pixel group 100, in the same pixel group 100, the second sub-pixel 2 in the first pixel unit 10 and the third sub-pixel 3 in the second pixel unit 20 are arranged in a same row, and the second sub-pixel 2 in the first pixel unit 10 and the second sub-pixel 2 in the second pixel unit 20 are located in a same column.

Further, in the display substrate provided by the embodiment of the present disclosure, as shown in FIGS. 1G-1L, in the same pixel group 100, two second sub-pixels 2 are arranged adjacent to each other in the column direction, and the two second sub-pixels 2 are symmetrical with respect to the row direction, that is, the two second sub-pixels 2 in the same pixel group 100 are arranged in a mirror configuration. Further, in the first display sub-region A1, in the case where the second sub-pixel 2 is a green sub-pixel, the light emitting areas of the two second sub-pixels 2 are both smaller than the light emitting area of one first sub-pixel 1, and the light emitting areas of the two second sub-pixels 2 are both smaller than the light emitting area of one third sub-pixel 3, because the light emitting efficiency of the green sub-pixel is higher than that of other color sub-pixels.

Optionally, in the display substrate provided by the embodiment of the present disclosure, as shown in FIGS. 1B-1M, in the first display sub-region, the arrangement order of sub-pixels in each first pixel unit 10 is the same, and the arrangement order of sub-pixels in each second pixel unit 20 is the same. For example, as shown in FIGS. 1B-1F, the first sub-pixel 1 and the second sub-pixel 2 in each first pixel unit 10 are sequentially arranged from left to right; and the third sub-pixel 3 and the second sub-pixel 2 in each second pixel unit 20 are sequentially arranged from left to right. As shown in FIGS. 1G-1M, the third sub-pixel 3 and the second sub-pixel 2 in each second pixel unit 20 are sequentially arranged from left to right; and the first sub-pixel 1 and the second sub-pixel 2 in each first pixel unit 10 are sequentially arranged from top left to bottom right.

Optionally, in the display substrate provided by the embodiment of the present disclosure, in the first display sub-region, the light emitting area of one second sub-pixel is not greater than the light emitting area of one first sub-pixel; and the light emitting area of one second sub-pixel is not greater than the light emitting area of one third sub-pixel. For example, as shown in FIGS. 1B-1F, in the first display sub-region A1, the light emitting area of one second sub-pixel 2 is substantially the same as the light emitting area of one first sub-pixel 1; and the light emitting area of one second sub-pixel 2 is substantially the same as the light emitting area of one third sub-pixel 3. As shown in FIGS. 1G-1M, in the first display sub-region A1, the light emitting area of one second sub-pixel 2 is smaller than the light emitting area of one first sub-pixel 1; and the light emitting area of one second sub-pixel 2 is smaller than the light emitting area of one third sub-pixel 3. This is because in the first display sub-region A1, the number of the first sub-pixels 1 is the same as the number of the third sub-pixels 3, and the number of the second sub-pixels 2 is twice that of the first sub-pixels 1, so that the light emitting area of the second sub-pixel 2 can be made small.

Optionally, in the display substrate provided by the embodiment of the present disclosure, as shown in FIGS. 1B-1M, in the first display sub-region A1, the light emitting area of one first sub-pixel 1 is substantially the same as the light emitting area of one third sub-pixel 3.

For example, in the display substrate provided by the embodiment of the present disclosure, in the first display sub-region, the shapes of the first sub-pixel, the second sub-pixel and the third sub-pixel are not limited, and may be regular shapes or irregular shapes. In a specific implementation, in general, a regular shape is relatively easy to be realized from the technological point of view.

For example, in the display substrate provided by the embodiment of the present disclosure, in the second display sub-region, the shapes of the first sub-pixel, the second sub-pixel and the third sub-pixel are not limited, and may be regular shapes or irregular shapes. In a specific implementation, in general, a regular shape is relatively easy to be realized from the technological point of view.

Optionally, in the display substrate provided by the embodiment of the present disclosure, as shown in FIGS. 1G-1L, in the same pixel group 100, the shapes of the first sub-pixel 1 and the third sub-pixel 3 are consistent with each other, and the shape of a combination of the two second sub-pixels 2 is consistent with the shape of the first sub-pixel 1 or the shape of the third sub-pixel 3.

Optionally, in the display substrate provided by the embodiment of the present disclosure, the shape of the first sub-pixel is at least one of a rectangle and a hexagon. For example, as shown in FIGS. 1B-1F, in both the first display sub-region A1 and the second display sub-region A2, the shape of the first sub-pixel 1 is a rectangle. As shown in FIGS. 1G-1L, in both the first display sub-region A1 and the second display sub-region A2, the shape of the first sub-pixel 1 is a hexagon. Of course, the shape of the first sub-pixel can also be a rounded pattern, or an elliptical shape, etc., which is not limited here.

Optionally, in the display substrate provided by the embodiment of the present disclosure, as shown in FIGS. 1G-1L, in the first display sub-region A1, the shapes of the first sub-pixel 1 and the third sub-pixel 3 are both hexagons, and the shape of a combination of the two second sub-pixels 2 is one hexagon.

Optionally, in the display substrate provided by the embodiment of the present disclosure, the shape of at least one sub-pixel selected from the group consisting of the first sub-pixel and the third sub-pixel in the second display sub-region is substantially the same as the shape of the first sub-pixel in the first display sub-region. For example, as shown in FIGS. 1B-1M, the shape of the first sub-pixel 1 in the second display sub-region A2 is substantially the same as the shape of the first sub-pixel 1 in the first display sub-region A1. As shown in FIGS. 1B-1M, the shape of the third sub-pixel 3 in the second display sub-region A2 is substantially the same as the shape of the first sub-pixel 1 in the first display sub-region A1. As shown in FIGS. 1B-1M, the shape of the first sub-pixel 1 and the shape of the third sub-pixel 3 in the second display sub-region A2 are substantially the same as the shape of the first sub-pixel 1 in the first display sub-region A1, respectively.

Optionally, in the display substrate provided by the embodiment of the present disclosure, the shape of one sub-pixel selected from the group consisting of the first sub-pixel and the second sub-pixel in the first display sub-region is substantially the same as the shape of the second sub-pixel in the second display sub-region. For example, as shown in FIGS. 1B-1F and FIGS. 1H-1M, the shape of the first sub-pixel 1 in the first display sub-region A1 is substantially the same as the shape of the second sub-pixel 2 in the second display sub-region A2. As shown in FIG. 1G, the shape of the second sub-pixel 2 in the first display sub-region A1 is substantially the same as the shape of the second sub-pixel 2 in the second display sub-region A2.

It should be noted that, taking that the shapes of each first sub-pixel 1, each second sub-pixel 2 and each third sub-pixel 3 in a same sub-region are approximately the same as an example, the shapes of the three sub-pixels are approximately the same, and of course, the light emitting areas of the three sub-pixels can be different. For example, as shown in FIG. 1J, in the second display sub-region A2, the light emitting area of the second sub-pixel 2 is smaller than the light emitting area of the first sub-pixel 1; and the light emitting area of the second sub-pixel 2 is smaller than the light emitting area of the third sub-pixel 3. Moreover, in practical applications, for example, the setting may be made according to an implementation in which the light emitting area of the blue sub-pixel is larger than the light emitting area of the red sub-pixel and the light emitting area of the red sub-pixel is larger than the light emitting area of the green sub-pixel, or, the light emitting area of the blue sub-pixel is larger than the light emitting area of the green sub-pixel and the light emitting area of the green sub-pixel is larger than the light emitting area of the red sub-pixel, which is not limited here.

It should be noted that, in the display substrate provided by the embodiment of the present disclosure, the shape of a sub-pixel refers to the shape of a light emitting region of the sub-pixel, and the sub-pixel includes at least one selected from the group consisting of a first sub-pixel, a second sub-pixel and a third sub-pixel.

Optionally, in the display substrate provided by the embodiment of the present disclosure, as shown in FIGS. 1G-1L, in the first display sub-region A1, in the case where the second sub-pixel 2 is a green sub-pixel, the light emitting areas of the two second sub-pixels 2 are both smaller than the light emitting area of one first sub-pixel 1, and the light emitting areas of the two second sub-pixels 2 are both smaller than the light emitting area of one third sub-pixel 3, because the light emitting efficiency of the green sub-pixel is higher than that of other color sub-pixels.

Optionally, in the display substrate provided by the embodiment of the present disclosure, as shown in FIGS. 1G-1L, in the second display sub-region A2, in the case where the second sub-pixel 2 is a green sub-pixel, the light emitting area of the second sub-pixel 2 is smaller than the light emitting area of the first sub-pixel 1, and the light emitting area of the second sub-pixel 2 is smaller than the light emitting area of the third sub-pixel 3.

Optionally, in the display substrate provided by the embodiment of the present disclosure, as shown in FIGS. 1N-1S, sub-pixels of a same color in the row direction are arranged at equal intervals, and sub-pixels of a same color in the column direction are arranged at equal intervals.

Optionally, in the display substrate provided by the embodiment of the present disclosure, as shown in FIGS. 1N-1Q and 1S, sub-pixels of a same color in adjacent rows are arranged in a staggered manner, and the distances from the centers of two adjacent sub-pixels of a same color in a same row to the centers of adjacent sub-pixels of the same color in an adjacent row are the same. Taking FIG. 1P as an example, in the second display sub-region A2, the first one of the first sub-pixels 1 in the second row is located on the line of centers of the first one of the first sub-pixels 1 in the first row and the second one of the first sub-pixels 1 in the first row.

Optionally, in the display substrate provided by the embodiment of the present disclosure, as shown in FIGS. 1N-1Q and 1S, sub-pixels of a same color in adjacent columns are arranged in a staggered manner, and the distances from the centers of two adjacent sub-pixels of a same color in a same column to the centers of adjacent sub-pixels of the same color in an adjacent column are the same. Taking FIG. 1P as an example, in the second display sub-region A2, the first one of the first sub-pixels 1 in the first column is located on the line of centers of the first one of the first sub-pixels 1 in the second column and the second one of the first sub-pixels 1 in the second column.

It should be noted that, due to the limitations of process conditions or other factors such as the arrangement of wirings or vias, there may also be some deviations, so any shape, position and relative positional relationship of each sub-pixel that substantially satisfy the above conditions are feasible, which are within the scope of protection of the present disclosure.

Optionally, in the display substrate provided by the embodiment of the present disclosure, as shown in FIGS. 1N-1S, first sub-pixels 1, second sub-pixels 2 and third sub-pixels 3 are disposed in the second display sub-region A2. The first sub-pixels 1 are uniformly distributed in the second display sub-region A2, the second sub-pixels 2 are uniformly distributed in the second display sub-region A2, and the third sub-pixels 3 are uniformly distributed in the second display sub-region A2.

Optionally, in the display substrate provided by the embodiment of the present disclosure, as shown in FIGS. 1O-1S, the first sub-pixels 1, the second sub-pixels 2, and the third sub-pixels 3 are uniformly distributed in the row direction.

Optionally, in the display substrate provided by the embodiment of the present disclosure, as shown in FIGS. 1N-1S, a plurality of third pixel units 30 arranged in a matrix are included in the second display sub-region A2, and each third pixel unit 30 includes: a first sub-pixel 1, a second sub-pixel 2, and a third sub-pixel 3. In a same third pixel unit 30, the first sub-pixel 1 and the third sub-pixel 3 are arranged in a same row and adjacent to each other; and the second sub-pixel 2 is located in a row adjacent to the row where the first sub-pixel 1 and the third sub-pixel 3 are located. In this way, the three sub-pixels in the third pixel unit 30 in the second display sub-region A2 can be arranged in a triangle. Taking the first row of third pixel units 30 as an example, the first sub-pixel 1 and the third sub-pixel 3 in the third pixel unit 30 are located in the first row of sub-pixel rows; and the second sub-pixel 2 in the third pixel unit 30 is located in the second row of sub-pixel rows.

Optionally, in the display substrate provided by the embodiment of the present disclosure, for sub-pixels of a same color selected from the group consisting of the first sub-pixels, the second sub-pixels and the third sub-pixels in the second display sub-region, the centers of the sub-pixels are uniformly distributed. For example, as shown in FIGS. 1N-1S, the centers of the first sub-pixels 1 in the second display sub-region A2 are uniformly distributed; the centers of the second sub-pixels 2 in the second display sub-region A2 are uniformly distributed; and the centers of the third sub-pixels 3 in the second display sub-region A2 are uniformly distributed.

Optionally, in the display substrate provided by the embodiment of the present disclosure, for sub-pixels of a same color selected from the group consisting of the first sub-pixels, the second sub-pixels and the third sub-pixels in the second display sub-region, the sub-pixels are arranged equidistantly in the row direction and equidistantly in the column direction. For example, as shown in FIGS. 1N-1S, the first sub-pixels 1 in the second display sub-region A2 are arranged equidistantly in the row direction and equidistantly in the column direction; the second sub-pixels 2 in the second display sub-region A2 are arranged equidistantly in the row direction and equidistantly in the column direction; and the third sub-pixels 3 in the second display sub-region A2 are arranged equidistantly in the row direction and equidistantly in the column direction.

Optionally, in the display substrate provided by the embodiment of the present disclosure, for sub-pixels of a same color selected from the group consisting of the first sub-pixels, the second sub-pixels and the third sub-pixels in the second display sub-region, the sub-pixels are staggered in adjacent rows, and the centers of two adjacent sub-pixels in a same row have an equal distance from the center of a same nearest neighbor sub-pixel in an adjacent row, respectively. For example, as shown in FIGS. 1N-1S, the first sub-pixels 1 in the second display sub-region A2 are staggered in adjacent rows, and the centers of two adjacent first sub-pixels 1 in a same row have an equal distance from the center of a same nearest neighbor first sub-pixel 1 in an adjacent row, respectively. The rest sub-pixels are arranged in the same way, and details will not be repeated here.

Optionally, in the display substrate provided by the embodiment of the present disclosure, for sub-pixels of a same color selected from the group consisting of the first sub-pixels, the second sub-pixels and the third sub-pixels in the second display sub-region, the sub-pixels are staggered in adjacent columns, and the centers of two adjacent sub-pixels in a same column have an equal distance from the center of a same nearest neighbor sub-pixel in an adjacent column, respectively. For example, as shown in FIGS. 1N-1S, the first sub-pixels 1 in the second display sub-region A2 are staggered in adjacent columns, and the centers of two adjacent first sub-pixels 1 in a same column have an equal distance from the center of a same nearest neighbor first sub-pixel 1 in an adjacent column, respectively. The rest sub-pixels are arranged in the same way, and details will not be repeated here.

Optionally, in the display substrate provided in the embodiment of the present disclosure, as shown in FIGS. 1N, 1O, and 1Q-1S, in the second display sub-region A2, the arrangement manners of the sub-pixels of the third pixel units 30 in a same column are the same. Thus, the third pixel units 30 in each column have a same arrangement manner in the column direction, thereby ensuring the uniformity of display.

Optionally, in the display substrate provided by the embodiment of the present disclosure, as shown in FIG. 1P, in the second display sub-region A2, the arrangement manners of sub-pixels of two adjacent third pixel units 30 in a same column can be reversed. Taking the third pixel unit 30 in the first row and the third pixel unit 30 in the second row in a same column as an example, the third pixel unit 30 in the first row forms a triangle in an order of the third sub-pixel 3, the first sub-pixel 1 and the second sub-pixel 2; the third pixel unit 30 in the second row forms a triangle in an order of the first sub-pixel 1, the third sub-pixel 3 and the second sub-pixel 2.

Optionally, in the display substrate provided by the embodiment of the present disclosure, as shown in FIGS. 1N-1S, in the second display sub-region A2 and in the third pixel unit 30, a distance between the center of the second sub-pixel 2 and the center of the first sub-pixel 1 is equal to a distance between the center of the second sub-pixel 2 and the center of the third sub-pixel 3. That is, in the third pixel unit 30, the center of the second sub-pixel 2, the center of the first sub-pixel 1 and the center of the third sub-pixel 3 form an isosceles triangle, thereby ensuring that a pixel emission center of the third pixel unit 30 is at the center of the isosceles triangle.

Optionally, in the display substrate provided by the embodiment of the present disclosure, as shown in FIGS. 1N-1S, for two third pixel units 30 adjacent in the row direction in the second display sub-region A2, the first sub-pixel 1 and the third sub-pixel 3 in one third pixel unit 30 and the second sub-pixel 2 in the other third pixel unit 30 are located in a same row. Thus, during display, the number of the pixels in the second display sub-region A2 is equal to the number of the third pixel units 30. That is, the physical resolution of the pixels in the second display sub-region A2 is just the display resolution of the second display sub-region A2. Moreover, in the second display sub-region A2, the three sub-pixels in the third pixel unit 30 are arranged in a triangle; and two adjacent third pixel units 30 in the row direction are arranged in one inverted triangle and one forward triangle, respectively, thus avoiding the occurrence of display unevenness in the second display sub-region A2 due to a large number of sub-pixels on some rows while a small number of sub-pixels on some other rows.

Optionally, in the display substrate provided by the embodiment of the present disclosure, as shown in FIGS. 1O-1S, each kind of sub-pixels in the second display sub-region A2 are uniformly arranged, for example, arranged in a checkerboard manner.

Optionally, in the display substrate provided by the embodiment of the present disclosure, as shown in FIG. 1P, in a same third pixel unit 30 of the second display sub-region A2, an orthographic projection of the center of the second sub-pixel 2 on a connecting line between the center of the first sub-pixel 1 and the center of the third sub-pixel 3 is located between the center of the first sub-pixel 1 and the center of the third sub-pixel 3. For example, the orthographic projection of the center of the second sub-pixel 2 on the connecting line L1 between the center of the first sub-pixel 1 and the center of the third sub-pixel 3 is located at an intersection of the connecting line L1 and a straight line L2. Thus, in the third pixel unit 30, a distance between the center of the second sub-pixel 2 and the center of the first sub-pixel 1 can be made equal to a distance between the center of the second sub-pixel 2 and the center of the third sub-pixel 3, so that the three sub-pixels are arranged in an isosceles triangle, and the occurrence of vertical dark and bright strips in the second display sub-region can be avoided.

For example, the distance between the center of the second sub-pixel and the center of the first sub-pixel, and the distance between the center of the second sub-pixel and the center of the third sub-pixel may not be exactly the same. In an actual process, due to limitations of process conditions or other factors such as the arrangement of wirings or vias, there may be some deviations, so any shape, position and relative positional relationship of each sub-pixel that substantially satisfy the above conditions are feasible, which are within the scope of protection of the present disclosure.

Optionally, in the display substrate provided by the embodiment of the present disclosure, as shown in FIGS. 1N-1Q and 1S, in adjacent third pixel units 30 in the row direction, sub-pixels of the same color are not adjacent. That is, in two adjacent third pixel units 30 in the row direction, the first sub-pixel 1 in one third pixel unit 30 and the first sub-pixel 1 in the other third pixel unit 30 are not adjacent. In this way, the color shift phenomenon in the second display sub-region A2 due to the same color of the adjacent two columns of sub-pixels is avoided. Of course, as shown in FIG. 1R, in the adjacent third pixel units 30 in the row direction, sub-pixels of the same color can also be made adjacent to each other. That is, in the adjacent third pixel units 30 in the row direction, the third sub-pixel 3 in one third pixel unit 30 and the third sub-pixel 3 in the other third pixel unit 30 are adjacent.

Optionally, in the display substrate provided by the embodiment of the present disclosure, as shown in FIGS. 1N-1S, in the second display sub-region A2, the light emitting areas of one first sub-pixel 1, one second sub-pixel 2 and one third sub-pixel 3 are approximately the same. Thus, it can make the emitted light even. Of course, because there are differences in light emitting efficiencies between different sub-pixels, the light emitting areas of the first sub-pixel 1, the second sub-pixel 2 and the third sub-pixel 3 in the second display sub-region A2 can also be different, which is not limited here.

Optionally, in the display substrate provided by the embodiment of the present disclosure, as shown in FIGS. 1N-1S, in the second display sub-region A2, the shapes of one first sub-pixel 1, one second sub-pixel 2 and one third sub-pixel 3 are approximately the same. Thus, it can reduce the manufacturing difficulty of the process.

Optionally, in the display substrate provided by the embodiment of the present disclosure, as shown in FIGS. 1N-1S, in the first display sub-region A1, the first pixel unit 10 and the second pixel unit 20 are alternately arranged in the column direction; and the first pixel unit 10 and the second pixel unit 20 are alternately arranged in the row direction.

Optionally, in the display substrate provided by the embodiment of the present disclosure, as shown in FIGS. 1N and 1O, in the first display sub-region A1, the second sub-pixel 2 and the first sub-pixel 1 in the first pixel unit 10 are arranged in a same row; the second sub-pixel 2 and the third sub-pixel 3 in the second pixel unit 20 are arranged in a same row. Moreover, for the first pixel unit 10 and the second pixel unit 20 adjacent in the row direction, the second sub-pixel 2 in the first pixel unit 10 is not adjacent to the second sub-pixel 2 in the second pixel unit 20. For example, for the first pixel unit 10 and the second pixel unit 20 adjacent in the row direction, the second sub-pixel 2 in the first pixel unit 10 and the second sub-pixel 2 in the second pixel unit 20 are separated by the third sub-pixel 3. Of course, the above-mentioned embodiments may have other implementations, and details will not be described here.

Optionally, in the display substrate provided by the embodiment of the present disclosure, as shown in FIGS. 1N and 1O, in the first display sub-region A1, the light emitting area of one first sub-pixel 1, the light emitting area of one second sub-pixel 2, and the light emitting area of one third sub-pixel 3 can be substantially the same.

Further, in the display substrate provided by the embodiment of the present disclosure, as shown in FIGS. 1N and 1O, for each first pixel unit 10 and each second pixel unit 20 in a same column, the second sub-pixel 2 in the first pixel unit 10 and the second sub-pixel 2 in the second pixel unit 20 are located in a same column. For example, taking the first column as an example, the second sub-pixel 2 in each first pixel unit 10 and the second sub-pixel 2 in each second pixel unit 20 are located in the same column.

Further, in the display substrate provided by the embodiment of the present disclosure, as shown in FIGS. 1N and 1O, in the first display sub-region A1, the shape of one first sub-pixel 1, the shape of one second sub-pixel 2, and the shape of one third sub-pixel 3 can be substantially the same. Optionally, in the first display sub-region A1, the shape of the first sub-pixel 1 can be rectangle. Optionally, in the first display sub-region A1, the shape of the second sub-pixel 2 can also be rectangle. Optionally, in the first display sub-region A1, the shape of the third sub-pixel 3 can also be rectangle.

Optionally, in the display substrate provided by the embodiment of the present disclosure, as shown in FIGS. 1P-1S, in the first display sub-region A1, the second sub-pixel 2 and the first sub-pixel 1 in the first pixel unit 10 are arranged in a same row; the second sub-pixel 2 and the third sub-pixel 3 in the second pixel unit 20 are staggered in rows and columns. And in the first pixel unit 10 and the second pixel unit 20 adjacent in the row direction, the two second sub-pixels 2 are not adjacent. Taking the first pixel unit 10 and the second pixel unit 20 adjacent in the column direction as a pixel group 100, in the same pixel group 100, the second sub-pixel 2 in the first pixel unit 10 and the second sub-pixel 2 in the second pixel unit 20 are located in the same column. That is, two adjacent rows of pixel units are staggered by half a column in the column direction.

Further, in the display substrate provided by the embodiment of the present disclosure, as shown in FIGS. 1P to 1S, in the same pixel group 100, two second sub-pixels 2 are arranged adjacent to each other in the column direction, and the two second sub-pixels 2 are symmetrical with respect to the row direction, that is, the two second sub-pixels 2 in the same pixel group 100 are arranged in a mirror configuration. Further, in the first display sub-region A1, in the case where the second sub-pixel 2 is a green sub-pixel, the light emitting areas of the two second sub-pixels 2 are both smaller than the light emitting area of one first sub-pixel 1; and the light emitting areas of the two second sub-pixels 2 are both smaller than the light emitting area of one third sub-pixel 3, because the light emitting efficiency of the green sub-pixel is higher than that of other color sub-pixels.

Optionally, in the display substrate provided by the embodiment of the present disclosure, as shown in FIGS. 1P-1S, in the first display sub-region A1, two second sub-pixels 2 adjacent in the column direction are taken as a second sub-pixel group 200; a distance between two second sub-pixel groups 200 adjacent in the column direction in the first display sub-region A1 is equal to a distance between two second sub-pixels 2 adjacent in the column direction in the second display sub-region A2.

Optionally, in the display substrate provided by the embodiment of the present disclosure, as shown in FIGS. 1P-1S, in the same pixel group 100, the shapes of the first sub-pixel 1 and the third sub-pixel 3 are consistent with each other, and the shape of a combination of the two second sub-pixels 2 adjacent in the column direction is consistent with the shape of the first sub-pixel 1.

Optionally, in the display substrate provided by the embodiment of the present disclosure, as shown in FIGS. 1P-1S, in the first display sub-region A1, the shapes of the first sub-pixel 1 and the third sub-pixel 3 are both hexagons, and the shape of the second sub-pixel 2 is pentagon. In this way, the two second sub-pixels 2 adjacent in the column direction can be combined to form a hexagonal shape.

For example, in the display substrate provided in the embodiment of the present disclosure, in the first display sub-region, the shapes of the first sub-pixel, the second sub-pixel and the third sub-pixel are not limited, and may be regular shapes or irregular shapes. In general, a regular shape is relatively easy to be realized from the technological point of view.

For example, in the display substrate provided in the embodiment of the present disclosure, in the second display sub-region, the shapes of the first sub-pixel, the second sub-pixel and the third sub-pixel are not limited, and may be regular shapes or irregular shapes. In general, a regular shape is relatively easy to be realized from the technological point of view.

Optionally, in the display substrate provided by the embodiment of the present disclosure, the distance between two first sub-pixels adjacent in the column direction in the first display sub-region is not greater than the distance between two first sub-pixels adjacent in the column direction in the second display sub-region. The distance between two third sub-pixels adjacent in the column direction in the first display sub-region is not greater than the distance between two third sub-pixels adjacent in the column direction in the second display sub-region. For example, as shown in FIGS. 1N, 1O and 1Q-1S, the distance between two first sub-pixels 1 adjacent in the column direction in the first display sub-region A1 is substantially the same as the distance between two first sub-pixels 1 adjacent in the column direction in the second display sub-region A2. The distance between the two third sub-pixels 3 adjacent in the column direction in the first display sub-region A1 is substantially the same as the distance between the two third sub-pixels 3 adjacent in the column direction in the second display sub-region A2. As shown in FIG. 1P, the distance between two first sub-pixels 1 adjacent in the column direction in the first display sub-region A1 is less than the distance between two first sub-pixels 1 adjacent in the column direction in the second display sub-region A2. The distance between the two third sub-pixels 3 adjacent in the column direction in the first display sub-region A1 is less than the distance between the two third sub-pixels 3 adjacent in the column direction in the second display sub-region A2.

Optionally, in the display substrate provided by the embodiment of the present disclosure, the light emitting area of one second sub-pixel in the second display sub-region is not less than the light emitting area of one second sub-pixel in the first display sub-region; the light emitting area of one first sub-pixel in the second display sub-region is substantially equal to the light emitting area of one first sub-pixel in the first display sub-region; and the light emitting area of one third sub-pixel in the second display sub-region is substantially equal to the light emitting area of one third sub-pixel in the first display sub-region. For example, as shown in FIGS. 1N and 1O, the light emitting area of one second sub-pixel 2 in the second display sub-region A2 is substantially equal to the light emitting area of one second sub-pixel 2 in the first display sub-region A1; the light emitting area of one first sub-pixel 1 in the second display sub-region A2 is substantially equal to the light emitting area of one first sub-pixel 1 in the first display sub-region A1; and the light emitting area of one third sub-pixel 3 in the second display sub-region A2 is substantially equal to the light emitting area of one third sub-pixel 3 in the first display sub-region A1. As shown in FIGS. 1P to 1S, the light emitting area of one second sub-pixel 2 in the second display sub-region A2 is greater than the light emitting area of one second sub-pixel 2 in the first display sub-region A1; the light emitting area of one first sub-pixel 1 in the second display sub-region A2 is substantially equal to the light emitting area of one first sub-pixel 1 in the first display sub-region A1; and the light emitting area of one third sub-pixel 3 in the second display sub-region A2 is substantially equal to the light emitting area of one third sub-pixel 3 in the first display sub-region A1.

Optionally, in the display substrate provided by the embodiment of the present disclosure, as shown in FIGS. 1N-1S, the shape of the first sub-pixel 1 in the second display sub-region A2 is substantially the same as the shape of the first sub-pixel 1 in the first display sub-region A1; and the shape of the third sub-pixel 3 in the second display sub-region A2 is substantially the same as the shape of the third sub-pixel 3 in the first display sub-region A1. Thus, it can reduce the manufacturing difficulty of the process.

Optionally, in the display substrate provided in the embodiment of the present disclosure, as shown in FIGS. 1N-1S, in the first display sub-region A1, the light emitting area of one first sub-pixel 1 is substantially the same as the light emitting area of one third sub-pixel 3.

Optionally, in the display substrate provided by the embodiment of the present disclosure, in the first display sub-region, the light emitting area of one second sub-pixel is not greater than the light emitting area of one first sub-pixel; and the light emitting area of one second sub-pixel is not greater than the light emitting area of one third sub-pixel. For example, as shown in FIGS. 1N and 1O, in the first display sub-region A1, the light emitting area of one second sub-pixel 2 is substantially the same as the light emitting area of one first sub-pixel 1; and the light emitting area of one second sub-pixel 2 is substantially the same as the light emitting area of one third sub-pixel 3. As shown in FIGS. 1P to 1S, in the first display sub-region A1, the light emitting area of one second sub-pixel 2 is smaller than the light emitting area of one first sub-pixel 1; and the light emitting area of one second sub-pixel 2 is smaller than the light emitting area of one third sub-pixel 3.

Optionally, in the display substrate provided by the embodiment of the present disclosure, as shown in FIGS. 1N and 1O, sub-pixels in the second display sub-region A2 and part of sub-pixels in the first display sub-region A1 can be located in a same row. That is, it is equivalent to that the sub-pixels in the second display sub-region A2 correspond to the sub-pixels in the first display sub-region A1 in the row direction, and they are not staggered in rows, thereby ensuring that the sub-pixels in the second display sub-region A2 and the sub-pixels in the first display sub-region A1 are consistent in the row direction, and facilitating the wirings of the display substrate.

Optionally, in the display substrate provided by the embodiment of the present disclosure, as shown in FIGS. 1P-1S, sub-pixels in the second display sub-region A2 and part of sub-pixels in the first display sub-region A1 can be located in a same column. That is, it is equivalent to that the sub-pixels in the second display sub-region A2 correspond to the sub-pixels in the first display sub-region A1 in the column direction, and they are not staggered in columns, thereby ensuring that the sub-pixels in the second display sub-region A2 and the sub-pixel in the first display sub-region A1 are consistent in the column direction, and facilitating the wirings of the display substrate.

Optionally, in the display substrate provided by the embodiment of the present disclosure, the first sub-pixel in the second display sub-region and the first sub-pixel in the first display sub-region are located in at least one of a same column and a same row. For example, as shown in FIGS. 1R and 1S, the first sub-pixel 1 in the second display sub-region A2 and the first sub-pixel 1 in the first display sub-region A1 are located in a same column, thereby ensuring that the first sub-pixel 1 in the second display sub-region A2 and the first sub-pixel 1 in the first display sub-region A1 are consistent in the column direction. As shown in FIGS. 1N and 1O, the first sub-pixel 1 in the second display sub-region A2 and the first sub-pixel 1 in the first display sub-region A1 are located in a same row, thereby ensuring that the first sub-pixel 1 in the second display sub-region A2 and the first sub-pixel 1 in the first display sub-region A1 are consistent in the row direction. Of course, it can also be that the first sub-pixel 1 in the second display sub-region A2 and the first sub-pixel 1 in the first display sub-region A1 are located in the same row, and the first sub-pixel 1 in the second display sub-region A2 and the first sub-pixel 1 in the first display sub-region A1 are located in the same column.

Optionally, in the display substrate provided by the embodiment of the present disclosure, the second sub-pixel in the second display sub-region and the second sub-pixel in the first display sub-region are located in at least one of a same column and a same row. For example, as shown in FIGS. 1N and 1O, the second sub-pixel 2 in the second display sub-region A2 and the second sub-pixel 2 in the first display sub-region A1 are located in a same row. As shown in FIGS. 1P to 1S, the second sub-pixel 2 in the second display sub-region A2 and the second sub-pixel 2 in the first display sub-region A1 are located in a same column, thereby ensuring that the second sub-pixel 2 in the second display sub-region A2 and the second sub-pixel 2 in the first display sub-region A1 are consistent in the column direction. Moreover, in the display substrate, because the second sub-pixel 2 is a light emitting pixel center of the pixel unit, it can be ensured that the light emitting pixel center in the second display sub-region and the light emitting pixel center in the first display sub-region are consistent in the row direction. Of course, it can also be that the second sub-pixel in the second display sub-region and the second sub-pixel in the first display sub-region are located in a same column, and the second sub-pixel in the second display sub-region and the second sub-pixel in the first display sub-region are located in the same row.

Optionally, in the display substrate provided by the embodiment of the present disclosure, the third sub-pixel in the second display sub-region and the third sub-pixel in the first display sub-region are located in at least one of a same column and a same row. For example, as shown in FIGS. 1R and 1S, the third sub-pixel 3 in the second display sub-region A2 and the third sub-pixel 3 in the first display sub-region A1 are located in a same column, thereby ensuring that the third sub-pixel 3 in the second display sub-region A2 and the third sub-pixel 3 in the first display sub-region A1 are consistent in the column direction. As shown in FIGS. 1N and 1O, the third sub-pixel 3 in the second display sub-region A2 and the third sub-pixel 3 in the first display sub-region A1 are located in a same row, thereby ensuring that the third sub-pixel 3 in the second display sub-region A2 and the third sub-pixel 3 in the first display sub-region A1 are consistent in the row direction. Of course, it can also be that the third sub-pixel 3 in the second display sub-region A2 and the third sub-pixel 3 in the first display sub-region A1 are located in the same column, and the third sub-pixel 3 in the second display sub-region A2 and the third sub-pixel 3 in the first display sub-region A1 are located in the same row.

Optionally, in the display substrate provided by the embodiment of the present disclosure, as shown in FIGS. 1Q-1S, the distance between two first sub-pixels 1 adjacent in the column direction in the first display sub-region A1 is equal to the distance between two first sub-pixels 1 adjacent in the column direction in the second display sub-region A2; the distance between the two third sub-pixels 3 adjacent in the column direction in the first display sub-region A1 is equal to the distance between the two third sub-pixels 3 adjacent in the column direction in the second display sub-region A2;

in the first display sub-region A1, two second sub-pixels 2 adjacent in the column direction are taken as one second sub-pixel group 200; the distance between two second sub-pixel groups 200 adjacent in the column direction in the first display sub-region A1 is equal to the distance between two second sub-pixels 2 adjacent in the column direction in the second display sub-region A2.

Optionally, in the display substrate provided in the embodiment of the present disclosure, as shown in FIGS. 1P-1S, the distribution density of the first sub-pixels 1 in the row direction in the second display sub-region A2 is about ½ of the distribution density of the first sub-pixels 1 in the row direction in the first display sub-region A1. And of course, other ratios, such as ⅓, ¼, etc., are also possible, which is not limited here.

The distribution density of the third sub-pixels 3 in the row direction in the second display sub-region A2 is about ½ of the distribution density of the third sub-pixels 3 in the row direction in the first display sub-region A1. And of course, other ratios, such as ⅓, ¼, etc., are also possible, which is not limited here.

The distribution density of the second sub-pixels 2 in the row direction in the second display sub-region A2 is about ¼ of the distribution density of the second sub-pixels 2 in the row direction in the first display sub-region A1. And of course, other ratios, such as ⅙, ⅛, etc., are also possible, which is not limited here.

It should be noted that, the row direction here is described by taking one row of sub-pixels as a unit. In addition, the density ratios provided by the embodiments of the present disclosure are all approximate ratio ranges, for example, the density ratios may not be an integer.

Optionally, in the display substrate provided by the embodiment of the present disclosure, as shown in FIGS. 1P-1S, in the first display sub-region A1, the light emitting area of the second sub-pixel 2 is smaller than the light emitting area of the first sub-pixel 1; and the light emitting area of the second sub-pixel 2 is smaller than the light emitting area of the third sub-pixel 3. This is because that, in the first display sub-region A1, the number of the first sub-pixels 1 is the same as the number of the third sub-pixels 3; and the number of the second sub-pixels 2 is twice the number of the first sub-pixels 1, so that the light emitting area of the second sub-pixel 2 can be made small.

It should be noted that, shapes being consistent means that the light emitting regions of sub-pixels are similar in shapes, but the areas thereof can be the same or different. The light emitting areas of the sub-pixels can be set according to the light emitting efficiencies of the sub-pixels, which is not limited here.

It should be noted that, in the display panel provided by the embodiment of the present disclosure, the shape of the sub-pixel refers to the shape of the light emitting region of the sub-pixel.

For example, in the display substrate provided by the embodiment of the present disclosure, as shown in FIGS. 1P-1S, in the first display sub-region A1, in the case where the second sub-pixel 2 is a green sub-pixel, the light emitting areas of the two second sub-pixels 2 are both smaller than the light emitting area of one first sub-pixel 1; and the light emitting areas of the two second sub-pixels 2 are both smaller than the light emitting area of one third sub-pixel 3, because the light emitting efficiency of the green sub-pixel is higher than that of other color sub-pixels.

In the embodiment of the present disclosure, because the pixel distribution density of the second display sub-region A2 is less than the pixel distribution density of the first display sub-region A1, the second display sub-region A2 can allow light to pass therethrough, so that elements such as a camera positioned under the display screen can receive ambient light. A transparent region within the second display sub-region A2 in FIGS. 1B-1S will be described below. For example, in the manufacturing process, a film layer such as a light emitting functional layer is not evaporated in the transparent region, so as to improve the transmittance of ambient light. For convenience of description, the transparent region located in the second display sub-region A2 is referred to as a first transparent pixel P1.

For example, as shown in FIGS. 1B-1S, in the embodiment of the present disclosure, the first transparent pixel P1 is configured such that a pixel density of the second display sub-region A2 is less than a pixel density of the first display sub-region A1, and such that a light transmittance of the second display sub-region A2 is greater than a light transmittance of the first display sub-region A1. For example, the light transmittance refers to a light transmittance of ambient light. For example, the second display sub-region A2 allows ambient light to pass therethrough, while the first display sub-region A1 does not allow ambient light to pass therethrough.

For example, in the embodiment of the present disclosure, as shown in FIGS. 1B-1S, the first display sub-region A1 includes a plurality of first repeating regions A01, and each first repeating region A01 includes a first display unit 10 and a second display unit 20.

For example, as shown in FIGS. 1B-1F, 1N and 1O, the plurality of first repeating regions A01 are arranged in an array. That is, except for the first repeating region A01 at an edge position, each first repeating region A01 is adjacent to eight first repeating regions A01 and surrounded by the eight first repeating regions A01.

For example, as shown in FIGS. 1G-1M and 1P-1S, except for the first repeating region A01 at an edge position, each first repeating region A01 is adjacent to six first repeating regions A01 and surrounded by the six first repeating regions A01.

For example, in different first repeating regions A01, the arrangement manner of the first pixel unit 10 and the second pixel unit 10 can be different; and the arrangement manner of the first sub-pixel 1 and the second sub-pixel 2 in the first pixel unit 10 and the arrangement manner of the third sub-pixel 3 and the second sub-pixel 2 in the second pixel unit 20 can be different.

For example, in the embodiment of the present disclosure, as shown in FIGS. 1B-1S, the second display sub-region A2 includes a plurality of second repeating regions A02, and each second repeating region A02 includes a first transparent pixel P1. The first transparent pixel P1 can allow ambient light to pass therethrough. That is, ambient light can pass through the first transparent pixel P1 of the display substrate to be incident on elements such as a camera under the display screen. For example, as shown in FIGS. 1B-1S, the plurality of second repeating regions A02 are arranged in an array. For example, as shown in FIG. 1B, the plurality of second repeating regions A02 include a first type of second repeating region A02 and a second type of second repeating region A02. For example, the second repeating region A02 of the first type includes a third pixel unit of a first type, and the second repeating region A02 of the second type includes a third pixel unit of a second type. For example, in different second repeating regions A02, the arrangement manners of the third pixel units can be different.

For example, as shown in FIGS. 1B-1S, the first transparent pixel P1 includes at least one selected from the group consisting of a first transparent sub-pixel P01, a second transparent sub-pixel P02 and a third transparent sub-pixel P03.

For example, as shown in FIGS. 1B-1D, a first transparent pixel P1 is provided between third pixel units adjacent in the row direction, so that a first transparent pixel column can be formed. Further, for example, the first transparent pixel P1 includes a second transparent sub-pixel P02, that is, a second transparent sub-pixel P02 is provided between third pixel units adjacent in the row direction, so that a second transparent sub-pixel column can be formed.

For example, as shown in FIG. 1B, the first transparent pixel P1 includes only the second transparent sub-pixel P02. The area of the first transparent pixel P1 is equal to the area of the second transparent sub-pixel P02.

As shown in FIGS. 1C-1G, the first transparent pixel P1 includes one first transparent sub-pixel P01, two second transparent sub-pixels P02, and one third transparent sub-pixel P03. The area of the first transparent pixel P1 is greater than the area of at least one selected from the group consisting of the first transparent sub-pixel P01, the second transparent sub-pixel P02, and the third transparent sub-pixel P03.

For example, as shown in FIGS. 1C-1G, the first transparent pixel P1 includes one first transparent sub-pixel P01, two second transparent sub-pixels P02, and one third transparent sub-pixel P03. The area of the first transparent pixel P1 is greater than the area of at least one selected from the group consisting of the first transparent sub-pixel P01, the second transparent sub-pixel P02, and the third transparent sub-pixel P03.

For example, as shown in FIGS. 1C-1G, the area of the first transparent pixel P1 is equal to the sum of the areas of one first transparent sub-pixel P01, two second transparent sub-pixels P02 and one third transparent sub-pixel P03.

For example, as shown in FIGS. 1C, 1D, 1G-1I and 1K-1M, one first transparent pixel P1 is provided between third pixel units adjacent in the column direction to form a first transparent pixel row. For example, the first transparent pixel row includes a first transparent sub-pixel P01, a second transparent sub-pixel P02, and a third transparent sub-pixel P03.

For example, as shown in FIG. 1B, one first transparent pixel P1 is provided between third pixel units of a first type adjacent in the row direction; and one first transparent pixel P1 is provided between third pixel units of a second type adjacent in the row direction. For example, the area and shape of the first transparent pixel P1 can be the same as the area and shape of the second sub-pixel 2 in the second pixel unit 20 in the first display sub-region A1. Alternatively, for example, the area and shape of the first transparent sub-pixel P01 can be the same as the area and shape of the second sub-pixel 2 in the second pixel unit 20 in the first display sub-region A1. That is, replacing the second sub-pixel 2 in the second pixel unit 20 in the first display sub-region A1 with the first transparent pixel P1 can form the structure of the second display sub-region A2.

For example, as shown in FIGS. 1B-1M, the second display sub-region A2 includes a plurality of transparent sub-pixel columns, for example, each transparent sub-pixel column includes a plurality of second transparent sub-pixels P02. For example, each transparent sub-pixel column includes only a plurality of second transparent sub-pixels P02, and does not include the first transparent sub-pixel P01 and the third transparent sub-pixel P03.

For example, as shown in FIGS. 1G-1I, the second display sub-region A2 includes a plurality of first transparent pixel rows, for example, each first transparent pixel row includes a plurality of first transparent sub-pixels P01, a plurality of second transparent sub-pixels P02, and a plurality of third transparent sub-pixels P03.

For example, as shown in FIGS. 1C, 1D and 1G-1H, a plurality of transparent sub-pixel columns and a plurality of transparent sub-pixel rows are arranged in an intersected manner.

For example, in the embodiment of the present disclosure, a transparent sub-pixel row may refer to that the row in the second display sub-region A2 is composed of transparent sub-pixels, excluding sub-pixels that can emit light, i.e., excluding the first sub-pixel 1, the second sub-pixel 2 and the third sub-pixel 3. Correspondingly, a transparent sub-pixel column may refer to that the column in the second display sub-region A2 is composed of transparent sub-pixels, excluding sub-pixels that can emit light, i.e., excluding the first sub-pixel 1, the second sub-pixel 2 and the third sub-pixel 3. The transparent sub-pixel includes at least one selected from the group consisting of a first transparent sub-pixel P01, a second transparent sub-pixel P02 and a third transparent sub-pixel P03.

It should be noted that, for convenience of understanding, the first transparent pixel P1 is shown by a dashed box in FIGS. 1B and 1D-1G, but the structure of the first transparent pixel P1 is not limited to that shown in the figures. For example, the dashed box representing the first transparent pixel in FIGS. 1B and 1D-1G can also be removed. For example, one column of first transparent pixels P1 in FIG. 1B can be regarded as one first transparent pixel. For other figures in which the first transparent pixel or the transparent sub-pixel is not shown by a dashed box, the transparent sub-pixel/first transparent pixel is indicated with a reference sign thereof.

Compared with the display substrate shown in FIG. 1B, the display substrate shown in FIG. 1C has an increased light transmission area. As shown in FIGS. 1B and 1C, in the second display sub-region A2, sub-pixels between odd rows of sub-pixels are replaced with first transparent pixels P1. For example, as shown in FIG. 1C, the first transparent pixel P1 includes one first transparent sub-pixel P01, three second transparent sub-pixels P02, and one third transparent sub-pixel P03.

For example, as shown in FIGS. 1C-1G, one first transparent sub-pixel P01 has the same area and shape as one first sub-pixel 1 in the first display sub-region A1; one second transparent sub-pixel P02 has the same area and shape as one second sub-pixel 2 in the first display sub-region A1; and one third transparent sub-pixel P03 has the same area and shape as one third sub-pixel 3 in the first display sub-region A1. For example, as shown in FIGS. 1C-1G, one first sub-pixel 1 in the second display sub-region A2 has the same area and shape as one first sub-pixel 1 in the first display sub-region A1; one second sub-pixel 2 in the second display sub-region A2 has the same area and shape as one second sub-pixel 2 in the first display sub-region A1; and one third sub-pixel 3 in the second display sub-region A2 has the same area and shape as one third sub-pixel 3 in the first display sub-region A1.

For example, as shown in FIG. 1H, one first sub-pixel 1 in the second display sub-region A2 has the same area and shape as one first sub-pixel 1 in the first display sub-region A1; one second sub-pixel 2 in the second display sub-region A2 has the same shape as one second sub-pixel 2 in the first display sub-region A1, but an area of one second sub-pixel 2 in the second display sub-region A2 is greater than an area of one second sub-pixel 2 in the first display sub-region A1; one third sub-pixel 3 in the second display sub-region A2 has the same area and shape as one third sub-pixel 3 in the first display sub-region A1.

For example, as shown in FIGS. 1B-1G, one first transparent sub-pixel P01 has the same area and shape as one first sub-pixel 1 in the second display sub-region A2; one second transparent sub-pixel P02 has the same area and shape as one second sub-pixel 2 in the second display sub-region A2; and one third transparent sub-pixel P03 has the same area and shape as one third sub-pixel 3 in the second display sub-region A2.

For example, as shown in FIG. 1H, one first transparent sub-pixel P01 has the same area and shape as one first sub-pixel 1 in the second display sub-region A2; one third transparent sub-pixel P03 has the same area and shape as one third sub-pixel 3 in the second display sub-region A2; and an area of one second transparent sub-pixel P02 is smaller than an area of one second sub-pixel 2 in the second display sub-region A2.

For example, as shown in FIGS. 1B-1O, an area of one first transparent sub-pixel P01 is greater than or equal to an area of one first sub-pixel 1 in the first display sub-region A1; an area of one second transparent sub-pixel P02 is greater than or equal to an area of one second sub-pixel 2 in the first display sub-region A1; and an area of one third transparent sub-pixel P03 is greater than or equal to an area of one third sub-pixel 3 in the second display sub-region A2.

For example, as shown in FIGS. 1C and 1D-1H, the plurality of first transparent pixels P1 form a plurality of transparent sub-pixel rows and form a plurality of transparent sub-pixel columns. For example, the plurality of transparent sub-pixel rows are intersected with the plurality of transparent sub-pixel columns. Further, for example, the plurality of transparent sub-pixel rows are perpendicular to the plurality of transparent sub-pixel columns. The light transmittance of the second display sub-region A2 of the display substrate shown in FIG. 1C is greater than the light transmittance of the second display sub-region A2 of the display substrate shown in FIG. 1B.

For example, as shown in FIGS. 1C, 1D and 1F-1H, except for the third pixel unit 30 at an edge position of the second display sub-region A2, each third pixel unit 30 is surrounded by the first transparent pixels P1, for example, surrounded by the first transparent sub-pixel P01, the second transparent sub-pixel P02, and the third transparent sub-pixel P03; and further, for example, surrounded by at least two first transparent sub-pixels P01, four second transparent sub-pixels P02, and two third transparent sub-pixels P03. For example, as shown in FIGS. 1C, 1D, 1F and 1H, except for the third pixel unit 30 at an edge position of the second display sub-region A2, each third pixel unit 30 is surrounded by at least two first transparent sub-pixels P01, four second transparent sub-pixels P02, and two third transparent sub-pixels P03. For example, as shown in FIGS. 1C, 1D and 1F, except for the third pixel unit 30 at an edge position of the second display sub-region A2, each third pixel unit 30 is surrounded by two first transparent sub-pixels P01, eight second transparent sub-pixels P02, and two third transparent sub-pixels P03. For example, as shown in FIG. 1G, except for the third pixel unit 30 at an edge position of the second display sub-region A2, each third pixel unit 30 is surrounded by two first transparent sub-pixels P01, five second transparent sub-pixels P02, and two third transparent sub-pixels P03. For example, as shown in FIG. 1H, except for the third pixel unit 30 at an edge position of the second display sub-region A2, each third pixel unit 30 is surrounded by two first transparent sub-pixels P01, eight second transparent sub-pixels P02, and two third transparent sub-pixels P03.

For example, as shown in FIG. 1E, except for the third pixel unit 30 at an edge position of the second display sub-region A2, at least one selected from the group consisting of the first sub-pixel 1, the second sub-pixel 2, and the third sub-pixel 3 in each third pixel unit 30 is surrounded by at least one first transparent sub-pixel P01, two second transparent sub-pixels P02, and one third transparent sub-pixel P03.

For example, as shown in FIGS. 1O-1S, in the second display sub-region A2, a connecting line between the centers of two sub-pixels adjacent in the column direction passes through the center of a transparent sub-pixel located between the two sub-pixels.

For example, as shown in FIGS. 1N-1S, a connecting line between the centers of two sub-pixels adjacent in the row direction passes through the center of a transparent sub-pixel located between the two sub-pixels. The two adjacent sub-pixels include at least one selected from the group consisting of two adjacent first sub-pixels 1, two adjacent second sub-pixels 2, and two adjacent third sub-pixels 3. The transparent sub-pixel includes one selected from the group consisting of the first transparent sub-pixel P01, the second transparent sub-pixel P02, and the third transparent sub-pixel P03.

For example, as shown in FIGS. 1B-1S, the area of the first transparent pixel P1 is greater than or equal to the area of at least one selected form the group consisting of a first sub-pixel 1, a second sub-pixel 2, and a third sub-pixel 3 of the third pixel unit 30.

For example, as shown in FIGS. 1C-1M, the area of the first transparent pixel P1 is greater than or equal to the sum of the areas of the first sub-pixel 1, the second sub-pixel 2, and the third sub-pixel 3 of the third pixel unit 30.

For example, as shown in FIGS. 1C-1H, the area of the first transparent pixel P1 is greater than or equal to the area of at least one selected from the group consisting of one first sub-pixel 1, one second sub-pixel 2, and one third sub-pixel 3 in the first display sub-region A1.

For example, as shown in FIGS. 1C-1I, the area of the first transparent pixel P1 is greater than or equal to the sum of the areas of one first sub-pixel 1, one second sub-pixel 2 and one third sub-pixel 3 in the first display sub-region A1.

For example, as shown in FIGS. 1C-1S, the area of the first transparent pixel P1 is greater than or equal to the area of at least one selected from the group consisting of one first sub-pixel 1, one second sub-pixel 2, and one third sub-pixel 3 in the second display sub-region A2.

For example, as shown in FIGS. 1I-1M, the area of the first transparent pixel P1 is greater than or equal to the sum of the areas of one first sub-pixel 1, one second sub-pixel 2 and one third sub-pixel 3 in the second display sub-region A2.

For example, as shown in FIGS. 1B-1S, in the embodiment of the present disclosure, the areas of the plurality of first transparent pixels P1 in the second display sub-region A2 can be the same or different.

Figure 2A:
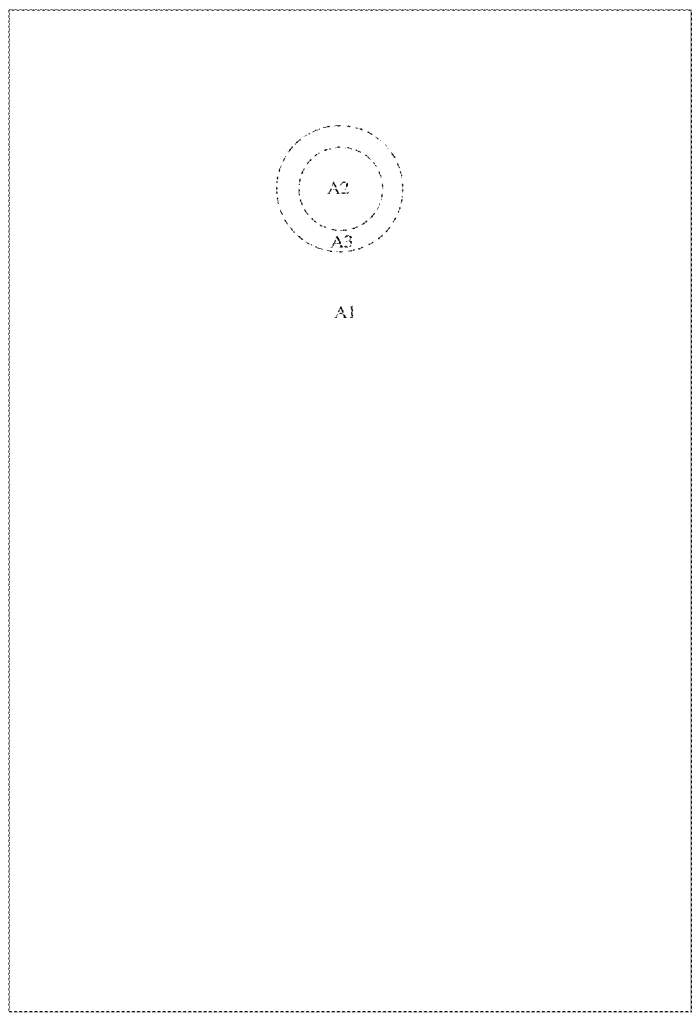
FIG. 2A is a schematic diagram of a display substrate according to another embodiment of the present disclosure.

FIG. 2A is a schematic diagram of a first display sub-region, a second display sub-region and a transition display sub-region of a display substrate according to an embodiment of the present disclosure. FIGS. 2B-2L are schematic diagrams of the pixel arrangements of the first display sub-region, the second display sub-region and the transition display sub-region and the arrangements of a first transparent pixel and a second transparent pixel of the display substrate provided by the embodiment of the disclosure.

In the display substrate provided by the embodiment of the present disclosure, as shown in FIG. 2A-2L, the display region of the display substrate includes not only a first display sub-region A1 and a second display sub-region A2, but also a transition display sub-region A3 located between the first display sub-region A1 and the second display sub-region A2; the transition display sub-region A3 has a preset width. For example, the light transmittance of the second display sub-region A2 is less than the light transmittance of the transition display sub-region A3. Thus, the transition display sub-region A3 can provide a transition of light transmittance from the first display sub-region A1 to the second display sub-region A2. For example, the light transmittance refers to a light transmittance for ambient light.

For example, the pixel distribution density in the first display sub-region A1 is greater than the pixel distribution density in the second display sub-region A2; the pixel distribution density in the transition display sub-region A3 is less than the pixel distribution density in the first display sub-region A1; and the pixel distribution density in the transition display sub-region A3 is greater than the pixel distribution density in the second display sub-region A2.

In the display substrate according to the embodiment of the present disclosure, the display region is designed to include a first display sub-region with high pixel distribution density (i.e., high resolution) and a second display sub-region with low pixel distribution density (i.e., low resolution). Because the pixel distribution density in the second display sub-region is low, components such as a camera, a sensor, an earpiece and the like, can be arranged in the second display sub-region, that is, the screen-to-body ratio of the display substrate can be increased by increasing the light transmittance of the screen through reducing a partial pixel distribution density. And a transition display sub-region with a pixel distribution density (resolution) between the pixel distribution density of the first display sub-region and the pixel distribution density of the second display sub-region is arranged between the first display sub-region and the second display sub-region, so that the brightness of the first display sub-region can be transited to the brightness of the second display sub-region through the brightness of the transition display sub-region, thereby avoiding the problem of dark stripes at the boundary of the second display sub-region close to the first display sub-region.

In a specific implementation, if the transition display sub-region is not provided, because the pixel distribution density of the second display sub-region is less than the pixel distribution density of the first display sub-region, the brightness of the second display sub-region will be significantly different from the brightness of the first display sub-region during display, thus there will be obvious dark stripes visible to human eyes at the boundary of the first display sub-region and the second display sub-region. In order to alleviate dark stripes, the embodiment of the present disclosure provides a transition display sub-region between the first display sub-region and the second display sub-region, and uses the transition display sub-region to reduce the brightness difference at the boundary of the second display sub-region, thereby alleviating dark stripes.

For example, as shown in FIGS. 2A-2L, the display substrate includes a first display sub-region A1 and a second display sub-region A2. The positional relationship of the first display sub-region A1 and the second display sub-region A2 can refer to the positional relationship of the first display sub-region A1 and the second display sub-region A2 in FIG. 1A, but is not limited thereto. The first display sub-region A1 and the second display sub-region A2 can be located at any position on the screen and can be designed into any shape according to requirements.

As shown in FIGS. 2A-2L, in an embodiment of the present disclosure, in order to avoid the boundary dividing line problem of the display substrate, the display substrate further includes a transition display sub-region A3. For example, the transition display sub-region A3 is located between the first display sub-region A1 and the second display sub-region A2, but is not limited thereto.

As shown in FIG. 2A, the display substrate includes a first display sub-region A1, a second display sub-region A2 and a transition display sub-region A3. In FIG. 2A, the second display sub-region A2 and the transition display sub-region A3 are illustrated as circular regions by way example, but are not limited thereto. The second display sub-region A2 and the transition display sub-region A3 can also be regions of other shapes, such as rectangular regions.

As shown in FIGS. 2B-2L, the transition display sub-region A3 includes a fourth pixel unit 40, and the fourth pixel unit 40 includes a first sub-pixel 1, a second sub-pixel 2 and a third sub-pixel 3.

As shown in FIGS. 2B-2L, the transition display sub-region A3 includes a plurality of third repeating regions A03, each third repeating region A03 includes a fourth pixel unit 40 and a second transparent pixel P2, and the area of the second transparent pixel P2 is smaller than the area of the first transparent pixel P1.

For example, as shown in FIGS. 2B-2L, the plurality of third repeating regions A03 can be arranged in an array or formed as at least one row and/or at least one column of pixels.

For example, as shown in FIGS. 2B-2L, the distribution density of the second transparent pixels P2 is less than the distribution density of the first transparent pixels P1. In the embodiment of the present disclosure, the distribution density of the first transparent pixels P1 may refer to the ratio of the area of the first transparent pixel P1 to the area of the second display sub-region A2; and the distribution density of the second transparent pixels P2 may refer to the ratio of the area of the second transparent pixel P2 to the area of the transition display sub-region A3.

For example, as shown in FIGS. 2B-2L, the second transparent pixel P2 includes a second transparent sub-pixel.

For example, as shown in FIGS. 2B-2K, the second transparent pixel P2 has the same area and shape as the second sub-pixel in the first display sub-region A1.

Figure 2B:
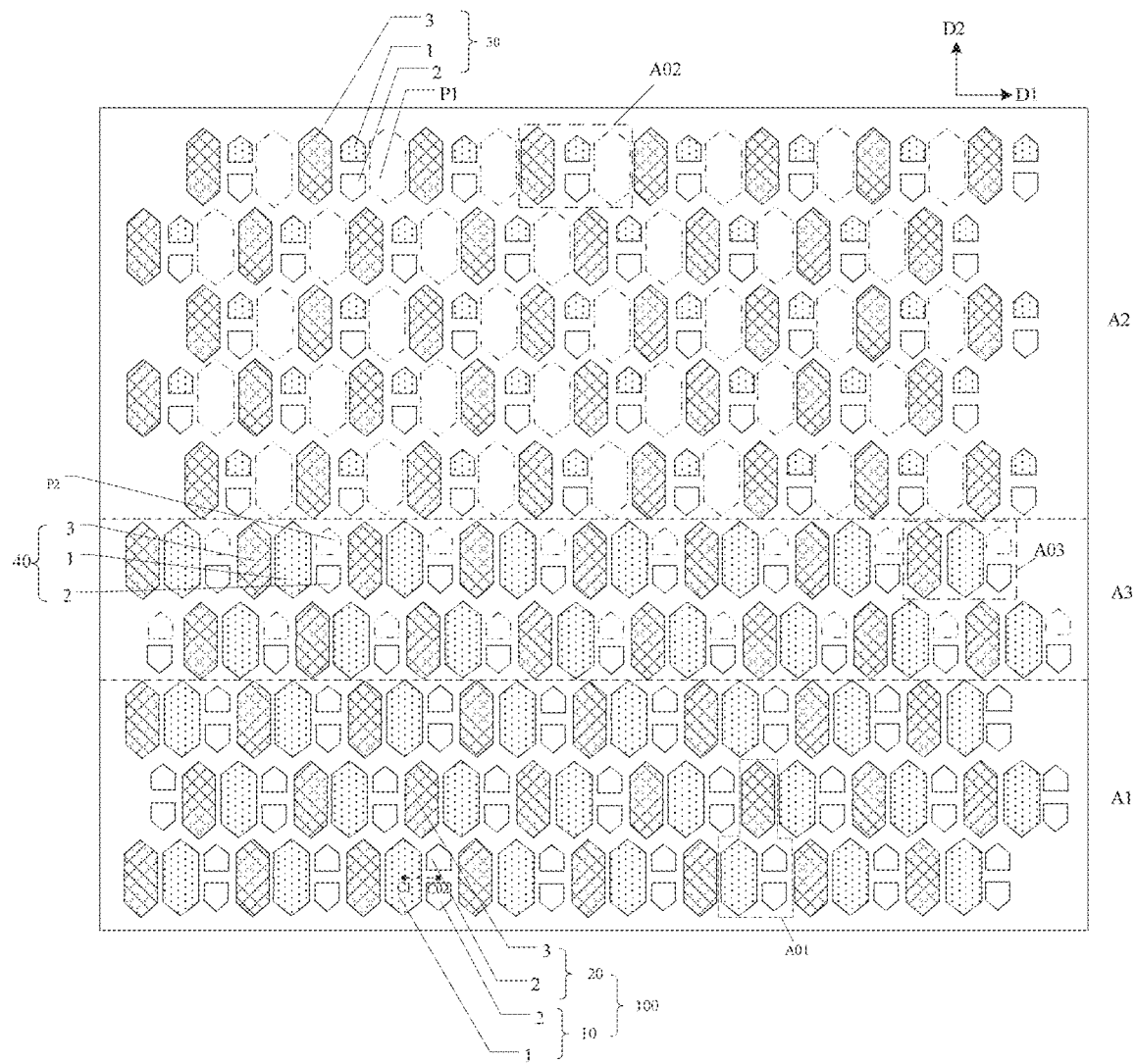
FIGS. 2B-2L are partial schematic diagrams of a display substrate according to some embodiments of the present disclosure.
Figure 2C:
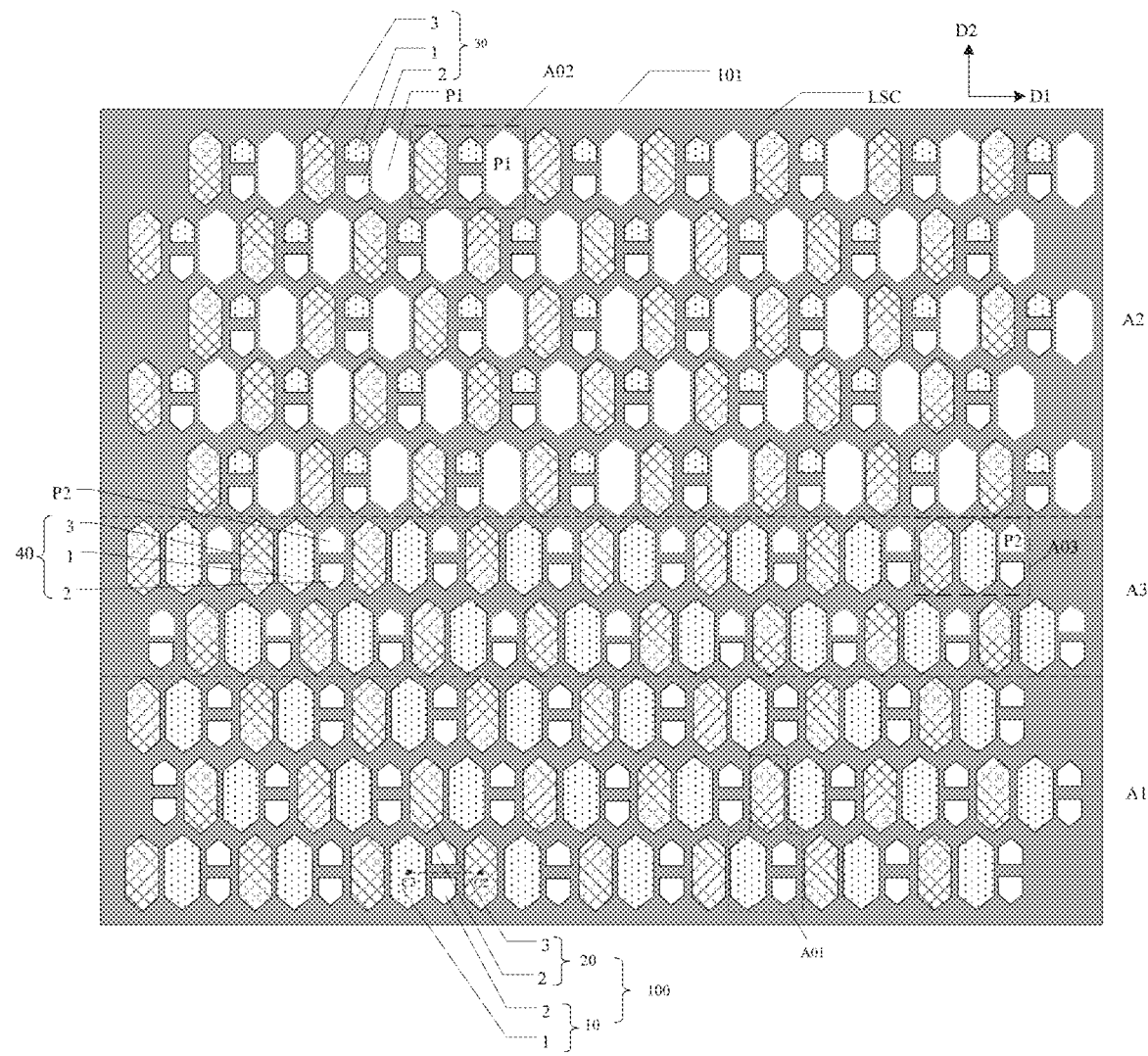

For example, as shown in FIGS. 2B and 2C, in the fourth pixel unit 40, the third sub-pixel 3, the first sub-pixel 1, and the second sub-pixel 2 are sequentially arranged, and the area of the second sub-pixel 2 is smaller than the area of at least one of the third sub-pixel 3 and the first sub-pixel 1. A region surrounded by a dashed box in the third repeating region A03 of the transition display sub-region A3 in FIG. 2B is one second transparent pixel P2, and a region surrounded by a dashed box in the second repeating region A02 of the second display sub-region A2 in FIG. 2B is one first transparent pixel P1.

For example, as shown in FIGS. 2B-2L, the area of the second transparent pixel P2 is greater than or equal to the area of at least one selected from the group consisting of the first sub-pixel 1, the second sub-pixel 2, and the third sub-pixel 3 in the fourth pixel unit 40.

For example, as shown in FIGS. 2B-2K, the area of the second transparent pixel P2 is greater than or equal to the sum of the areas of the first sub-pixel 1, the second sub-pixel 2, and the third sub-pixel 3 in the fourth pixel unit 40.

For example, as shown in FIGS. 2B-2K, the area of the second transparent pixel P2 is equal to the area of the second sub-pixel 2 in the fourth pixel unit 40.

In the embodiment of the present disclosure, the transition display sub-region with a pixel distribution density (resolution) between the pixel distribution density of the first display sub-region and the pixel distribution density the second display sub-region is arranged between the first display sub-region and the second display sub-region, so that the brightness of the first display sub-region can be transited to the brightness of the second display sub-region through the brightness of the transition display sub-region, thereby avoiding the problem of dark stripes at the boundary of the second display sub-region close to the first display sub-region.

For example, in the embodiment of the present disclosure, the first display sub-region A1 is a normal display sub-region and does not include a region that transmits ambient light. The second display sub-region A2 and the transition display sub-region A3 are regions capable of achieving display and also transmitting ambient light.

As shown in FIGS. 2B and 2C, the first display sub-region A1 includes a first pixel unit 10 and a second pixel unit 20; the first pixel unit 10 includes a first sub-pixel 1 and a second sub-pixel 2; the second pixel unit 20 includes a second sub-pixel 2 and a third sub-pixel 3. For example, in an embodiment, an orthographic projection of a center of the third sub-pixel 3 of the second pixel unit 20 on a connecting line between, a midpoint C02 of a line of centers of the second sub-pixel 2 of the first pixel unit 10 and the second sub-pixel 2 of the second pixel unit 20, and, a center C1 of the first sub-pixel 1 of the first pixel unit 10, is located between the midpoint C02 and the center C1 of the first sub-pixel 1 of the first pixel unit 10. Further, for example, the orthographic projection coincides with a midpoint of the connecting line between C1 and C02.

For example, the first pixel unit 10 and the second pixel unit 20 shown in FIGS. 2B and 2C can also refer to the description of the first pixel unit 10 and the second pixel unit 20 in the first display sub-region A1 having a similar structure in other embodiments, for example, refer to the related descriptions in FIGS. 1G-1M and 1P-1S, and details will not be repeated here.

In the embodiment of the present disclosure, by arranging the first pixel unit 10 and the second pixel unit 20 in the first display sub-region A1 and by arranging the third pixel unit 30 in the second display sub-region A2, it reduces the number of the sub-pixels of the third pixel unit 30 in the second display sub-region A2, so as to reduce the pixel distribution density of the second display sub-region A2, and to increase the light transmittance of the second display sub-region A2, thereby avoiding the problem of low transmittance of the second display sub-region A2 due to adopting an under-screen camera scheme. In addition, the pixel arrangement manner of the first display sub-region A1 and the second display sub-region A2 provided by the embodiment of the present disclosure can enable the first display sub-region A1 to be driven in a sub pixel rendering (SPR)/sub-pixel borrowing manner while the second display sub-region A2 is driven in a conventional manner. For example, the conventional driving manner is a manner in which no sub-pixel is borrowed, including real RGB, but is not limited thereto. The display panel provided by the embodiment of the present disclosure can avoid the problem of low transmittance of the second display sub-region A2 caused by adopting an under-screen camera scheme.

In the embodiment of the present disclosure, the first display sub-region A1 can be driven by means of sub-pixel rendering. If the second display sub-region A2 is also driven by means of SPR, the color shift will be serious due to the low pixel distribution density of the second display sub-region A2. Therefore, in the embodiment of the present disclosure, the second display sub-region A2 can be driven by a conventional driving method, and the arrangement of the second sub-pixel 2, the third sub-pixel 3 and the first sub-pixel 1 in the third pixel unit 30 can be designed accordingly. The SPR method can be realized by algorithm. The SPR method can form pixels for display by borrowing neighboring sub-pixels based on virtual pixels.

For example, in FIGS. 2B and 2C, in the first display sub-region A1, the first pixel unit 10 is a first virtual pixel and the second pixel unit 20 is a second virtual pixel. The first virtual pixel and the second virtual pixel can include sub-pixels of two different primary colors respectively, so that a sub-pixel of another primary color adjacent to the first virtual pixel can be borrowed, and a sub-pixel of another primary color adjacent to the second virtual pixel can be borrowed, so as to form pixels capable of presenting three primary colors for color display, respectively.

FIGS. 2B and 2C show a first direction D1 and a second direction D2, for example, the first direction D1 is perpendicular to the second direction D2, the first direction D1 can be a horizontal direction, and the second direction D2 can be a vertical direction. As shown in FIG. 2B, the third sub-pixel 3 in the second pixel unit 20 extends along the second direction D2, and the first sub-pixel 1 in the first pixel unit 10 extends along the second direction D2. As shown in FIG. 2B, in one embodiment of the present disclosure, in the third pixel unit 30 of the second display sub-region A2, the first sub-pixel 1 and the second sub-pixel 2 are arranged in a direction parallel to the extending direction of the third sub-pixel 3; and the second sub-pixel 2 and the first sub-pixel 1 are located between the first transparent pixel P1 and the third sub-pixel 3. In other embodiments, the position of the third sub-pixel 3 can be kept unchanged, and the position of the first transparent pixel P1 can be exchanged with the position of a combination of the second sub-pixel 2 and the first sub-pixel 1, that is, the first transparent pixel P1 is located between the third sub-pixel 3 and the combination of the first sub-pixel 1 and the second sub-pixel 2 which is vertically arranged.

As shown in FIGS. 2B and 2C, in one embodiment of the present disclosure, for example, in the first display sub-region A1, the area of at least one of one third sub-pixel 3 and one first sub-pixel 1 is greater than the area of one second sub-pixel 2. For example, in the first display sub-region A1, the area of each of the third sub-pixel 3 and the first sub-pixel 1 is greater than the area of each of the second sub-pixel 2 in the first display unit 10 and the second sub-pixel 2 in the second display unit 20. For example, the area of the second sub-pixel 2 in the first display unit 10 is equal to the area of the second sub-pixel 2 in the second display unit 20.

For example, as shown in FIGS. 2B and 2C, the area of the first transparent pixel P1 is equal to the area of at least one of the first sub-pixel 1 in the first pixel unit 10 and the third sub-pixel 3 in the second pixel unit 20. This setting can be advantageous to obtain a relatively large transmittance of the second display sub-region A2. The embodiment shown in FIG. 2B will be described by taking that the area of the first transparent pixel P1 is equal to the area of the first sub-pixel 1 as an example.

For example, as shown in FIGS. 2B and 2C, the area of the second transparent pixel P2 is equal to the area of the second sub-pixel 2 in the first pixel unit 10 or in the second pixel unit 20. Thus, the area of the second transparent pixel P2 can be smaller than the area of the first transparent pixel P1, so that the brightness transition between the first display sub-region A1 and the second display sub-region A2 is more natural.

As shown in FIGS. 2B and 2C, in one embodiment of the present disclosure, the second sub-pixel 2 in the first display sub-region A1, the second sub-pixel 2 in the second display sub-region A2, and the second sub-pixel 2 in the transition display sub-region A3 have the same area and shape.

As shown in FIGS. 2B and 2C, in one embodiment of the present disclosure, the first sub-pixel 1 in the first display sub-region A1 and the first sub-pixel 1 in the transition display sub-region A3 have the same area and shape. The area of the first sub-pixel 1 in the second display sub-region A2 is smaller than the area of the first sub-pixel 1 in the first display sub-region A1; the first sub-pixel 1 in the second display sub-region A2 and the second sub-pixel 2 in the first display sub-region A1 have the same area and shape.

As shown in FIGS. 2B and 2C, in one embodiment of the present disclosure, the third sub-pixel 3 in the first display sub-region A1, the third sub-pixel 3 in the second display sub-region A2, and the third sub-pixel 3 in the transition display sub-region A3 have the same area and shape.

As shown in FIGS. 2B and 2C, in one embodiment of the present disclosure, the area of the first transparent pixel P1 is larger than the area of at least one of the first sub-pixel 1 and the second sub-pixel 2 in the third pixel unit 30, so that the first transparent pixel P1 can have a relatively large light transmission area.

As shown in FIGS. 2B and 2C, in one embodiment of the present disclosure, in the second repeating region A02, the second sub-pixel 2 and the first sub-pixel 1 are located between the first transparent pixel P1 and the third sub-pixel 3.

As shown in FIGS. 2B and 2C, in one embodiment of the present disclosure, the first sub-pixel 1 in the first display sub-region A1, the first sub-pixel 1 in the second display sub-region A2, and the first sub-pixel 1 in the transition display sub-region A3 are sub-pixels of the same color; the second sub-pixel 2 in the first display sub-region A1, the second sub-pixel 2 in the second display sub-region A2, and the second sub-pixel 2 in the transition display sub-region A3 are sub-pixels of the same color; the third sub-pixel 3 in the first display sub-region A1, the third sub-pixel 3 in the second display sub-region A2, and the third sub-pixel 3 in the transition display sub-region A3 are sub-pixels of the same color. For example, in one embodiment of the present disclosure, in the first display sub-region A1, the second display sub-region A2, and the transition display sub-region A3, the first sub-pixel 1 is a red sub-pixel, the second sub-pixel 2 is a green sub-pixel, and the third sub-pixel 3 is a blue sub-pixel. For example, in other embodiments, in the first display sub-region A1, the second display sub-region A2, and the transition display sub-region A3, the first sub-pixel 1 is a blue sub-pixel, the second sub-pixel 2 is a green sub-pixel, and the third sub-pixel 3 is a red sub-pixel.

In the case where the first sub-pixel 1 is a red sub-pixel, the second sub-pixel 2 is a green sub-pixel and the third sub-pixel 3 is a blue sub-pixel in the first display sub-region A1, the second display sub-region A2, and the transition display sub-region A3, compared with the pixel arrangement of the first display sub-region A1, the pixel arrangement of the second display sub-region A2 is to retain the number of the blue sub-pixels, reduce the number of the green sub-pixels and reduce the area of red sub-pixels. This setting can increase the transmittance of the display substrate while changing the RGBG arrangement to real RGB arrangement so as to reduce the risk of color shift. And because the position of the blue sub-pixel is unchanged, the transition between the first display sub-region A1 and the second display sub-region A2 is more natural. Compared with the first display sub-region A1, the size and position of the original blue sub-pixel are retained in the second display sub-region A2, a green pixel is evaporated at the position of the original red sub-pixel, and the color of one of the green sub-pixels is changed to red, so that the pixel density is reduced and the transmittance is increased. The size and position of RGBG arrangement are still adopted in the transition display sub-region A3, but the number of the green sub-pixels is reduced to one, such that the RGBG arrangement actually becomes real RGB arrangement, which is gradually transited to the first display sub-region A1. Therefore, the boundary between the second display sub-region A2 and the first display sub-region 01 can be effectively alleviated, and the boundary dividing line problem of the display substrate can be avoided. The number of the rows in the second display sub-region A2 and the transition display sub-region A3 can be determined by specific situations. In the display substrate provided by the embodiment of the present disclosure, as shown in FIGS. 2B and 2C, the arrangement of the first transparent pixels P1 is uniform and the arrangement of the second transparent pixels P2 is uniform.

In the embodiment of the present disclosure, the transition between the second display sub-region A2, the transition display sub-region A3 and the first display sub-region A1 is in such a manner that the pixel area is gradually increased, which is beneficial to eliminate the boundary dividing line, thereby making the transition between the first display sub-region A1 and the second display sub-region A2 more natural, and avoiding the boundary dividing line problem between the second display sub-region A2 and the first display sub-region A1 caused by adopting an under-screen camera scheme.

The display substrate provided by the embodiment of the present disclosure complies with the quantification of human visual system, eliminates the occurrence of obvious boundary, has significant effect on improving the uniformity of visual effect for local transparent display of solid color image, grayscale image and natural image, and involves low cost.

FIG. 2C shows a substrate 101 and a light shielding component LSC in a display substrate. The light shielding component LSC is shown in FIG. 2C to more clearly describe the first transparent pixel P1 and the second transparent pixel P2, and description of the other structures can refer to the description of FIG. 2B.

As shown in FIGS. 2B and 2C, in the embodiment of the present disclosure, the first pixel unit 10 and the second pixel unit 20 adjacent in the column direction are taken as a pixel group 100. The first display sub-region A1 does not include a transparent region. The condition where the first display sub-region A1 does not include a transparent region includes: the pixel group 100 does not include a transparent region, and no transparent region is included between adjacent pixel groups 100. In the pixel group 100 shown in FIG. 2B, a region where the first sub-pixel 1 and the second sub-pixel 2 of the first pixel unit 10 are located, and a region where the second sub-pixel 2 and the third sub-pixel 3 of the second pixel unit 20 are located, are light emitting regions. In the pixel group 100, except for the regions occupied by the first sub-pixel 1 and the second sub-pixel 2 of the first pixel unit 10 and the regions occupied by the second sub-pixel 2 and the third sub-pixel 3 of the second pixel unit 20, the rest regions are non-light emitting regions. For example, the rest non-light emitting regions can be provided with a light shielding component such as black matrix.

The pixel arrangement in the display substrate in FIGS. 2D-2L will be described below.

For example, in the display substrate provided by the embodiment of the present disclosure, as shown in FIGS. 2D-2G, at least part of the edges of the second display sub-region A2 coincide with at least part of the edges of the display region, and the rest part of the second display sub-region A2 is surrounded by the transition display sub-region A3. And the first display sub-region A1 is located on a side of the transition display sub-region A3 away from the second display sub-region A2. In this way, the second display sub-region A2 and the transition display sub-region A3 can be arranged at an edge of the display region. Optionally, the display region is substantially rectangular, for example, if the corners of the display region are all right angles, the display region is rectangular. Alternatively, if the corners of the display region are rounded angles (arc angles), the shape of the display region is substantially rectangular. Further, for example, the shape of the second display sub-region A2 can be set as a regular shape, for example, as shown in FIGS. 2D-2G, the second display sub-region A2 can be set to have a rectangular shape. The corners of the rectangular shape can also be rounded angles (arc angles). In other embodiments, the second display sub-region A2 can be set to have a trapezoidal shape. The corners of the trapezoidal shape can also be rounded angles (arc angles), or the second display sub-region A2 can be set to have a circular shape. Of course, the shape of the second display sub-region A2 can be set as an irregular shape. For example, the second display sub-region A2 can be set to have a water drop shape. Of course, in practical applications, the shape of the second display sub-region can be designed according to the shape of an element arranged in the second display sub-region, which is not limited here.

For example, in the display substrate provided by the embodiment of the present disclosure, the first display sub-region A1, the transition display sub-region A3, and the second display sub-region A2 can be arranged in the row direction. For example, the second display sub-region A2, the transition display sub-region A3, and the first display sub-region A1 can be arranged in an order from top to bottom. In this way, sensors such as a sensor (e.g., an infrared sensor, etc.) for face recognition can also be provided in a region where the second display sub-region A2 is located.

For example, in the display substrate provided by the embodiment of the present disclosure, the first display sub-region A1, the transition display sub-region A3, and the second display sub-region A2 can be arranged in the column direction. For example, the second display sub-region A2, the transition display sub-region A3, and the first display sub-region A1 can be arranged in an order from left to right. In this way, sensors such as a sensor (e.g., an infrared sensor, etc.) for face recognition can also be provided in a region where the second display sub-region A2 is located.

For example, in the display substrate provided by the embodiment of the present disclosure, the transition display sub-region A3 may be set to have a concave shape. For example, in the display substrate provided by the embodiment of the present disclosure, as shown in FIG. 2C, the transition display sub-region A3 is disposed to surround the second display sub-region A2, and the first display sub-region A1 is disposed to surround the transition display sub-region A2. In this way, the second display sub-region A2 and the transition display sub-region A3 can be disposed within the display region. Optionally, the shape of the second display sub-region A2 can be set as a circular or elliptical shape, and the shape of the transition display sub-region A3 can be set as an annular shape. Of course, in practical applications, the shape of the second display sub-region can be designed according to the shape of an element arranged in the second display sub-region, which is not limited here.

For example, in the display substrate provided by the embodiment of the present disclosure, in some embodiments, the first display sub-region A1, the transition display sub-region A3, and the second display sub-region A2 form a continuous display region, and the shape of the display region is substantially rectangular shape.

It should be noted that, the corners of the rectangular shape in the embodiment of the present disclosure can be right angles or can be rounded angles (arc angles), which is not limited here.

For example, in the display substrate provided by the embodiment of the present disclosure, the relative positional relationship and shapes of the first display sub-region and the second display sub-region are not specifically limited, and can be set according to the screen design of the display substrate. Taking a mobile phone as an example, the second display sub-region A2 can be disposed at a medium-upper position of the first display sub-region A1, or the second display sub-region A2 can be disposed in the middle of the first display sub-region A1, or the second display sub-region A2 can be disposed at an upper left corner of the first display sub-region A1, which is not limited here.

For example, in the display substrate provided by the embodiment of the present disclosure, as shown in FIG. 2C, the area of the transition display sub-region A3 can be smaller than the area of the second display sub-region A2, and the area of the second display sub-region A2 can be smaller than the area of the first display sub-region A1. Of course, in practical applications, the area of the second display sub-region can be designed according to an element arranged in the second display sub-region, which is not limited here.

For example, in the display substrate provided by the embodiment of the present disclosure, the pixel distribution density in the second display sub-region is determined according to the element to be disposed in the second display sub-region, and is not limited here. For example, taking that a camera is set in the second display sub-region as an example, when the pixel distribution density is too high, a good display effect can be ensured, but an imaging definition is affected; when the pixel distribution density is too low, a high imaging definition can be ensured, but the display effect is affected. For example, according to the current resolution capability of the display substrate, the pixel distribution density of the second display sub-region is generally not less than ¼ of the pixel distribution density of the first display sub-region. For example, the pixel distribution density of the second display sub-region is ½, ⅓ or ¼ of the pixel distribution density of the first display sub-region. Of course, when the resolution of the display substrate can be made higher, the ratio of the pixel distribution density of the second display sub-region to the pixel distribution density of the first display sub-region can be set smaller, which is not specifically limited here.

Generally, pixel units are arranged in a display region, and a plurality of sub-pixels are arranged in the pixel unit. In the embodiment of the present disclosure, a pixel refers to a combination of sub-pixels capable of independently displaying a pixel point, for example, a pixel may refer to a pixel unit. Optionally, in the display substrate provided by the embodiment of the present disclosure, as shown in FIGS. 2A, 2B and 2D-2L, a plurality of first pixel units 10 and a plurality of second pixel units 20 arranged adjacently are included in the first display sub-region A1. For example, the first pixel unit 10 includes a first sub-pixel 1 and a second sub-pixel 2; and the second pixel unit 20 includes a third sub-pixel 3 and a second sub-pixel 2. During display, the number of the pixels in the first display sub-region A1 is equal to the sum of the number of the first pixel units 10 and the number of the second pixel units 20. That is, the pixels in the first display sub-region A1 are arranged in a Pentile arrangement; and during display, the pixel units can achieve a resolution higher than the physical resolution by borrowing a sub-pixel in adjacent pixel units.

The second display sub-region A2 includes a plurality of third pixel units 30, and the third pixel unit 30 includes a first sub-pixel 1, a second sub-pixel 2, a third sub-pixel 3 arranged adjacently. During display, the number of the pixels in the second display sub-region A2 is equal to the number of the third pixel units 30. That is, the physical resolution of the pixels in the second display sub-region A2 is just the display resolution of the second display sub-region A2.

The transition display sub-region A3 includes a plurality of fourth pixel units 40, and the fourth pixel unit 40 includes a first sub-pixel 1, a second sub-pixel 2, and a third sub-pixel 3 arranged adjacently. During display, the number of the pixels in the transition display sub-region A3 is equal to the number of the fourth pixel units 40. That is, the physical resolution of the pixels in the transition display sub-region A3 is just the display resolution of the transition display sub-region A3.

For example, the first sub-pixel, the second sub-pixel and the third sub-pixel are generally one selected from the group consisting of a red sub-pixel, a green sub-pixel and a blue sub-pixel, respectively. Optionally, in the display substrate provided by the embodiment of the present disclosure, the second sub-pixel is a green sub-pixel, one of the first sub-pixel and the third sub-pixel is a red sub-pixel, and the other of the first sub-pixel and the third sub-pixel is a blue sub-pixel.

It should be noted that, in the display panel provided by the embodiment of the present disclosure, due to the spatial limitation of the edge of the display sub-region, the arrangement of sub-pixels in the first display sub-region, the arrangement of sub-pixels in the second display sub-region and the arrangement of sub-pixels in the transition display sub-region mainly refer to the arrangement of sub-pixels inside the display sub-regions, and the arrangement of some sub-pixels at the edge of the display region may be different from that of other regions, which is not limited here.

For example, in the display substrate provided by the embodiment of the present disclosure, the arrangement structure of the third pixel unit and the arrangement structure of the fourth pixel unit can be the same or different, which is not limited here.

Optionally, in the display substrate provided by the embodiment of the present disclosure, the arrangement structure of the third pixel unit and the arrangement structure of the fourth pixel unit are the same. On one hand, it is beneficial for a patterning process, and on the other hand, it is also beneficial for the overall layout of the display substrate.

Optionally, in the display substrate provided by the embodiment of the present disclosure, as shown in FIGS. 2D-2G, sub-pixels in the second display sub-region A2 and part of sub-pixels in the first display sub-region A1 can be located in a same row. Thus, it is equivalent to that the sub-pixels in the second display sub-region A2 correspond to the sub-pixels in the first display sub-region A1 in the row direction, and they are not staggered in rows or columns. In this way, during manufacturing, it is equivalent to removing part of sub-pixels in the second display sub-region A2 from the sub-pixel masks which are originally regularly arranged in the entire display region, and the manufacturing process is relatively easy to be realized.

Optionally, in the display substrate provided by the embodiment of the present disclosure, as shown in FIGS. 2D-2K, sub-pixels in the second display sub-region A2 and part of sub-pixels in the first display sub-region A1 can be located in a same column. Thus, it is equivalent to that the sub-pixels in the second display sub-region A2 correspond to the sub-pixels in the first display sub-region A1 in the column direction, and they are not staggered in rows or columns. In this way, during manufacturing, it is equivalent to removing part of sub-pixels in the second display sub-region A2 from the sub-pixel masks which are originally regularly arranged in the entire display region, and the manufacturing process is relatively easy to be realized.

Optionally, in the display substrate provided by the embodiment of the present disclosure, as shown in FIGS. 2D-2G, sub-pixels in the transition display sub-region A3 and part of sub-pixels in the first display sub-region A1 can be located in a same row. Thus, it is equivalent to that the sub-pixels in the transition display sub-region A3 correspond to the sub-pixels in the first display sub-region A1 in the row direction, and they are not staggered in rows or columns. In this way, during manufacturing, it is equivalent to removing part of sub-pixels in the transition display sub-region A3 from the sub-pixel masks which are originally regularly arranged in the entire display region, and the manufacturing process is relatively easy to be realized.

Optionally, in the display substrate provided by the embodiment of the present disclosure, as shown in FIGS. 2D-2K, sub-pixels in the transition display sub-region A3 and part of sub-pixels in the first display sub-region A1 can also be located in a same column. Thus, it is equivalent to that the sub-pixels in the transition display sub-region A3 correspond to the sub-pixels in the first display sub-region A1 in the column direction, and they are not staggered in rows or columns. In this way, during manufacturing, it is equivalent to removing part of sub-pixels in the transition display sub-region A3 from the sub-pixel masks which are originally regularly arranged in the entire display region, and the manufacturing process is relatively easy to be realized.

Figure 2D:
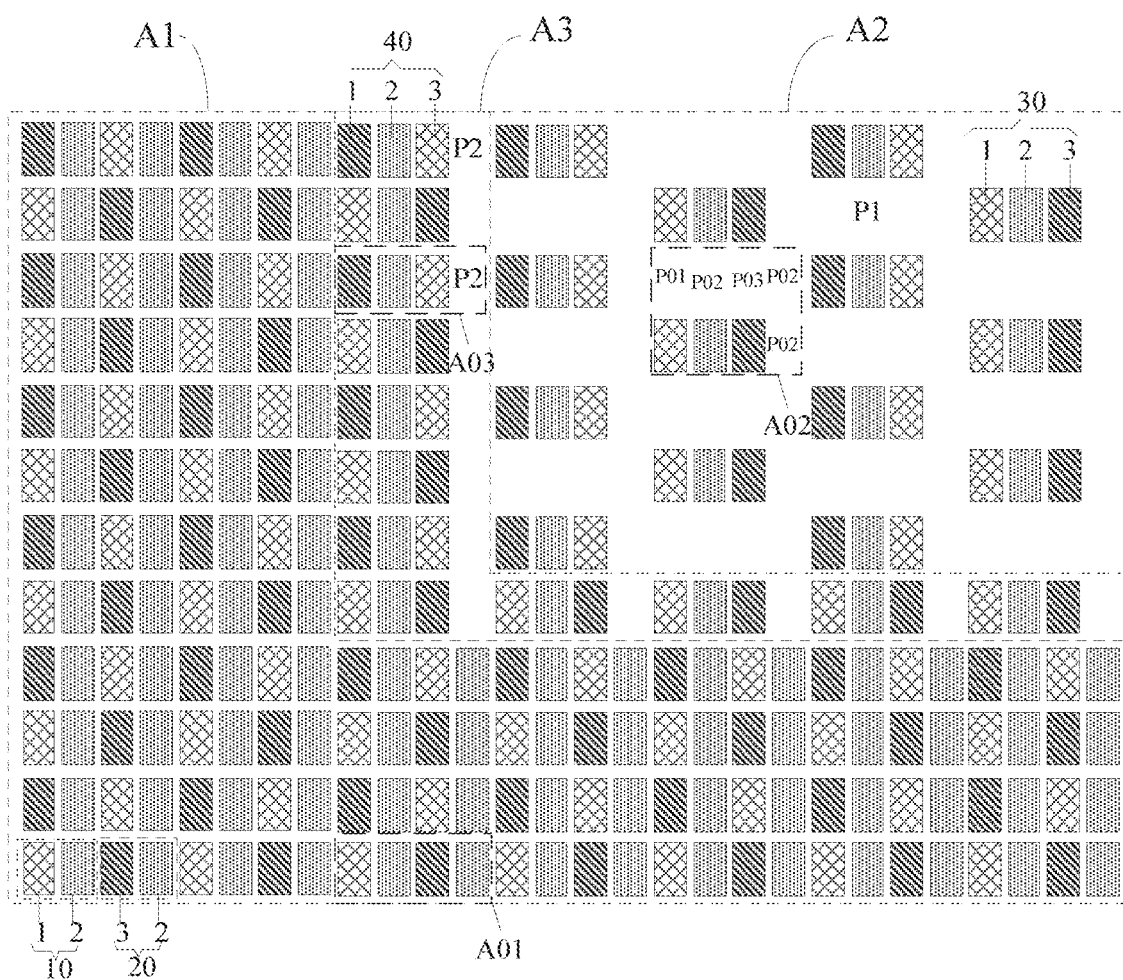

Optionally, it is equivalent to that the sub-pixels in the second display sub-region A2 and the sub-pixels in the transition display sub-region A3 correspond to the sub-pixels in the first display sub-region A1 in the row direction or in the column direction, instead of being staggered in rows or columns. In this way, during manufacturing, it is equivalent to removing part of sub-pixels in the second display sub-region A2 and part of sub-pixels in the transition display sub-region A3 from the sub-pixel masks which are originally regularly arranged in the entire display region, and the manufacturing process is relatively easy to be realized. For example, as shown in FIG. 2D, compared with the first display sub-region A1, the transition display sub-region A3 is equivalent to a region with half of the second sub-pixels 2 removed, so that the resolution of the transition display sub-region A3 is ½ of the resolution of the first display sub-region A1. Compared with the first display sub-region A1, the second display sub-region A2 is equivalent to a region with ¾ of the second sub-pixels 2, half of the first sub-pixels 1 and half of the third sub-pixels 3 removed, so that the resolution of the second display sub-region A2 is ¼ of the resolution of the first display sub-region A1.

For example, the width, that is, a preset width of the transition display sub-region can be specifically designed according to the display effect and the screen size of the display substrate. Optionally, the preset width can include a width of at least one fourth pixel unit in the first direction. The first direction can be one of a row direction and a column direction. For example, the preset width can include the width of at least one fourth pixel unit in the row direction. For example, because the existence of the transition display sub-region will sacrifice the resolution of the display substrate, the preset width will not be too large in general. Generally, the width of one fourth pixel unit in the row direction can realize the effect achievable by the present disclosure. Of course, when the screen size of the display substrate is large, the preset width can be set larger, for example, the preset width can be the width of a plurality of fourth pixel units in the row direction, which is not limited here. It should be noted that, the preset width can include at least the width of the fourth pixel units in the row direction and the gap between the fourth pixel units.

For example, the preset width can also include the width of at least one fourth pixel unit in the column direction. Further, the preset width is not too large in general. Generally, the width of one fourth pixel unit in the column direction can realize the effect achievable by the present disclosure. Of course, when the screen size of the display substrate is large, the preset width can be set larger, for example, the preset width can be the width of a plurality of fourth pixel units in the column direction, which is not limited here. It should be noted that, the preset width can include the width of at least one fourth pixel unit in the column direction and the gap between the fourth pixel units.

Figure 2E:
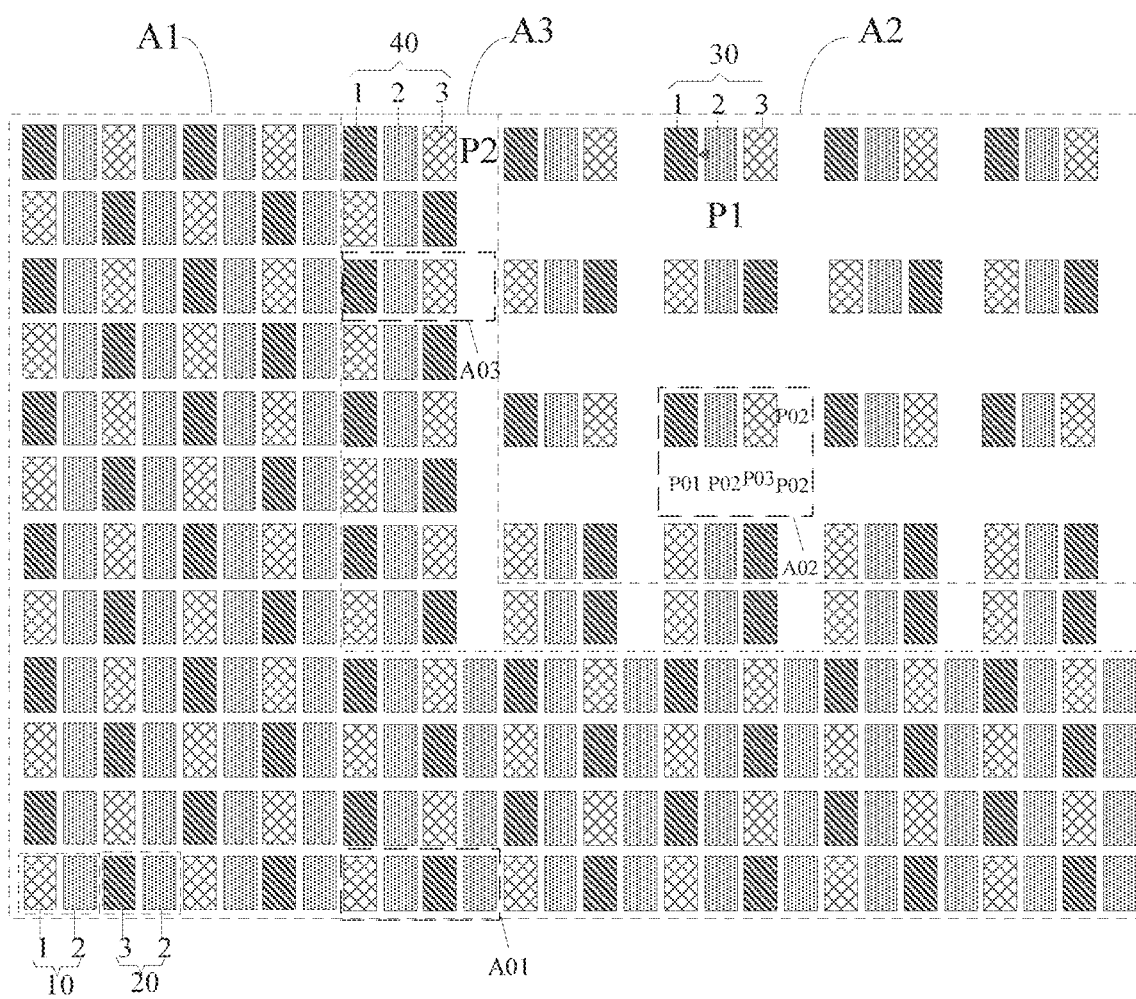
Figure 2F:
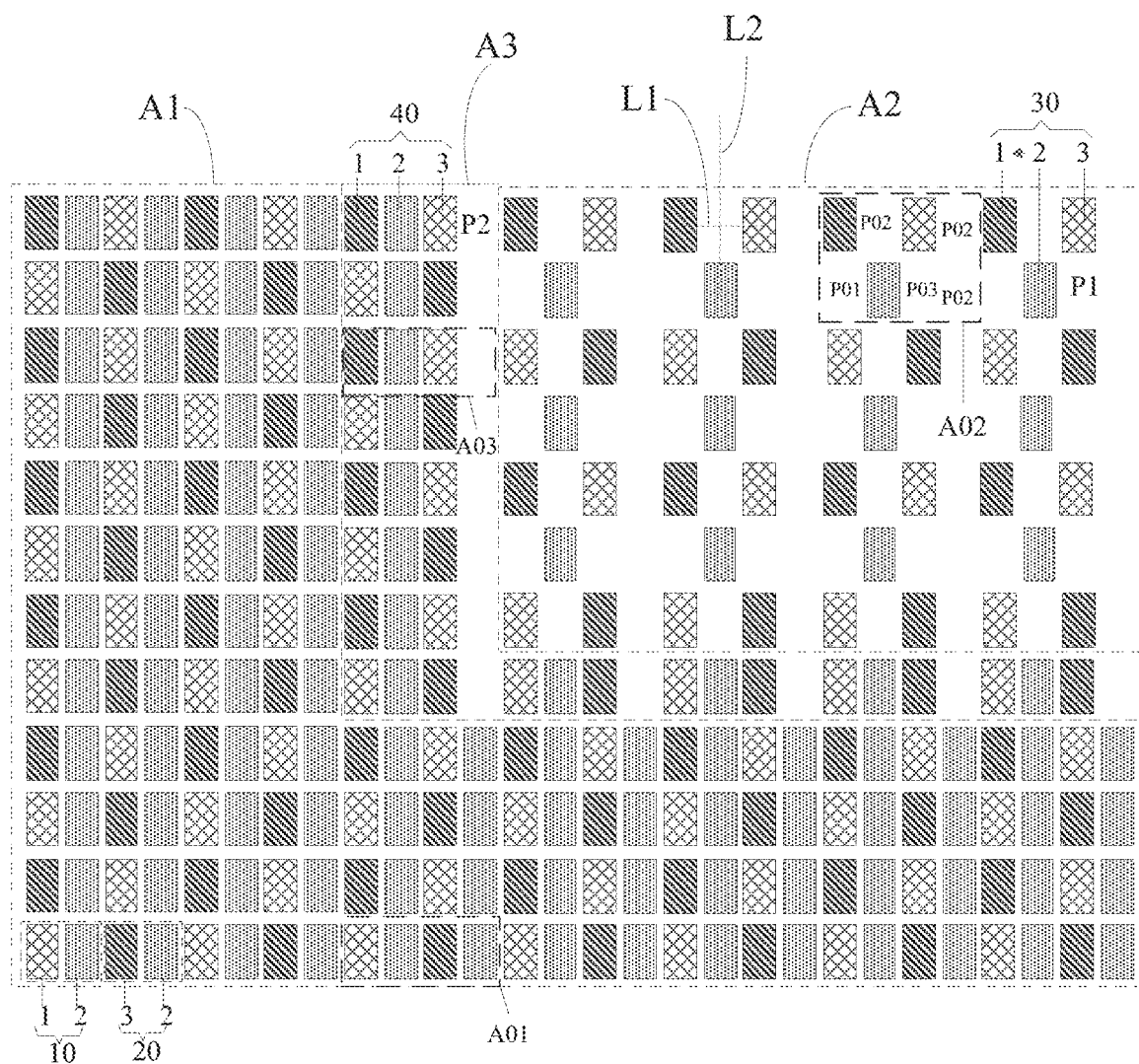
Figure 2G:
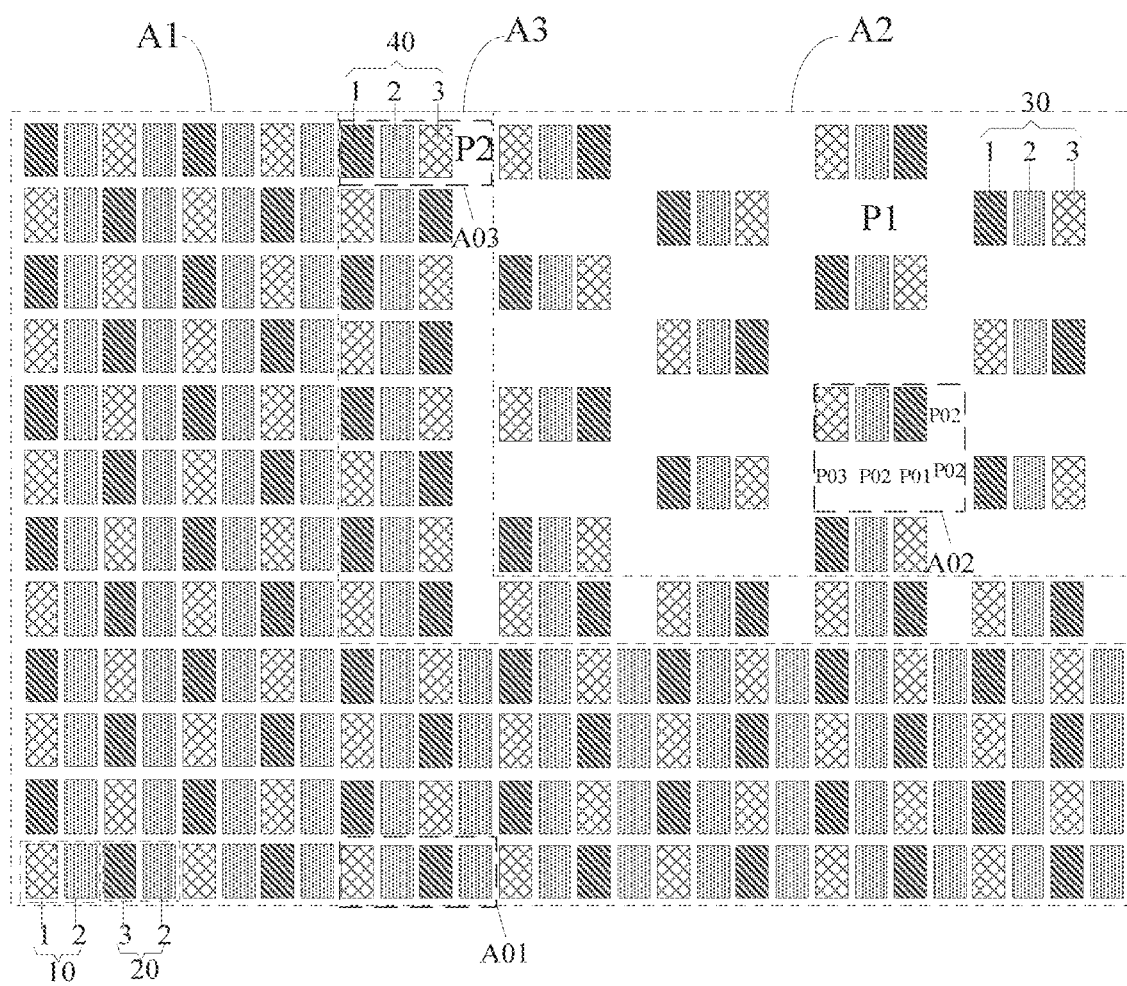
Figure 2H:
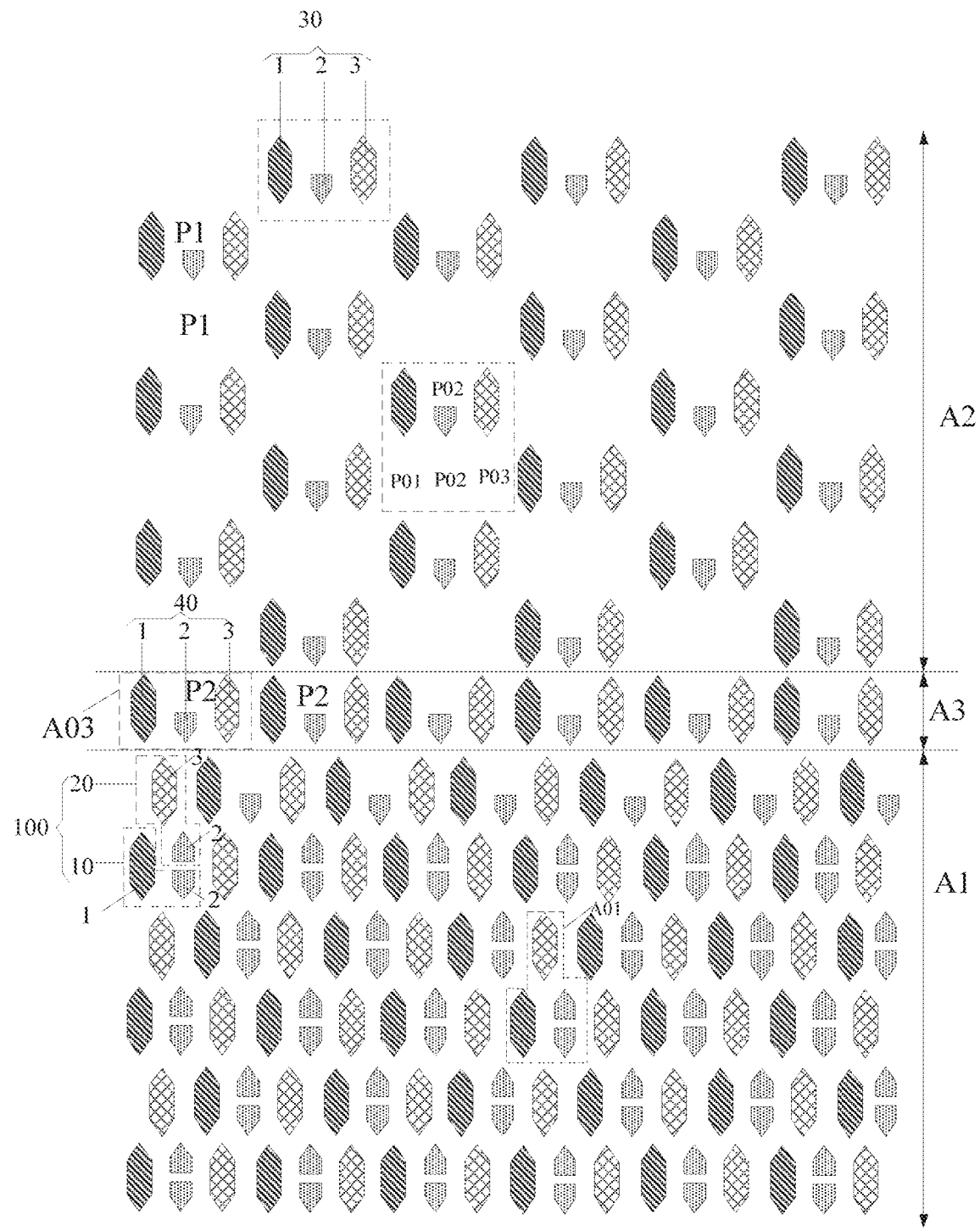

It should be noted that, in the display substrate provided by the embodiment of the present disclosure, the preset width can include at least one of a preset width in the row direction and a preset width in the column direction. The preset width in the row direction can be a width of the fourth pixel unit in the row direction; and the preset width in the column direction can be a width of the fourth pixel unit in the column direction. For example, as shown in FIGS. 2E-2G, the preset width of the transition display sub-region A3 in the row direction is the width of one fourth pixel unit 40 in the row direction; and the preset width of the transition display sub-region A3 in the column direction is the width of one fourth pixel unit 40 in the column direction. As shown in FIG. 2H, the preset width of the transition display sub-region A3 in the column direction is the width of one fourth pixel unit 40 in the column direction.

For example, in order to ensure the normal display of the second display sub-region, generally, the pixel distribution density of the second display sub-region cannot be too small. Optionally, the pixel distribution density of the second display sub-region can be set as ¼ of the pixel distribution density of the first display sub-region. Thus, the pixel distribution density of the transition display sub-region can be set as ½ of the pixel distribution density of the first display sub-region.

Of course, for example, in the case where the pixel distribution density of the second display sub-region considerably differs from the pixel distribution density of the first display sub-region, the pixel distribution density of the transition display sub-region can be gradually decreased along a direction pointing from the first display sub-region to the second display sub-region.

For example, from the perspective of the manufacturing process, the light emitting areas of the sub-pixels in the transition display sub-region are consistent with the light emitting areas of the sub-pixels in the first display sub-region. That is, in the display substrate provided by the embodiment of the present disclosure, as shown in FIGS.

2D-2K, the light emitting area of one first sub-pixel 1 in the transition display sub-region A3 is substantially the same as the light emitting area of one first sub-pixel 1 in the first display sub-region A1. The light emitting area of one second sub-pixel 2 in the transition display sub-region A3 is substantially the same as the light emitting area of one second sub-pixel 2 in the first display sub-region A1. The light emitting area of one third sub-pixel 3 in the transition display sub-region A3 is substantially the same as the light emitting area of one third sub-pixel 3 in the first display sub-region A1. In an actual process, due to limitations of process conditions or other factors such as the arrangement of wirings or vias, there may be some deviations, so any relationships between the light emitting areas of the sub-pixels that substantially satisfy the above conditions are feasible, which are within the scope of protection of the present disclosure.

For example, from the perspective of alleviating the dark stripes at the boundary of the second display sub-region, in the embodiment of the present invention, as shown in FIG. 11, in the case where the preset width includes the width of a plurality of fourth pixel units, in the display substrate provided by the embodiment of the present disclosure, the closer a fourth pixel unit 40 is to the first display sub-region A1, the larger the light emitting area of the sub-pixel of a same color in the fourth pixel unit 40 will be. In this way, by adjusting the light emitting areas of the sub-pixels, the brightness of the transition display sub-region can be gradually reduced along a direction pointing from the first display sub-region to the second display sub-region. As shown in FIG. 11, taking that the preset width includes the widths of three fourth pixel units and taking the first sub-pixel 1 as an example, the fourth pixel unit 40 of the third row is nearest to the first display sub-region A1, and the first sub-pixel 1 therein has a largest light emitting area; the fourth pixel unit 40 of the second row is farther from the first display sub-region A1, and the light emitting area of the first sub-pixel 1 therein is smaller than the light emitting area of the first sub-pixel 1 in the fourth pixel unit 40 of the third row; the fourth pixel unit 40 of the first row is farthest from the first display sub-region A1, and the first sub-pixel 1 therein has the smallest light emitting area. And the cases of the second sub-pixel 2 and the third sub-pixel 3 can be analogized, and details will not be described here.

For example, in the display substrate provided by the embodiment of the present disclosure, as shown in FIG. 11, the arrangement sequences of sub-pixels in two fourth pixel units 40 adjacent in the column direction in the transition display sub-region A3 are reversed. For example, taking the first column as an example, in the fourth pixel units 40 of the first row and the third row, the first sub-pixel, the second sub-pixel and the third sub-pixel are sequentially arranged from left to right, respectively; in the fourth pixel units 40 of the second row, the third sub-pixel, the second sub-pixel and the first sub-pixel are sequentially arranged from left to right.

For example, in the display substrate provided by the embodiment of the present disclosure, as shown in FIG. 11, the arrangement sequences of sub-pixels in two fourth pixel units 40 adjacent in the row direction in the transition display sub-region A3 are the same. For example, taking the first row as an example, in the fourth pixel units 40 of the first column and the second column, the first sub-pixel, the second sub-pixel and the third sub-pixel are sequentially arranged from left to right, respectively. Further, the arrangement sequence of sub-pixels in each fourth pixel unit 40 of each row can be made the same. For example, taking the first row as an example, in the fourth pixel units 40 of the first column to the sixth column, the first sub-pixel, the second sub-pixel and the third sub-pixel are sequentially arranged from left to right, respectively.

For example, in the display substrate provided by the embodiment of the present disclosure, the arrangement structure of the first sub-pixel, the second sub-pixel and the third sub-pixel in the fourth pixel unit can be the same as the arrangement structure of the first sub-pixel, the second sub-pixel and the third sub-pixel adjacently arranged in the first display sub-region, so as to facilitate the patterning process. Similarly, for example, in the display substrate provided by the embodiment of the present disclosure, the arrangement structure of the first sub-pixel, the second sub-pixel and the third sub-pixel in the third pixel unit can also be the same as the arrangement structure of the first sub-pixel, the second sub-pixel and the third sub-pixel adjacently arranged in the first display sub-region.

Optionally, in the display substrate provided by the embodiment of the present disclosure, as shown in FIGS. 2D-2L, in the transition display sub-region A3, the first sub-pixel 1, the second sub-pixel 2 and the third sub-pixel 3 in the fourth pixel unit 40 are arranged in a same row. Alternatively, they can be adjacently arranged in sequence in a same column, which is not limited here.

Optionally, in the display substrate provided by the embodiment of the present disclosure, the light emitting area of one first sub-pixel in the second display sub-region can be greater than or substantially equal to the light emitting area of one first sub-pixel in the first display sub-region. The light emitting area of one second sub-pixel in the second display sub-region is greater than or substantially equal to the light emitting area of one second sub-pixel in the first display sub-region. The light emitting area of one third sub-pixel in the second display sub-region is greater than or substantially equal to the light emitting area of one third sub-pixel in the first display sub-region.

For example, the pixel distribution density of the second display sub-region is less than that of the first display sub-region, so the brightness of the second display sub-region will be lower than that of the first display sub-region during display, thus there will be obvious dark stripes visible to human eyes at the boundary of the first display sub-region and the second display sub-region. Optionally, in order to mitigate the phenomenon of dark stripes, in the display substrate provided by the embodiment of the present disclosure, as shown in FIG. 2K, the light emitting area of one first sub-pixel 1 in the second display sub-region A2 can be made larger than the light emitting area of one first sub-pixel 1 in the first display sub-region A1; the light emitting area of one second sub-pixel 2 in the second display sub-region A2 can be made larger than the light emitting area of one second sub-pixel 2 in the first display sub-region A1; the light emitting area of one third sub-pixel 3 in the second display sub-region A2 can be made larger than the light emitting area of one third sub-pixel 3 in the first display sub-region A1. That is, the brightness difference between the second display sub-region A2 and the first display sub-region A1 is reduced by increasing the light emitting areas of the sub-pixels in the second display sub-region A2, thereby alleviating the dark stripes at the boundary between the second display sub-region A2 and the first display sub-region A1.

Of course, in the display substrate provided by the embodiment of the present disclosure, as shown in FIGS. 2D-2J, the light emitting area of one first sub-pixel 1 in the second display sub-region A2 can be substantially the same as the light emitting area of one first sub-pixel 1 in the first display sub-region A1; the light emitting area of one third sub-pixel 3 in the second display sub-region A2 can be substantially the same as the light emitting area of one third sub-pixel 3 in the first display sub-region A1. As shown in FIGS. 2D-2G, the light emitting area of one second sub-pixel 2 in the second display sub-region A2 is substantially the same as the light emitting area of one second sub-pixel 2 in the first display sub-region A1. Of course, a specific implementation for the light emitting areas described above can be designed and determined according to the actual application environment, which is not limited here.

Optionally, in the display substrate provided by the embodiment of the present disclosure, as shown in FIGS. 2E and 2F, the plurality of third pixel units 30 can be arranged in a matrix in the second display sub-region A2.

Optionally, in the display substrate provided by the embodiment of the present disclosure, as shown in FIGS. 2D and 2G-2L, the plurality of third pixel units 30 can be arranged in a checkerboard manner in the second display sub-region A2. That is, the plurality of third pixel units 30 are arranged in alternate columns in the row direction and are arranged in alternate rows in the column direction. For example, as shown in FIG. 2H, in odd rows, the third pixel units 30 are arranged in even columns; and in even rows, the third pixel units 30 are arranged in odd columns, so that the third pixel units 30 are uniformly distributed along the row direction and along the column direction, respectively, thereby ensuring uniform brightness in the second display sub-region A2. Moreover, it can also improve the transmittance of the pixel gap, can be convenient for a camera under the screen to take pictures, and can facilitate a sensor to receive an external environment signal. It may also be possible that, for example, in odd rows, the third pixel units 30 are arranged in odd columns; and in even rows, the third pixel units 30 are arranged in even columns, so that any two third pixel units are separated by a certain distance. The distance may be, for example, in the row direction, a length of at least one third pixel unit in the row direction; and in the column direction, a length of at least one third pixel unit in the column direction, which is not limited in the embodiment of the present disclosure.

Optionally, in the display substrate provided by the embodiment of the present disclosure, as shown in FIG. 2F, in the third pixel unit 30 of the second display sub-region A2, the first sub-pixel 1 and the third sub-pixel 3 are arranged in the same row, and the second sub-pixel 2 is located in a row adjacent to the row where the first sub-pixel 1 and the third sub-pixel 3 are located, so that the second sub-pixel 2 and the first sub-pixel 1 are arranged in staggered rows. For example, in a same third pixel unit 30, the first sub-pixel 1 and the third sub-pixel 3 are located in the first row, and the second sub-pixel 2 is located in the second row. In this way, lines of centers of the first sub-pixel, the second sub-pixel and the third sub-pixel in the same third pixel unit 30 can form a triangle. In this way, the occurrence of horizontal dark and bright stripes in the second display sub-region A2 can be avoided.

It should be noted that, in the display panel provided by the embodiment of the present disclosure, the center of a sub-pixel refers to the center of the light emitting region of the sub-pixel. Taking OLED display panel as an example, the sub-pixel generally includes a laminated structure composed of an anode layer, a light emitting layer, and a cathode layer, in which a light emitting region corresponding to the laminated structure during display is just the light emitting region of the sub-pixel. In this way, the area occupied by the light emitting region can be taken as the light emitting area. Of course, the light emitting area can also be, for example, the area occupied by an opening region defined by a pixel defining layer, which is not limited here.

Optionally, in the display substrate provided by the embodiment of the present disclosure, as shown in FIG. 2F, in a same third pixel unit 30, an orthographic projection of the center of the second sub-pixel 2 on the connecting line L1 between the center of the first sub-pixel 1 and the center of the third sub-pixel 3 is located between the center of the first sub-pixel 1 and the center of the third sub-pixel 3. For example, the orthographic projection of the center of the second sub-pixel 2 on the connecting line L1 between the center of the first sub-pixel 1 and the center of the third sub-pixel 3 is located at an intersection of the connecting line L1 and a straight line L2. Thus, in the third pixel unit 30, a distance between the center of the second sub-pixel 2 and the center of the first sub-pixel 1 can be made equal to a distance between the center of the second sub-pixel 2 and the center of the third sub-pixel 3, so that the three sub-pixels are arranged in an isosceles triangle, and the occurrence of vertical dark and bright stripes in the second display sub-region A2 can be avoided.

For example, the distance between the center of the second sub-pixel 2 and the center of the first sub-pixel 1 and the distance between the center of the second sub-pixel 2 and the center of the third sub-pixel 3 may not be exactly the same. In an actual process, due to limitations of process conditions or other factors such as the arrangement of wirings or vias, there may be some deviations, so any shape, position and relative positional relationship of each sub-pixel that substantially satisfy the above conditions are feasible, which are within the scope of protection of the present disclosure.

Optionally, in the display substrate provided by the embodiment of the present disclosure, as shown in FIGS. 2D, 2E and 2G-2L, in the second display sub-region A2, the first sub-pixel 1, the second sub-pixel 2, and the third sub-pixel 3 in the third pixel unit 30 are arranged in a same row. Alternatively, they can also be arranged in a same column, which is not limited here.

Of course, for example, in the display substrate provided in the embodiment of the present disclosure, as shown in FIGS. 2D, 2E and 2G-2L, in the third pixel unit 30, the first sub-pixel 1, the second sub-pixel 2, and the third sub-pixel 3 are sequentially arranged in a same row. For example, in the third pixel unit 30, the first sub-pixel 1, the second sub-pixel 2, and the third sub-pixel 3 are sequentially arranged from left to right in a same row. Alternatively, they can be arranged in sequence in a same column, which is not limited here. Further, as shown in FIGS. 2D, 2E and 2G-2L, in the third pixel unit 30, the first sub-pixel 1, the second sub-pixel 2, and the third sub-pixel 3 are sequentially and adjacently arranged in a same row. Alternatively, they can also be sequentially and adjacently arranged in a same column, which is not limited here.

Optionally, in the display substrate provided by the embodiment of the present disclosure, as shown in FIGS. 2E-2G and 2I-2L, in the second display sub-region A2, sub-pixels in two third pixel units 30 adjacent in the row direction are arranged in the same order in the row direction; and sub-pixels in two third pixel units 30 adjacent in the column direction are arranged in reversed orders in the row direction. Thus, it is ensured that the first sub-pixel 1 and the third sub-pixel 3 are alternately arranged in the column direction in the second display sub-region A2, so as to avoid the occurrence of color shift in the column direction. It should be noted that, the same arrangement order of sub-pixels in the two third pixel units 30 adjacent in the row direction can refer to that, the first sub-pixel 1, the second sub-pixel 2, and the third sub-pixel 3 in the two third pixel units 30 are all arranged in the same order. For example, as shown in FIG. 2E, taking the first row of third pixel units 30 as an example, in the row direction, the first sub-pixel 1, the second sub-pixel 2 and the third sub-pixel 3 in two adjacent third pixel units 30 are all sequentially arranged from left to right. For example, as shown in FIG. 2F, taking the first row of third pixel units 30 as an example, in the row direction, the first sub-pixel 1, the third sub-pixel 3 and the second sub-pixel 2 in two adjacent third pixel units 30 are all arranged in an inverted triangle.

For example, in the display substrate provided by the embodiment of the present disclosure, as shown in FIG. 2H, in the second display sub-region A2, the arrangement order of sub-pixels in each third pixel unit 30 can be the same. For example, as shown in FIG. 2H, the first sub-pixel 1, the second sub-pixel 2, and the third sub-pixel 3 in each third pixel unit 30 are sequentially arranged from left to right.

For example, in the display substrate provided by the embodiment of the present disclosure, as shown in FIGS. 2D and 2K, in the second display sub-region A2, the arrangement orders of sub-pixels in the third pixel units 30 of the same column are the same, and the arrangement orders of sub-pixels in the third pixel units 30 of two adjacent columns are reversed. For example, as shown in FIG. 2D, the third sub-pixel 3, the second sub-pixel 2, and the first sub-pixel 1 in each of the third pixel units 30 in the first column and the third column are sequentially arranged from left to right. The first sub-pixel 1, the second sub-pixel 2, and the third sub-pixel 3 in each of the third pixel units 30 in the second column and the fourth column are sequentially arranged from left to right.

Optionally, in the display substrate provided by the embodiment of the present disclosure, as shown in FIGS. 2D-2L, in the first display sub-region, the arrangement orders of sub-pixels in the first pixel units 10 are the same; and the arrangement orders of sub-pixels in the second pixel units 20 are the same. For example, as shown in FIGS. 2D-2G, the first sub-pixel 1 and the second sub-pixel 2 in each first pixel unit 10 are sequentially arranged from left to right; and the third sub-pixel 3 and the second sub-pixel 2 in each second pixel unit 20 are sequentially arranged from left to right. As shown in FIGS. 2H-2L, the first sub-pixel 1 and the second sub-pixel 2 in each first pixel unit 10 are sequentially arranged from left to right; and the third sub-pixel 3 and the second sub-pixel 2 in each second pixel unit 20 are sequentially arranged from top left to bottom right.

Optionally, in the display substrate provided by the embodiment of the present disclosure, as shown in FIGS. 2D-2L, the first pixel unit 10 and the second pixel unit 20 in the first display sub-region A1 can be arranged in any kind of Pentile arrangements, which is not limited here.

Optionally, in the display substrate provided by the embodiment of the present disclosure, as shown in FIGS. 2D-2L, in the first display sub-region A1, the first pixel unit 10 and the second pixel unit 20 are alternately arranged in the column direction; and the first pixel unit 10 and the second pixel unit 20 are alternately arranged in the row direction.

Optionally, in the display substrate provided by the embodiment of the present disclosure, as shown in FIGS. 2D-2G, the second sub-pixel 2 and the first sub-pixel 1 in the first pixel unit 10 are arranged in a same row; the second sub-pixel 2 and the third sub-pixel 3 in the second pixel unit 20 are arranged in a same row. And for the first pixel unit 10 and the second pixel unit 20 adjacent in the row direction, the second sub-pixel 2 in the first pixel unit 10 is not directly adjacent to the second sub-pixel 2 in the second pixel unit 20. For example, for the first pixel unit 10 and the second pixel unit 20 adjacent in the row direction, the first sub-pixel 1 and the second sub-pixel 2 in the first pixel unit 10 are sequentially arranged from left to right, and the third sub-pixel 3 and the second sub-pixel 2 in the second pixel unit 20 are sequentially arranged from left to right.

Optionally, in the display substrate provided by the embodiment of the present disclosure, as shown in FIGS. 2D-2G, in the first display sub-region A1, the light emitting area of one first sub-pixel 1, the light emitting area of one second sub-pixel 2, and the light emitting area of one third sub-pixel 3 are approximately the same.

Optionally, in the display substrate provided by the embodiment of the present disclosure, as shown in FIGS. 2H-2L, in the first display sub-region A1, the second sub-pixel 2 and the first sub-pixel 1 in the first pixel unit 10 are arranged in a same row; the second sub-pixel 2 and the third sub-pixel 3 in the second pixel unit 20 are staggered in rows and staggered in columns; and in the first pixel unit 10 and the second pixel unit 20 adjacent in the row direction, the two second sub-pixels 2 are not adjacent. Moreover, taking the first pixel unit 10 and the second pixel unit 20 adjacent in the column direction as a pixel group 100, in the same pixel group 100, the second sub-pixel 2 in the first pixel unit 10 and the second sub-pixel 2 in the second pixel unit 20 are located in the same column. That is, two adjacent rows of pixel units are staggered by half a column in the column direction.

Optionally, in the display substrate provided by the embodiment of the present disclosure, as shown in FIGS. 2H-2L, in the first display sub-region A1, the light emitting area of one second sub-pixel 2 is smaller than the light emitting area of one first sub-pixel 1; and the light emitting area of one second sub-pixel 2 is smaller than the light emitting area of one third sub-pixel 3. This is because that, in the first display sub-region A1, the number of the first sub-pixels 1 is the same as the number of the third sub-pixels 3; and the number of the second sub-pixels 2 is twice the number of the first sub-pixels 1, so that the light emitting areas of the second sub-pixels 2 can be made small. Further, in a same pixel group 100, the two second sub-pixels 2 can be arranged symmetrically with respect to the row direction. That is, the two second sub-pixels 2 in the same pixel group 100 are arranged in a mirror configuration. Further, in the first display sub-region A1, in the case where the second sub-pixel 2 is a green sub-pixel, the light emitting areas of the two second sub-pixels 2 are both smaller than the light emitting area of one first sub-pixel 1, and the light emitting areas of the two second sub-pixels 2 are both smaller than the light emitting area of one third sub-pixel 3, because the light emitting efficiency of the green sub-pixel is higher than that of other color sub-pixels.

For example, in the display substrate provided in the embodiment of the present disclosure, in the first display sub-region, the shapes of the first sub-pixel, the second sub-pixel and the third sub-pixel are not limited, and may be regular shapes or irregular shapes. For example, in general, a regular shape is relatively easy to be realized from the technological point of view.

For example, in the display substrate provided by the embodiment of the present disclosure, in the transition display sub-region, the shapes of the first sub-pixel, the second sub-pixel and the third sub-pixel are not limited, and may be regular shapes or irregular shapes. For example, in general, a regular shape is relatively easy to be realized from the technological point of view.

For example, in the display substrate provided in the embodiment of the present disclosure, in the second display sub-region, the shapes of the first sub-pixel, the second sub-pixel and the third sub-pixel are not limited, and may be regular shapes or irregular shapes. For example, in general, a regular shape is relatively easy to be realized from the technological point of view.

Optionally, in the display substrate provided by the embodiment of the present disclosure, as shown in FIGS. 2D-2J and 2L, in at least one sub-region selected from the group consisting of the first display sub-region A1, the transition display sub-region A3 and the second display sub-region A2, the shapes of the first sub-pixels 1 or the shapes of the third sub-pixels 3 are substantially the same. For example, the shapes of the first sub-pixels 1 and the shapes of the third sub-pixels 3 in the first display sub-region A1 can be substantially the same. The shapes of the first sub-pixels 1 in the first display sub-region A1 can also be substantially the same. The shapes of the third sub-pixels 3 in the first display sub-region A1 can also be substantially the same. The shapes of the first sub-pixels 1 in the transition display sub-region A3 can also be substantially the same. The shapes of the third sub-pixels 3 in the transition display sub-region A3 can also be substantially the same. The shapes of the first sub-pixels 1 and the third sub-pixels 3 in the transition display sub-region A3 can also be substantially the same. The shapes of the first sub-pixels 1 and the third sub-pixels 3 in the second display sub-region A2 can also be substantially the same. The shapes of the first sub-pixels 1 in the second display sub-region A2 can also be substantially the same. The shapes of the third sub-pixels 3 in the second display sub-region A2 can also be substantially the same. The shapes of the first sub-pixels 1 in the transition display sub-region A3 can also be substantially the same as the shapes of the first sub-pixels 1 in the first display sub-region A1. The shapes of the third sub-pixels 3 in the transition display sub-region A3 can also be substantially the same as the shapes of the third sub-pixels 3 in the first display sub-region A1. The shapes of the first sub-pixels 1 and the third sub-pixels 3 in the transition display sub-region A3 can also be substantially the same as the shapes of the first sub-pixels 1 and the third sub-pixels 3 in the first display sub-region A1. The rest sub-pixels can be arranged in the same way, and details will not be repeated here.

Optionally, in the display substrate provided by the embodiment of the present disclosure, as shown in FIGS. 2D-2I, the shape of the second sub-pixel 2 in at least one of the second display sub-region A2 and the transition display sub-region A3 is substantially the same as the shape of the second sub-pixel 2 in the first display sub-region A1. For example, the shape of the second sub-pixel 2 in the second display sub-region A2 can be substantially the same as the shape of the second sub-pixel 2 in the first display sub-region A1. The shape of the second sub-pixel 2 in the transition display sub-region A3 can also be substantially the same as the shape of the second sub-pixel 2 in the first display sub-region A1. The shapes of the second sub-pixels 2 in the second display sub-region A2 and in the transition display sub-region A3 can both be substantially the same as the shape of the second sub-pixel 2 in the first display sub-region A1.

Optionally, in the display substrate provided by the embodiment of the present disclosure, as shown in FIGS. 2D-2G, in at least one sub-region selected from the group consisting of the first display sub-region A1, the transition display sub-region A3, and the second display sub-region A2, the shapes of the first sub-pixel 1, the second sub-pixel 2, and the third sub-pixel 3 can be substantially the same. For example, in the first display sub-region A1, the shapes of each first sub-pixel 1, each second sub-pixel 2, and each third sub-pixel 3 can be substantially the same. Alternatively, in the second display sub-region A2, the shapes of each first sub-pixel 1, each second sub-pixel 2, and each third sub-pixel 3 can also be substantially the same. Alternatively, in the transition display sub-region A3, the shapes of each first sub-pixel 1, each second sub-pixel 2, and each third sub-pixel 3 can also be substantially the same. Alternatively, in the first display sub-region A1, the transition display sub-region A3, and the second display sub-region A2, the shapes of the first sub-pixel 1, the second sub-pixel 2, and the third sub-pixel 3 can be substantially the same.

It should be noted that, taking that the shapes of each first sub-pixel 1, each second sub-pixel 2, and each third sub-pixel 3 in a same sub-region are substantially the same as an example, the shapes of the three sub-pixels are substantially the same, but the light emitting areas of the three sub-pixels can be different. For example, as shown in FIGS. 2J and 2L, in the second display sub-region A2, the light emitting area of the second sub-pixel 2 is smaller than the light emitting area of the first sub-pixel 1; and the light emitting area of the second sub-pixel 2 is smaller than the light emitting area of the third sub-pixel 3. Moreover, in practical applications, for example, the setting may be made according to an implementation in which the light emitting area of the blue sub-pixel is larger than the light emitting area of the red sub-pixel and the light emitting area of the red sub-pixel is larger than the light emitting area of the green sub-pixel, or the light emitting area of the blue sub-pixel is larger than the light emitting area of the green sub-pixel and the light emitting area of the green sub-pixel is larger than the light emitting area of the red sub-pixel, which is not limited here.

Of course, the shapes of sub-pixels in different display sub-regions can also be different, which is not limited here.

Optionally, in the display substrate provided by the embodiment of the present disclosure, the shape of the first sub-pixel can be at least one of a rectangle and a hexagon. For example, as shown in FIGS. 2D-2G, the shape of the first sub-pixel 1 in each display sub-region is a rectangle. Alternatively, as shown in FIGS. 2H-2J and FIG. 2L, the shape of the first sub-pixel 1 in each display sub-region can be a hexagon. Alternatively, as shown in FIG. 2K, the shapes of the first sub-pixels 1 in the first display sub-region A1 and the transition display sub-region A3 are hexagons, and the shape of the first sub-pixel 1 in the second display sub-region A2 is a rectangle. Of course, the shape of the first sub-pixel can also be a rounded pattern, or an elliptical shape, etc., which is not limited here.

Optionally, in the display substrate provided by the embodiment of the present disclosure, as shown in FIGS. 2H-2L, in the first display sub-region A1, the shapes of the first sub-pixel 1 and the third sub-pixel 3 are both hexagons; and the shape of a combination of the two second sub-pixels 2 is one hexagon.

It should be noted that, in the display panel provided by the embodiment of the present disclosure, the shape of the sub-pixel can refer to the shape of the light emitting region of the sub-pixel. Of course, the shape of the sub-pixel can be designed and determined according to the actual application environment, which is not limited here.

Optionally, in the display substrate provided by the embodiment of the present disclosure, as shown in FIGS.

2H-2J, in the second display sub-region A2, in the case where the second sub-pixel 2 is a green sub-pixel, the light emitting area of the second sub-pixel 2 is smaller than the light emitting area of the first sub-pixel 1, and the light emitting area of the second sub-pixel 2 is smaller than the light emitting area of the third sub-pixel 3.

Optionally, in the display substrate provided by the embodiment of the present disclosure, as shown in FIGS. 2H-2L, the shape of the first sub-pixel 1 in the transition display sub-region A3 is consistent with the shape of the first sub-pixel 1 in the first display sub-region A1; the shape of the second sub-pixel 2 in the transition display sub-region A3 is consistent with the shape of the second sub-pixel 2 in the first display sub-region A1; and the shape of the third sub-pixel 3 in the transition display sub-region A3 is consistent with the shape of the third sub-pixel 3 in the first display sub-region A1.

Optionally, in the display substrate provided by the embodiment of the present disclosure, as shown in FIGS. 2H-2L, in the transition display sub-region A3, in the case where the second sub-pixel 2 is a green sub-pixel, the light emitting area of the second sub-pixel 2 is smaller than the light emitting area of the first sub-pixel 1, and the light emitting area of the second sub-pixel 2 is smaller than the light emitting area of the third sub-pixel 3.

For example, the first transparent pixel P1 in the second display sub-region A2 in FIGS. 2D and 2E can refer to the related description of FIGS. 1C and 1D; the first transparent pixel P1 in the second display sub-region A2 in FIG. 2F can refer to the related description of FIG. 1E; and the first transparent pixel P1 in the second display sub-region A2 in FIG. 2G can refer to the related description of FIG. 1F, and details will not be described here again.

For example, as shown in FIGS. 2H to 2L, in the second display sub-region A2, except for the third pixel unit 30 at an edge position, each third pixel unit 30 is provided with totally four first transparent pixels P1 on both sides thereof in the row direction and the column direction. For example, as shown in FIGS. 2H-2L, in the second display sub-region A2, the plurality of first transparent pixels P1 are arranged in a checkerboard manner.

Figure 2I:
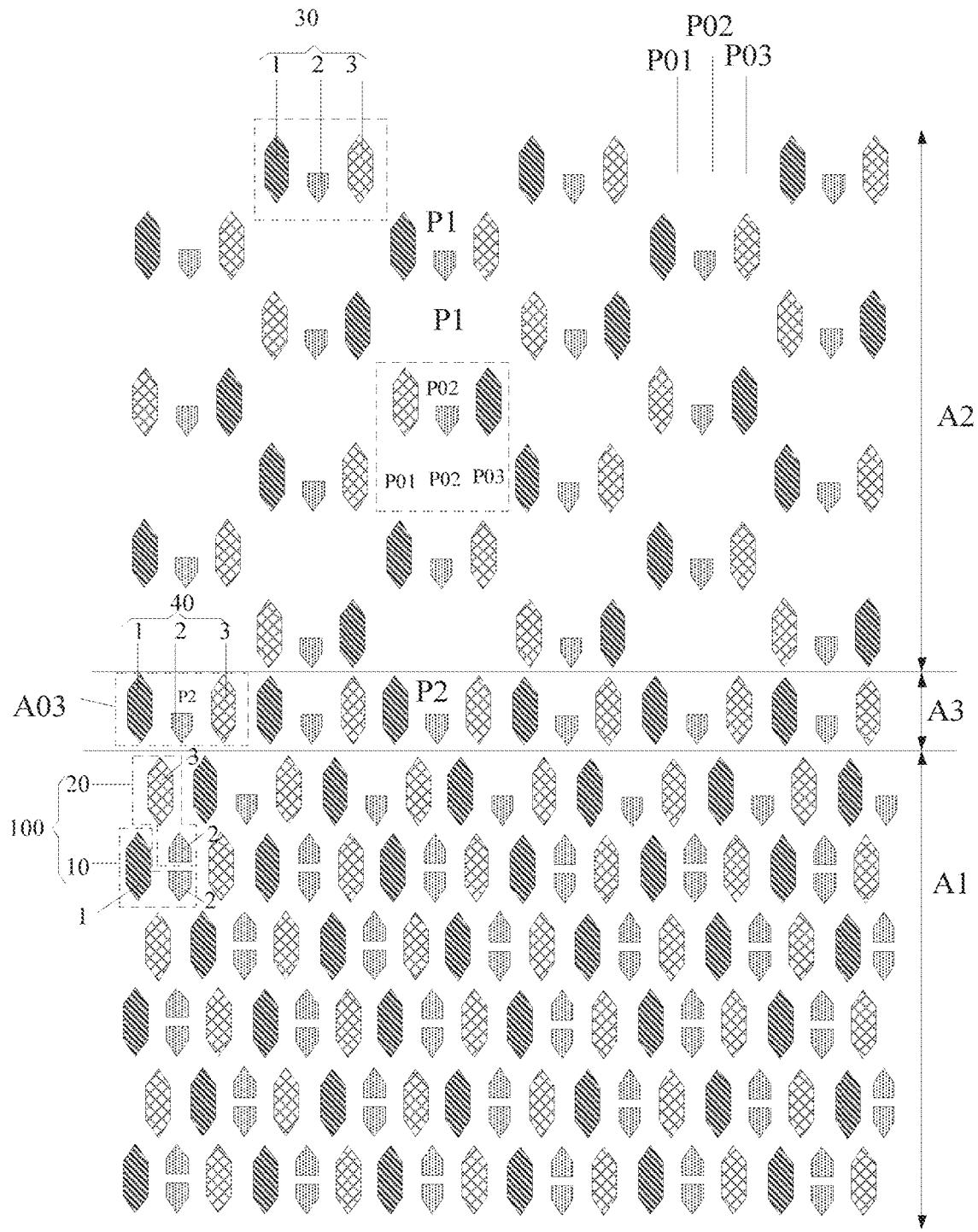
Figure 2J:
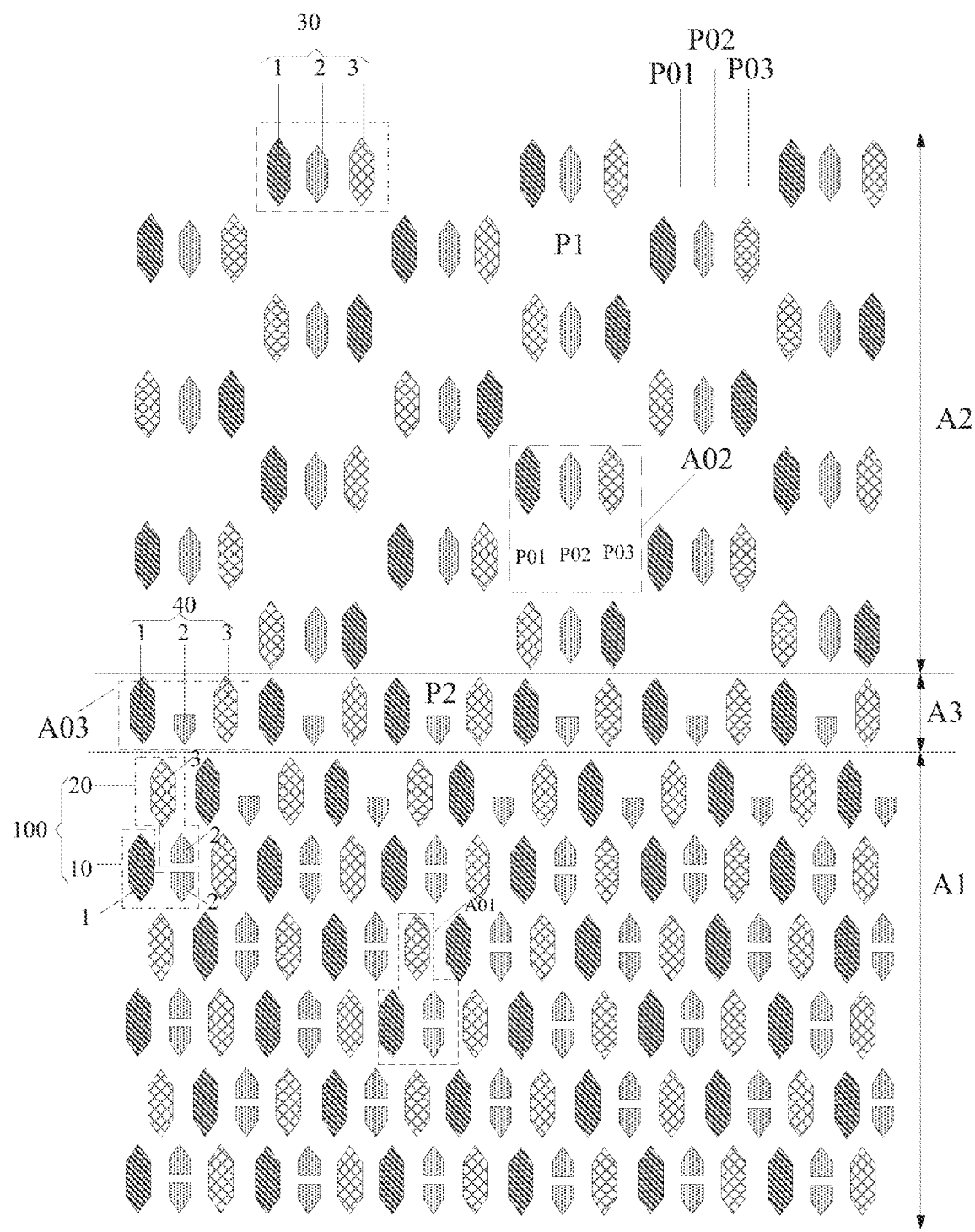
Figure 2K:
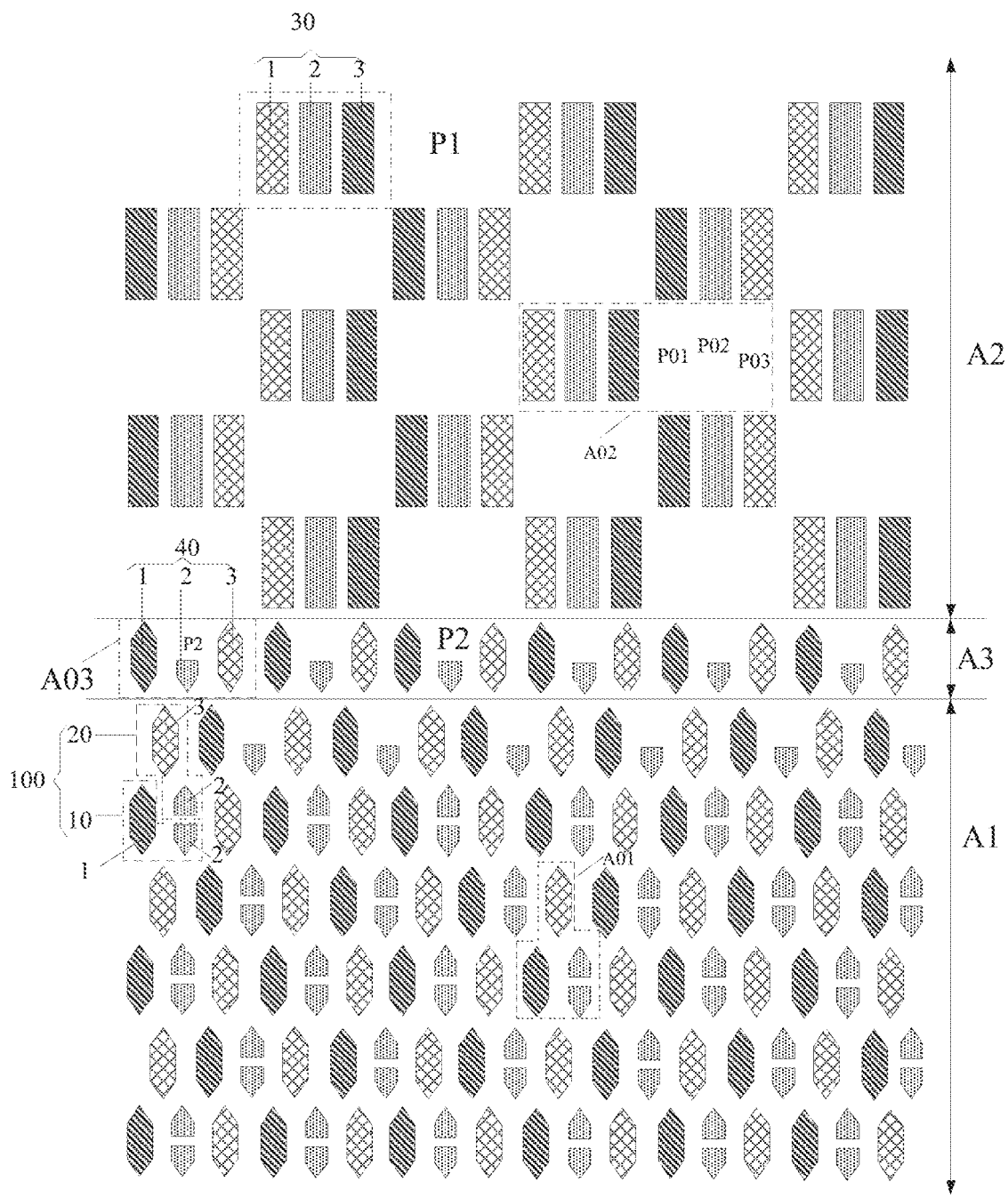
Figure 2L:
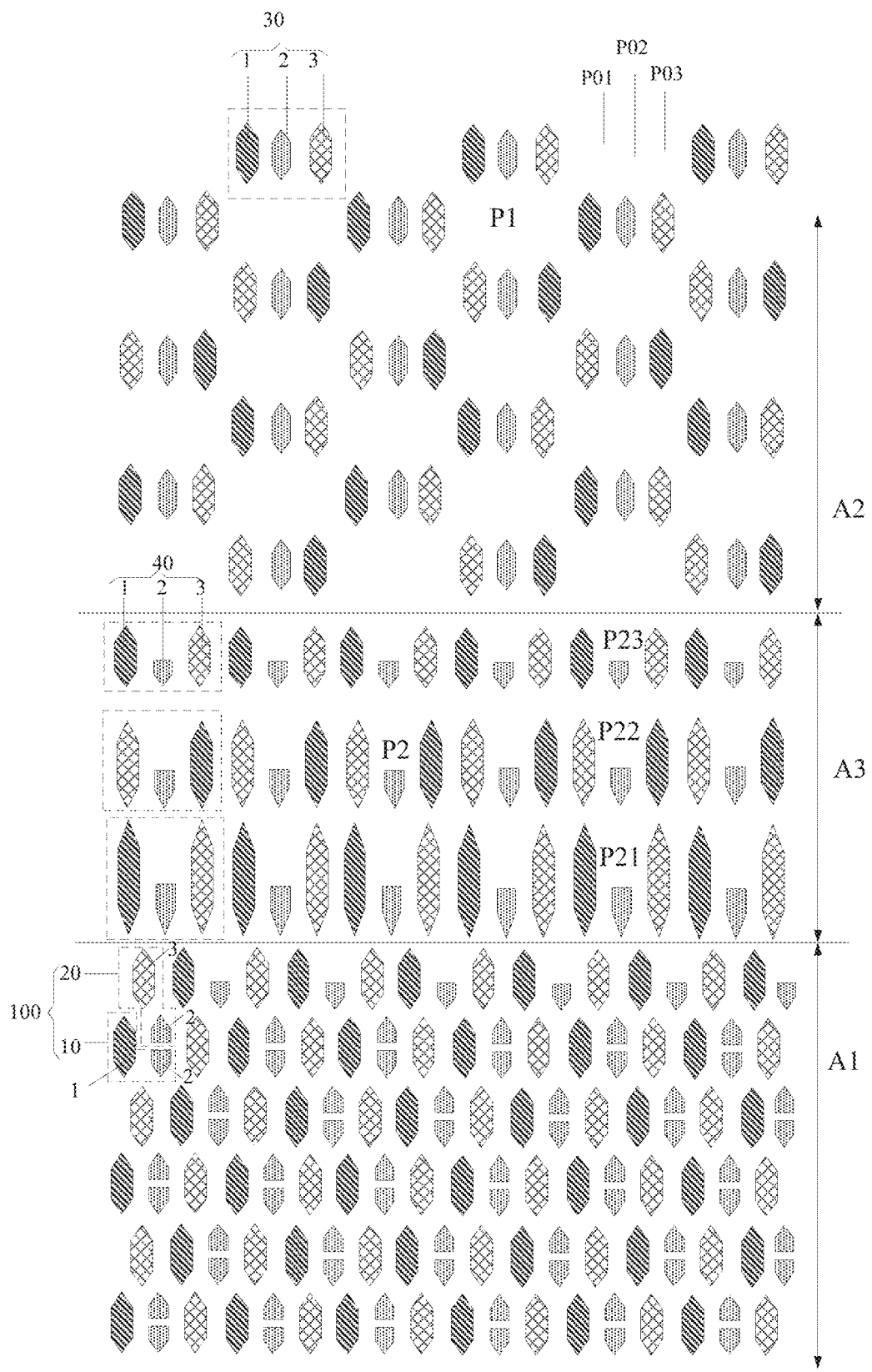

For example, as shown in FIGS. 2H-2I, each first transparent pixel P1 includes one first transparent sub-pixel P01, two second transparent sub-pixels P02, and one third transparent sub-pixel P03.

For example, as shown in FIGS. 2J-2L, each first transparent pixel P1 includes one first transparent sub-pixel P01, one second transparent sub-pixel P02, and one third transparent sub-pixel P03.

For example, as shown in FIGS. 2H-2I and 2L, the first transparent sub-pixel P01 and the first sub-pixel 1 in the first display sub-region A1 have the same area and shape; the second transparent sub-pixel P02 and the second sub-pixel 2 in the first display sub-region A1 have the same area and shape; and the third transparent sub-pixel P03 and the third sub-pixel 3 in the first display sub-region A1 have the same area and shape.

For example, as shown in FIG. 2J, the first transparent sub-pixel P01 and the first sub-pixel 1 in the first display sub-region A1 have the same area and shape; the third transparent sub-pixel P03 and the third sub-pixel 3 in the first display sub-region A1 have the same area and shape; and the area of the second transparent sub-pixel P02 is greater than the area of the second sub-pixel 2 in the first display sub-region A1.

For example, as shown in FIG. 2K, the area of the first transparent sub-pixel P01 is greater than the area of the first sub-pixel 1 in the first display sub-region A1; the area of the second transparent sub-pixel P02 is greater than the area of the second sub-pixel 2 in the first display sub-region A1; and the area of the third transparent sub-pixel P03 is greater than the area of the third sub-pixel 3 in the first display sub-region A1.

The first transparent pixel P1 and the second transparent pixel P2 in FIGS. 2D-2L will be described below.

For example, as shown in FIGS. 2D-2L, the third repeating region A03 includes a fourth pixel unit 30 and a second transparent pixel P2. For example, as shown in FIGS. 2D-2L, in the transition display sub-region A3, the areas of the plurality of second transparent pixels P2 are the same, but are not limited thereto.

For example, as shown in FIGS. 2D-2L, the area of the second transparent pixel P2 is smaller than the area of the first transparent pixel P1. For example, the distribution density of the second transparent pixel P2 is less than the distribution density of the first transparent pixel P1.

For example, as shown in FIG. 2L, the areas of the plurality of second transparent pixels P2 may not be the same. The plurality of second transparent pixels P2 include a first portion P21, a second portion P22, and a third portion P23 that are sequentially arranged in a direction pointing from a position close to the first display sub-region A1 to a position close to the second display sub-region A2; and the areas of the first portion P21, the second portion P22, and the third portion P23 are sequentially reduced. The area of each of the first portion P21, the second portion P22, and the third portion P23 is greater than the area of the second transparent sub-pixel P02 located in the second display sub-region A2. Of course, in other embodiments, the plurality of second transparent pixels P2 can also include two portions that are sequentially arranged from a position close to the first display sub-region A1 to a position close to the second display sub-region A2, i.e., a first portion P21 and a second portion P22; and the areas of the first portion P21 and the second portion P22 are sequentially reduced. The area of each of the first portion P21 and the second portion P22 is greater than the area of the second transparent sub-pixel P02 located in the second display sub-region A2.

For example, as shown in FIGS. 1C, 1D, 1F-1I, 1K-1M, 2B, 2D, 2E and 2G-2L, a plurality of first transparent pixels P1 are disposed on both sides of the third pixel unit 30 in both of row direction and column direction. Therefore, the light transmission can be made uniform. On the other hand, this arrangement manner also enables a plurality of third pixel units 30 to be disposed on both sides of each first transparent pixel P1 in both of row direction and column direction, thereby enabling uniform light emission, that is, uniform display. For example, four first transparent pixels P1 are disposed on both sides of the third pixel unit 30 in both of row direction and column direction, respectively. For example, four third pixel units 30 are disposed on both sides of each first transparent pixel P1 in both of row direction and column direction.

For example, as shown in FIGS. 1E, 1O, 2F and 1P-1S, a plurality of first transparent pixels P1 are disposed on both sides of at least one selected from the group consisting of the first sub-pixel 1, the second sub-pixel 2 and the third sub-pixel 3 in the third pixel unit 30, in both of row direction and column direction, so as to make the light transmission and the display uniform. Therefore, the first transparent pixels P1 are uniformly distributed at four positions of upper, lower, left and right positions of the third pixel unit 30.

For example, as shown in FIGS. 1F-1O, 2D-2G, 2H-2J and 2L, sub-pixels in the second display sub-region A2 and part of sub-pixels in the first display sub-region A1 are located in a same column. Therefore, in the manufacturing process of the display substrate, a mask can be shared to the greatest extent, and the cost is saved. Of course, in the case where the shapes of the sub-pixels in the second display sub-region A2 are different from the shapes of the sub-pixels in the first display sub-region A1, the sub-pixels in the second display sub-region A2 and the sub-pixels in the first display sub-region A1 can be manufactured by using different masks.

For example, as shown in FIGS. 1B-1E, 1M-1O and 2D-2G, sub-pixels in the second display sub-region and part of sub-pixels in the first display sub-region are located in a same row. Therefore, in the manufacturing process of the display substrate, a mask can be shared to the greatest extent, and the cost is saved. Of course, in the case where the shapes of the sub-pixels in the second display sub-region A2 are different from the shapes of the sub-pixels in the first display sub-region A1, the sub-pixels in the second display sub-region A2 and the sub-pixels in the first display sub-region A1 can be manufactured by using different masks.

For example, as shown in FIGS. 2D-2G, 2H-2J and 2L, sub-pixels in the transition display sub-region A3 and part of sub-pixels in the first display sub-region A1 are located in a same row. Therefore, in the manufacturing process of the display substrate, a mask can be shared to the greatest extent, and the cost is saved.

For example, as shown in FIGS. 2D-2G, sub-pixels in the transition display sub-region A3 and part of sub-pixels in the first display sub-region A1 are located in a same column. Therefore, in the manufacturing process of the display substrate, a mask can be shared to the greatest extent, and the cost is saved.

For example, the sub-pixels in the first display sub-region A1 include at least one selected from the group consisting of the first sub-pixel 1, the second sub-pixel 2, and the third sub-pixel 3; the sub-pixels in the second display sub-region A2 include at least one selected from the group consisting of the first sub-pixel 1, the second sub-pixel 2, and the third sub-pixel 3; the sub-pixels in the transition display sub-region A3 include at least one selected from the group consisting of the first sub-pixel 1, the second sub-pixel 2, and the third sub-pixel 3.

For example, sharing a mask includes using a same mask. Compared with a mask used in the case where the second display sub-region A2 and the transition display sub-region A3 are not provided, the shared mask does not need to be adjusted, or only needs a small amount of adjustment. For example, a desired mask can be formed by shielding an opening region. For example, the opening region at the position in the second display sub-region A2 of the mask corresponding to the first transparent pixel P1 can be shielded, or the opening region at the position in the transition display sub-region A3 of the mask corresponding to the second transparent pixel P2 can be shielded, so as to form a desired mask, which is not limited thereto.

Forming the display substrate shown in FIG. 2B is taken as an example. For example, the light emitting layers of the third sub-pixels 3 in the first display sub-region A1, the second display sub-region A2 and the transition display sub-region A3 can be formed by using a same mask, and the mask can be the same as a mask used in the case where the second display sub-region A2 and the transition display sub-region A3 are not provided, thereby simplifying the manufacturing process. The first sub-pixel 1 of the first display sub-region A1, the first transparent pixel P1 of the second display sub-region A2, and the first sub-pixel 1 of the transition display sub-region A3 can be formed by using a same mask plate. In this case, the mask can be obtained by shielding an opening region in the second display sub-region A2 on the basis of a mask used in the case where the second display sub-region A2 and the transition display sub-region A3 are not provided, so as to form the first transparent pixel P1 in the second display sub-region A2. For example, the light emitting layers of the second sub-pixels 2 in the first display sub-region A1, the second display sub-region A2 and the transition display sub-region A3 can be formed by using a same mask, and the mask can be obtained by shielding an opening region at a position in the second display sub-region A2 corresponding to the first sub-pixel 1 and shielding an opening region at a position in the transition display sub-region A3 corresponding to the second transparent pixel P2, on the basis of a mask used in the case where the second display sub-region A2 and the transition display sub-region A3 are not provided, so that a usable mask can be obtained with only a small amount of adjustment on the basis of a normal mask. For example, the first sub-pixel 1 in the second display sub-region A2 can be manufactured by using a separate mask, but is not limited thereto. For example, in some embodiments, a mask for manufacturing the light emitting layers of the first sub-pixels can be adjusted, so that the first sub-pixels 1 in the first display sub-region A1, the second display sub-region A2, and the transition display sub-region A3 can be formed by using a same mask.

The display substrates provided by other embodiments can be manufactured in a similar manner and details will not be described here again.

Figure 3A:
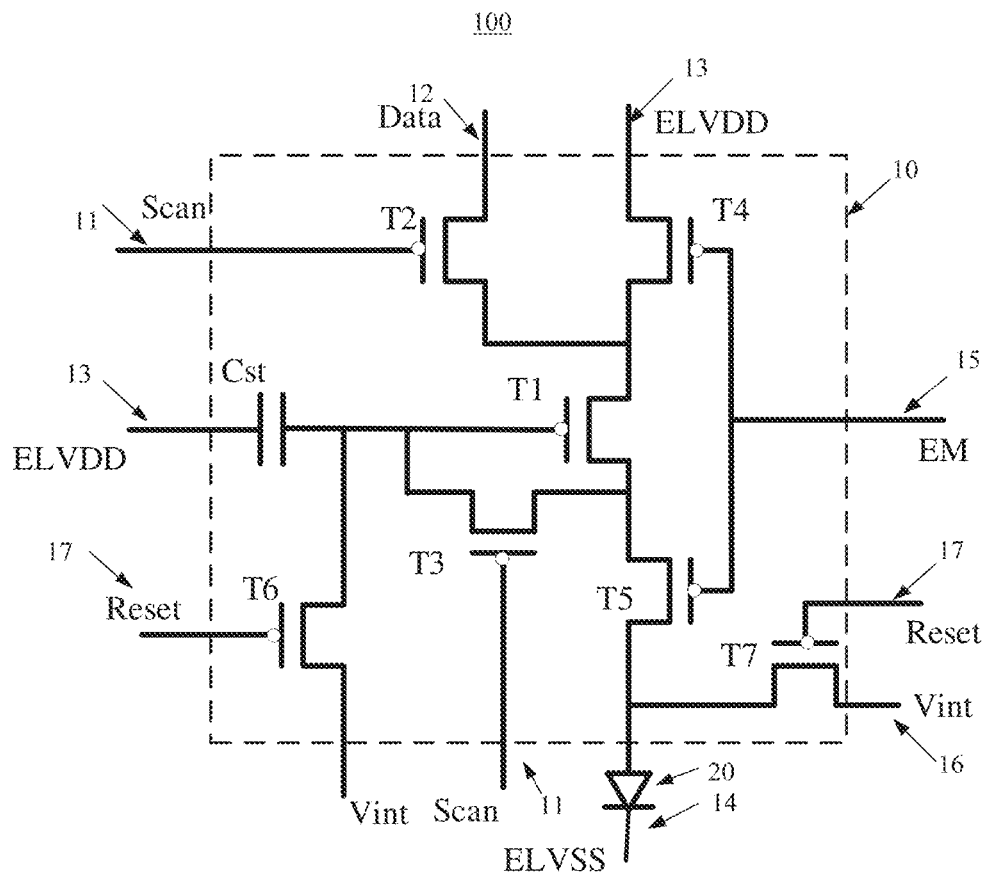
FIG. 3A is a schematic diagram of a pixel circuit of a display substrate.

FIG. 3A is a schematic diagram of a pixel circuit of a display substrate. The display substrate is an OLED display substrate. In the embodiment of the present disclosure, the pixel circuit is shown in FIG. 3A by way of example, but is not limited thereto. The display substrate may also adopt other suitable pixel circuits.

As shown in FIG. 3A, a first power signal line 13 is configured to provide a constant first voltage signal ELVDD to a pixel circuit structure 10; a second power signal line 14 is configured to provide a constant second voltage signal ELVSS to the pixel circuit structure 10; and the first voltage signal ELVDD is higher than the second voltage signal ELVSS. A light emitting control signal line 15 is configured to provide a light emitting control signal EM to the pixel circuit structure 10. An initialization signal line 16 and a reset control signal line 17 are respectively configured to provide an initialization signal Vint and a reset control signal Reset to the pixel circuit structure 10, wherein the initialization signal Vint is a constant voltage signal, and a magnitude thereof can be, for example, between the first voltage signal ELVDD and the second voltage signal ELVSS, but is not limited thereto. For example, the initialization signal Vint can be less than or equal to the second voltage signal ELVSS.

As shown in FIG. 3A, the pixel circuit structure 10 includes a driving transistor T1, a data writing transistor T2, a threshold compensation transistor T3, a first light emitting control transistor T4, a second light emitting control transistor T5, a first reset transistor T6, a second reset transistor T7, and a storage capacitor Cst. The driving transistor T1 is electrically connected to a light emitting element 20, and outputs a driving current to drive the light emitting element 20 to emit light under the control of signals such as a scanning signal Scan, a data signal Data, a first voltage signal ELVDD and a second voltage signal ELVSS, etc.

Figure 3B:
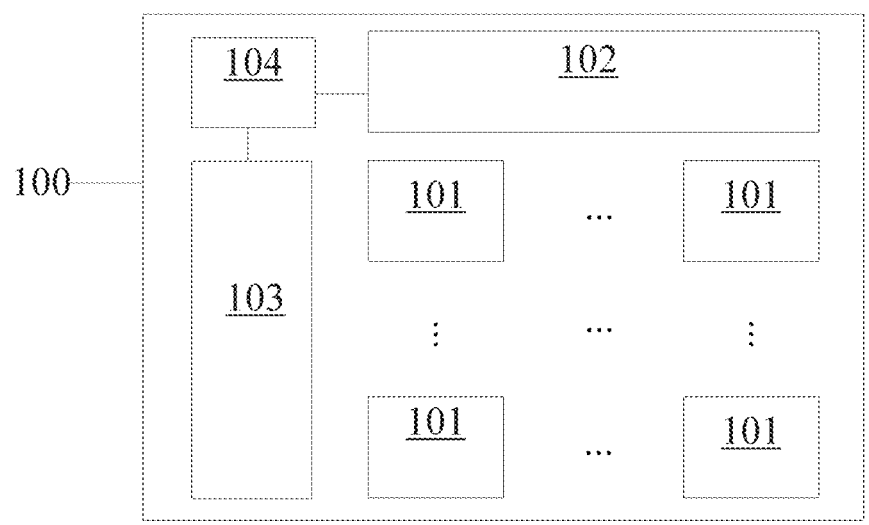
FIG. 3B is a schematic plan view illustrating a structure of a display substrate according to an embodiment of the present disclosure.

FIG. 3B is a schematic plan view illustrating a structure of a display substrate according to an embodiment of the present disclosure. Referring to FIGS. 3A and 3B, the display substrate 100 includes a plurality of pixel units 101 arranged in a matrix, and each pixel unit 101 includes a pixel circuit structure 10, a light emitting element 20, a gate line 11, a data line 12, and a voltage signal line. The light emitting element 20 is an organic light emitting element OLED, and the light emitting element 20 emits red light, green light, blue light or white light, etc., under the driving of a corresponding pixel circuit structure 10. One or more voltage signal line may be provided. For example, as shown in FIG. 3A, the voltage signal line includes at least one selected from the group consisting of a first power signal line 13, a second power signal line 14, a light emitting control signal line 15, an initialization signal line 16 and a reset control signal line 17, etc. A second electrode (which may be a common electrode of the OLED, such as a cathode) of the light emitting element 20 is electrically connected to the second power supply signal line 14.

For example, as shown in FIG. 3B, the display substrate 100 provided by the embodiment of the present disclosure further includes a data driver 102, a scan driver 103, and a controller 104. The data driver 102 is configured to provide a data signal Data to the pixel unit 101 according to an instruction of the controller 104; the scan driver 103 is configured to provide a light emitting control signal EM, a scan signal Scan and a reset control signal Reset, etc., to the pixel unit 101 according to an instruction of the controller 104. For example, the scan driver 103 is a GOA (Gate On Array) structure mounted on the display substrate or a driving chip (IC) structure bonded to the display substrate. For example, different drivers can also be used to provide the light emitting control signal EM and the scan signal Scan, respectively. For example, the display substrate 100 further includes a power supply (not shown in the figure) to provide the voltage signals described above, which may be a voltage source or a current source as needed. The power supply is configured to provide the pixel unit 101 with the first power voltage ELVDD, the second power voltage ELVSS and the initialization signal Vint, through the first power signal line 13, the second power signal line 14 and the initialization signal line 16, respectively.

Figure 3C:
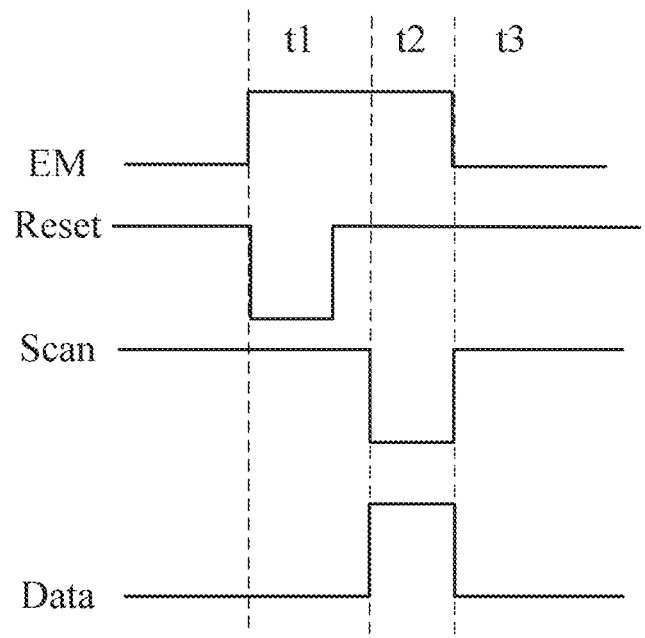
FIG. 3C is a timing signal diagram of a pixel unit in a display substrate according to an embodiment of the present disclosure.

FIG. 3C is a timing signal diagram of a pixel unit in a display substrate according to an embodiment of the present disclosure. A driving method of a pixel unit in the display substrate provided by the embodiment of the present disclosure will be described below with reference to FIG. 3C.

As shown in FIG. 3C, in a frame display period, the driving method of the pixel unit includes a reset stage t1, a data writing and threshold compensation stage t2, and a light emitting stage t3.

In the reset stage t1, the light emitting control signal EM is set to a turn-off voltage, the reset control signal Reset is set to a turn-on voltage, and the scan signal Scan is set to a turn-off voltage.

In the data writing and threshold compensation stage t2, the light emitting control signal EM is set to a turn-off voltage, the reset control signal Reset is set to a turn-off voltage, and the scan signal Scan is set to a turn-on voltage.

In the light emitting stage t3, the light-emitting control signal EM is set to a turn-on voltage, the reset control signal Reset is set to a turn-off voltage, and the scan signal Scan is set to a turn-off voltage.

For example, in the embodiment of the present disclosure, a turn-on voltage refers to a voltage that can turn on a first electrode and a second electrode of a corresponding transistor, and a turn-off voltage refers to a voltage that can turn off a first electrode and a second electrode of a corresponding transistor. In the case where the transistor is a P-type transistor, the turn-on voltage is a low voltage (e.g., 0V) and the turn-off voltage is a high voltage (e.g., 5V); in the case where the transistor is an N-type transistor, the turn-on voltage is a high voltage (e.g., 5V) and the turn-off voltage is a low voltage (e.g., 0V). The driving waveforms shown in FIG. 3C are all illustrated by taking a P-type transistor as an example, i.e., the turn-on voltage is a low voltage (e.g., 0V) and the turn-off voltage is a high voltage (e.g., 5V).

Referring to FIG. 3A and FIG. 3C, in the reset stage t1, the light emitting control signal EM is a turn-off voltage, the reset control signal Reset is a turn-on voltage, and the scan signal Scan is a turn-off voltage. At this time, the first reset transistor T6 and the second reset transistor T7 are in an on state, while the data writing transistor T2, the threshold compensation transistor T3, the first light emitting control transistor T4, and the second light emitting control transistor T5 are in an off state. The first reset transistor T6 transmits the initialization signal (initialization voltage) Vint to the gate electrode of the driving transistor T1, and the initialization signal Vint is stored by the storage capacitor Cst, so as to reset the driving transistor T1 and eliminate the data stored at the time of a previous light emission (previous frame); and the second reset transistor T7 transmits the initialization signal Vint to the first electrode of the light emitting element 20, so as to reset the light emitting element 20.

In the data writing and threshold compensation stage t2, the light emitting control signal EM is a turn-off voltage, the reset control signal Reset is a turn-off voltage, and the scan signal Scan is a turn-on voltage. At this time, the data writing transistor T2 and the threshold compensation transistor T3 are in an on state, while the first light emitting control transistor T4, the second light emitting control transistor T5, the first reset transistor T6, and the second reset transistor T7 are in an off state. At this time, the data writing transistor T2 transmits a data voltage Vdata to the first electrode of the driving transistor T1; that is, the data writing transistor T2 receives the scan signal Scan and the data signal Data and writes the data signal Data to the first electrode of the driving transistor T1 according to the scan signal Scan. The threshold compensation transistor T3 is turned on, so as to connect the driving transistor T1 into a diode structure, whereby the gate electrode of the driving transistor T1 can be charged. After the charging is completed, a gate voltage of the driving transistor T1 is Vdata+Vth, where Vdata is the data voltage and Vth is the threshold voltage of the drive transistor T1; that is, the threshold compensation transistor T3 receives the scan signal Scan and performs a threshold voltage compensation on the gate voltage of the driving transistor T1 according to the scan signal Scan. In this stage, the voltage difference between two terminals of the storage capacitor Cst is ELVDD−Vdata−Vth.

In the light emitting stage t3, the light emitting control signal EM is a turn-on voltage, the Reset control signal Reset is a turn-off voltage, and the scan signal Scan is a turn-off voltage. The first light emitting control transistor T4 and the second light emitting control transistor T5 are in an on state, while the data writing transistor T2, the threshold compensation transistor T3, the first reset transistor T6, and the second reset transistor T7 are in an off state. The first voltage signal ELVDD is transmitted to the first electrode of the driving transistor T1 through the first light emitting control transistor T4; the gate voltage of the driving transistor T1 is maintained at Vdata+Vth' and a light emitting current I flows into the light emitting element 20 through the first light emitting control transistor T4, the driving transistor T1 and the second light emitting control transistor T5, so that the light emitting element 20 emits light. That is, the first light emitting control transistor T4 and the second light emitting control transistor T5 receive the light emitting control signal EM and control the light emitting element 20 to emit light according to the light emitting control signal EM. The light emitting current I satisfies a saturation current formula as follows:

$$K(Vgs-Vth)^2 = K(Vdata+Vth-ELVDD-Vth)^2 = K(Vdata-ELVDD)^2,$$

where $$K = 0.5\mu_n Cox \frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (i.e., the first electrode of the driving transistor T1 in the present embodiment) of the driving transistor T1.

From the formula of light emitting current I=K(Vdata−ELVDD)$^2$, it can be seen that, the light emitting current I is related to the data voltage Vdata and the first voltage signal ELVDD; as a result, the light emitting current of the light emitting element 20 can be adjusted by adjusting at least one of the data voltage Vdata and the first voltage signal ELVDD, so as to adjust the brightness of the light emitting element 20.

The embodiment of the present disclosure takes the pixel circuit shown in FIG. 3A as an example but is not limited thereto, and other suitable pixel circuits can also be used for the display substrate. In other embodiments, in the case where the display substrate adopts other pixel circuits, the light emitting current I may also be related to one of the data voltage Vdata and the first voltage signal ELVDD. For example, the light emitting current I=K(Vdata)$^2$ or the light emitting current I=K(ELVDD)$^2$.

Figure 4:
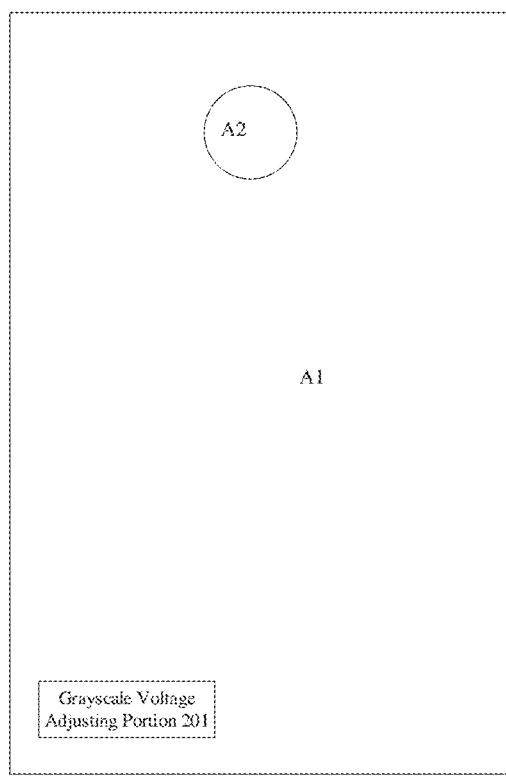
FIG. 4 is a schematic diagram of a display substrate according to an embodiment of the present disclosure.

FIG. 4 is a schematic diagram of a display substrate according to an embodiment of the present disclosure. As shown in FIG. 4, the display substrate further includes a grayscale voltage adjusting portion 201, and the grayscale voltage adjusting portion 201 is configured to adjust a grayscale voltage of at least one selected from the group consisting of the second sub-pixel 2, the third sub-pixel 3 and the first pixel 1 in the third pixel unit 30, and the second sub-pixel 2, the third sub-pixel 3 and the first sub-pixel 1 in the fourth pixel unit 40, in the case where a display grayscale is less than or equal to a first grayscale, so as to improve the brightness of the second display sub-region A2. For example, the grayscale voltage adjusting portion 201 can adjust a grayscale voltage inputted to any one sub-pixel in the third pixel unit 30 and the fourth pixel unit 40, and adjust a first grayscale voltage to a second grayscale voltage to improve the brightness of the sub-pixel. For example, any one sub-pixel in the third pixel unit 30 includes any one of the second sub-pixel 2, the third sub-pixel 3 and the first sub-pixel 1; and any one sub-pixel in the fourth pixel unit 40 includes any one of the second sub-pixel 2, the third sub-pixel 3, and the first sub-pixel 1. For example, the first grayscale voltage is less than the second grayscale voltage, that is, the brightness of the second display sub-region A2 is improved by increasing the grayscale voltage. For example, the grayscale voltage can be the data voltage Vdata shown in FIG. 3A.

In the case where the display substrate is not provided with the transition display sub-region A3, the grayscale voltage adjusting portion 201 is configured to adjust a grayscale voltage of the third pixel unit 30 when a display grayscale is less than or equal to a first grayscale, so as to improve the brightness of the second display sub-region A2.

Figure 5A:
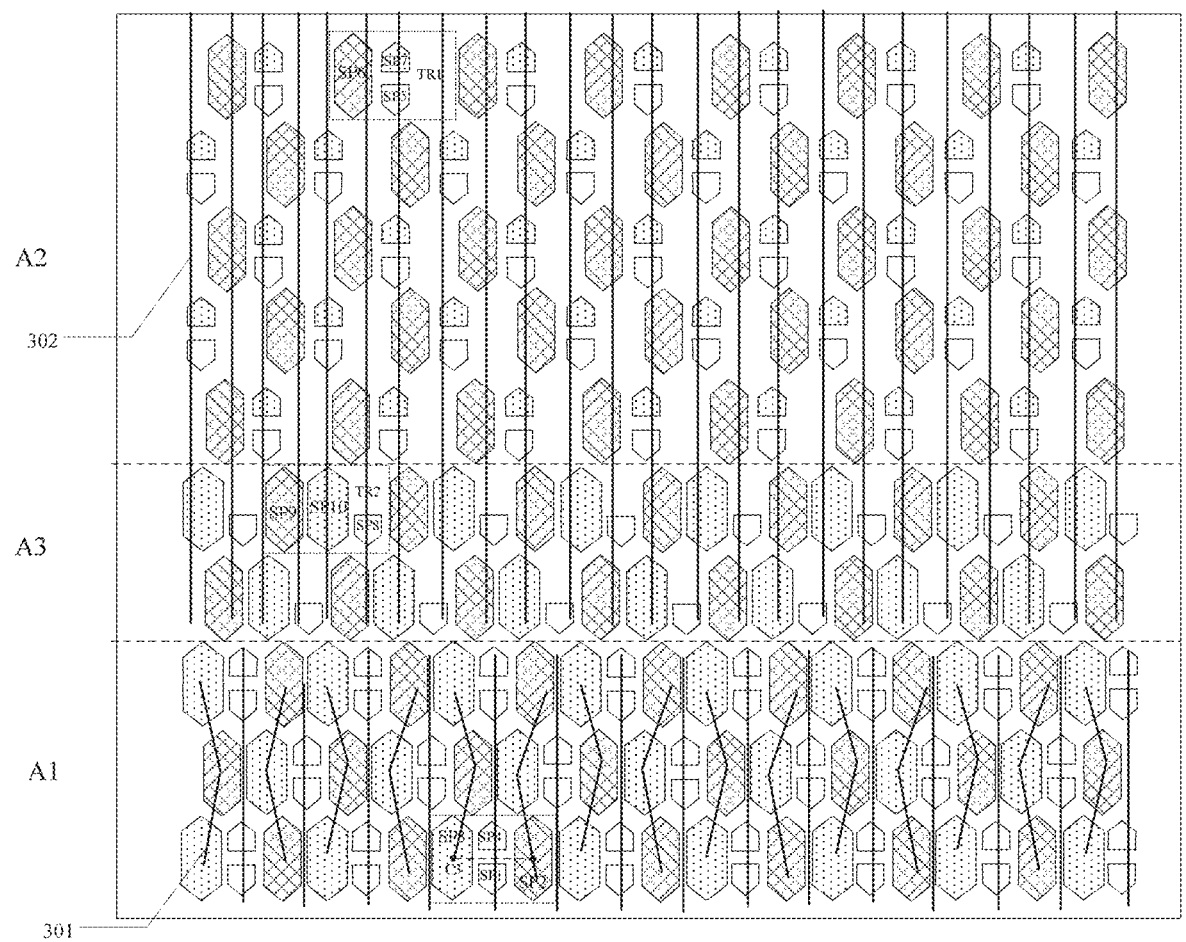
FIG. 5A is a schematic diagram of a display substrate according to another embodiment of the present disclosure.

FIG. 5A is a schematic diagram of a display substrate according to another embodiment of the present disclosure. As shown in FIG. 5A, the display substrate further includes a first power line 301 and a second power line 302; the first power line 301 is connected to the first pixel unit 10 and the second pixel unit 20; the second power line 302 is connected to the third pixel unit 30 and the fourth pixel unit 40; the first power line and the second power line are insulated from each other. In this way, different first voltage signals can be applied to different regions, for example, different ELVDDs can be supplied to different regions, thereby improving the brightness of at least one of the second display sub-region A2 and the transition display sub-region A3. For example, the first power line 301 is the first power supply signal line 13 connected to the sub-pixels of the first display sub-region A1 (as shown in FIG. 3A); and the second power line 302 is the first power supply signal line 13 connected to the sub-pixels of the second display sub-region A2 and/or the transition display sub-region A3 (as shown in FIG. 3A).

In the embodiment of the present disclosure, the first power line 301 and the second power line 302 can be controlled by different circuits, respectively. The first power line 301 and the second power line 302 are not limited to those shown in FIG. 5A, and may adopt other manners as long as the first power line 301 and the second power line 302 are insulated from each other and can be applied with different signals, respectively.

For example, a maximum brightness of the first display sub-region A1 can reach 700 nit, and a maximum brightness of the second display sub-region A2 is generally 400-500 nit. By means of adjusting the ELVDD, such as increasing the ELVDD, the maximum brightness of the second display sub-region A2 can be increased to 500-600 nit, thereby reducing the brightness difference between the second display sub-region A2 and the first display sub-region A1 and improving the display uniformity.

In the case where the transition display sub-region A3 is not provided, the second power line 302 is connected to the third pixel unit 30 so as to adjust the brightness of the second display sub-region A2.

When displaying an image, the display brightness of the second display sub-region A2 is smaller than that of the first display sub-region A1, and the brightness of the second display sub-region A2 can be adjusted according to an actual measurement value. A grayscale adjustment scheme is adopted in the case where the grayscale is low: assuming that the brightness of the second display sub-region A2 is A, the brightness of the transition display sub-region A3 is B, and the brightness of the first display sub-region A1 is L, then L=k×(Gr/255)$^{2.2}$ according to a brightness formula, where k is a coefficient, and Gr is a grayscale. For example, the coefficient is 350, but is not limited thereto, and the coefficient k can be adjusted according to an actual standard brightness. It can be obtained by measurement that the brightness L of the first display sub-region A1 is "a" time(s) of the brightness A of the second display sub-region A2, and the grayscale of the second display sub-region A2 is adjusted to GrA by a formula of a×L=350×(GrA/255)$^{2.2}$, where GrA is an adjusted grayscale of the second display sub-region A2, so that the second display sub-region A2 and the first display sub-region A1 have the same brightness; Similarly, the brightness of the first display sub-region A1 is "b" time(s) of the brightness of the transition display sub-region A3, that is, b×L=350×(GrB/255)$^{2.2}$, where GrB is an adjusted grayscale of the transition display sub-region A3, and the grayscale of the transition display sub-region A3 is adjusted to GrB, so that the transition display sub-region A3 and the first display sub-region A1 have the same brightness. This algorithm can be integrated into an integrated circuit (IC), and coefficients A and B are preset, so as to automatically convert the grayscales during display. This method adjusts the grayscale of the second display sub-region A2 to 255 at the highest, and the brightness adjustment capability thereof is limited for high grayscale images. During the above measurement and calculation, the second display sub-region A2 can be set to have a same grayscale, the transition display sub-region A3 can be set to have a same grayscale, and the first display sub-region A1 can be set to have a same grayscale, so as to facilitate the calculation. During actual display, sub-pixels in each region can display different grayscales.

For high grayscale images, a scheme of adjusting ELVDD can be adopted. In the first display sub-region A1 and the second display sub-region A2, different ELVDDs (for example, ELVDD1 and ELVDD2, respectively) are used for control. By obtaining a ratio of the brightness of the first display sub-region A1 to the brightness of the second display sub-region A2, the ELVDD of the second display sub-region A2 is increased, so that when the two regions display a same grayscale, the brightness of pixels controlled by ELVDD2 is larger, then the brightness of the second display sub-region A2 and the brightness of the first display sub-region A1 are consistent with each other. The above two methods can be integrated into the IC as two modules. When a low grayscale is displayed, a grayscale voltage adjusting module is enabled for compensation; and when a high grayscale is displayed, a power voltage adjusting module is enabled for compensation. In the embodiment of the present disclosure, the first grayscale is taken as a dividing line between high grayscale and low grayscale, and the division of high grayscale and low grayscale can depend on actual experiments. The embodiment of the present disclosure does not limit the value of the first gray scale.

Figure 5B:
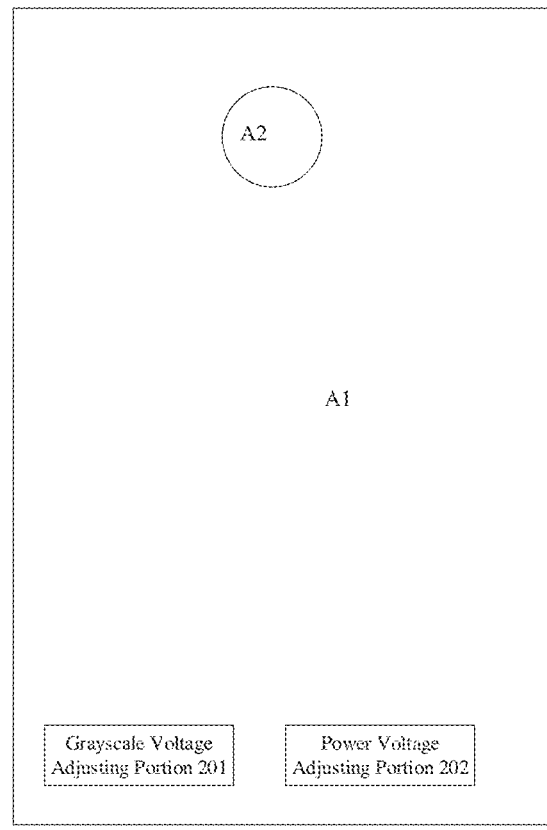
FIG. 5B is a schematic diagram of a display substrate according to another embodiment of the present disclosure.

FIG. 5B is a schematic diagram of a display substrate according to another embodiment of the present disclosure. As shown in FIG. 5B, the display substrate further includes a power voltage adjusting portion 202, and the power voltage adjusting portion 202 is configured to adjust a first voltage signal (power voltage) of the second power line 302.

At least one embodiment of the present disclosure further provides a display device including any one of the above display substrates.

In the embodiment of the present disclosure, the display device can include an OLED display device or a liquid crystal display device, etc.

Figure 6:
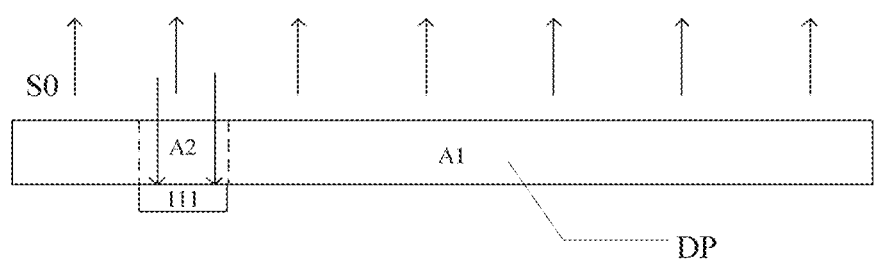
FIG. 6 is a schematic diagram of a display device according to an embodiment of the present disclosure.

FIG. 6 is a schematic diagram of a display device according to an embodiment of the present disclosure. As shown in FIG. 6, the display device includes a display substrate DP, the display substrate DP has a light emitting side S0, an orthographic projection of a camera 111 on the display substrate DP falls within the second display sub-region A2, and the camera 111 is located at a side of the display substrate DP opposite to the light emitting side S0.

At least one embodiment of the present disclosure further provides a driving method of a display substrate, including:

driving the first pixel unit 10 and the second pixel unit 20 by means of sub-pixel rendering; and driving the first sub-pixel, the second sub-pixel and the third sub-pixel adjacently arranged in the third pixel unit 30 to respectively display a corresponding sub-pixel with a higher brightness, of a same color, of two adjacent pixels in an image to be displayed corresponding to the third pixel unit.

Figure 7:
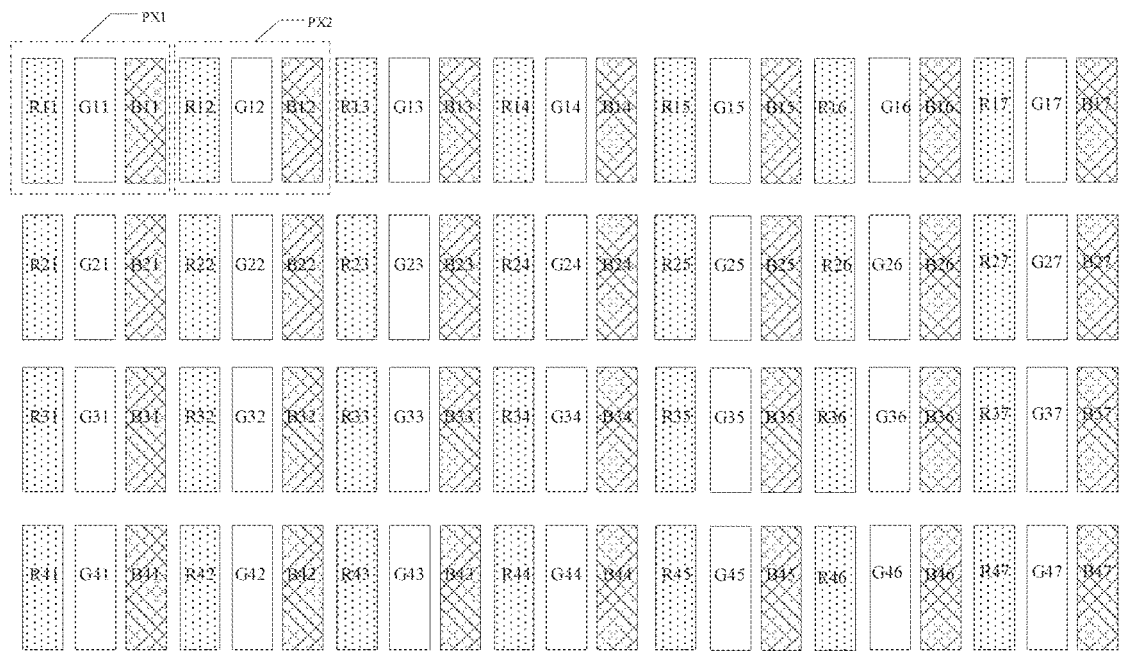
FIG. 7 is a schematic diagram of an image to be displayed in a driving method of a display substrate according to an embodiment of the present disclosure.

FIG. 7 is a schematic diagram of an image to be displayed in a driving method of a display substrate according to an embodiment of the present disclosure. For example, the third pixel unit 30 corresponds to two adjacent pixels PX1 and PX2 in the image to be displayed; the pixel PX1 includes three sub-pixels of different colors; the pixel PX2 includes three sub-pixels of different colors; and the first sub-pixel, the second sub-pixel and the third sub-pixel adjacently arranged in the third pixel unit 30 respectively display a corresponding sub-pixel with a higher brightness, of a same color, of the pixels PX1 and PX2 in the image to be displayed, thereby further improving the brightness of the second display sub-region A2.

In one embodiment of the present disclosure, in order to further improve the brightness of the second display sub-region A2, the driving method further includes: adjusting a grayscale voltage of at least one selected from the group consisting of the first sub-pixel 1, the second sub-pixel 2 and the third sub-pixel 3 in the third pixel unit 30 in the case where a display grayscale is less than or equal to a first grayscale, so as to improve the brightness of the second display sub-region A2. For example, Vdata is less than ELVDD, and the brightness of the second display sub-region A2 can be improved by reducing the grayscale voltage (Vdata), but is not limited thereto. The grayscale voltage can be adjusted according to the formula of the light emitting current.

In one embodiment of the present disclosure, in order to further improve the brightness of the second display sub-region A2, the driving method further includes: adjusting the first voltage signals of the first sub-pixel 1, the second sub-pixel 2 and the third sub-pixel 3 in the third pixel unit 30 in the case where a display grayscale is greater than a first grayscale, so as to improve the brightness of the second display sub-region A2. For example, Vdata is less than ELVDD, and the brightness of the second display sub-region A2 can be increased by increasing the first voltage signal (ELVDD), but is not limited thereto. The first voltage signal can be adjusted according to the formula of the light emitting current.

In one embodiment of the present disclosure, the display substrate includes a transition display sub-region, and the driving method of the display substrate includes: driving the first pixel unit 10 and the second pixel unit 20 by means of sub-pixel rendering; driving the first sub-pixel, the second sub-pixel and the third sub-pixel adjacently arranged in the third pixel unit 30 to respectively display a corresponding sub-pixel with a higher brightness, of a same color, of two adjacent pixels in an image to be displayed corresponding to the third pixel unit 30; and driving the first sub-pixel, the second sub-pixel and the third sub-pixel in the fourth pixel unit 40 to respectively display a corresponding sub-pixel with a higher brightness, of a same color, of two adjacent pixels in an image to be displayed corresponding to the fourth pixel unit. The two adjacent pixels in the image to be displayed can be referred to those shown in FIG. 7.

For example, when determining the pixels to be displayed by the third pixel unit 30 and the pixels displayed to be displayed by the fourth pixel unit 40, an algorithm corresponding to the coordinate pixels of the second display sub-region A2 and the transition display sub-region A3 can be modified in the algorithms. For example, the sub-pixels with higher brightness in the adjacent pixels displayed by sub-pixels of different colors can be determined according to the formulas as follows: R(i,j)'=max(R(i,j), (i,j−1)), G(i,j)'=max(G(i,j), (i,j−1)), B(i,j)'=max(B(i,j), (i,j−1)), where i represents an order of a row and j represents an order of a column.

In the driving method provided by an embodiment of the present disclosure, the transition display sub-region can refer to the related description in the display substrate and details will not be described here again.

Figure 8:
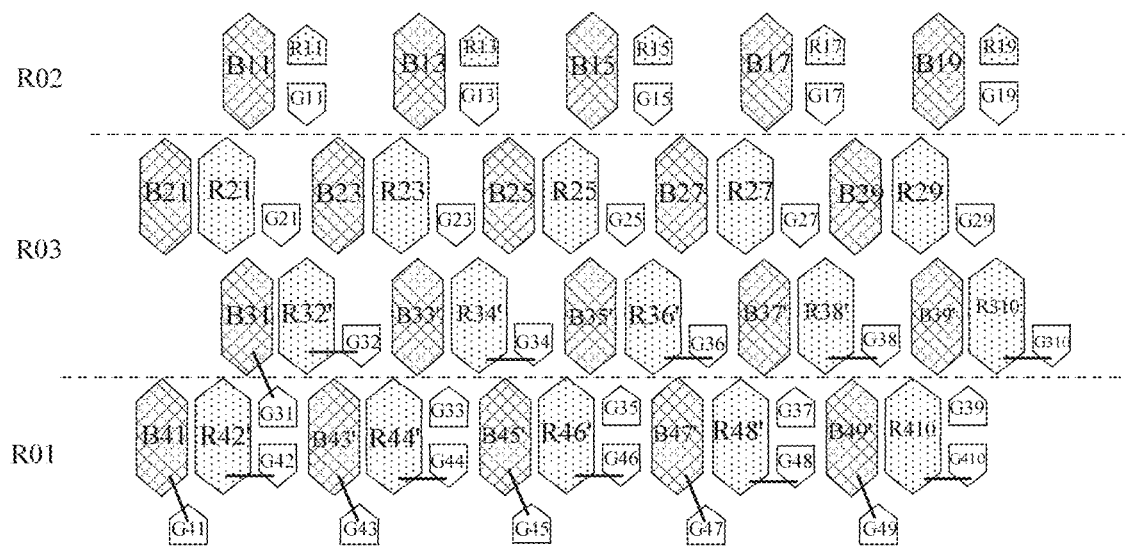
FIG. 8 is a schematic diagram illustrating driving modes of different regions in a driving method of a display substrate according to an embodiment of the present disclosure.

FIG. 8 is a schematic diagram illustrating driving modes of different regions in a driving method of a display substrate according to an embodiment of the present disclosure. As shown in FIG. 8, the second display sub-region A2 and the transition display sub-region A3 are driven in a conventional driving mode without the need of rendering by SPR algorithm, but the number of the pixel points being displayed is half of the original number, and the first display sub-region A1 and the last row of the transition display sub-region A3 are still driven by SPR algorithm.

For example, brightness adjustment coefficients and high grayscale brightness adjustment VDD variation functions of the second display sub-region and the transition display sub-region described above can be determined via experiments on a sample screen. The above parameters are written into an algorithm and packaged as an IP to be integrated into an IC. For a same batch of screens, a compensated image can be directly generated by the IC for display, thereby improving the uniformity of display visual effect in transparent regions. And the algorithm uses an existing pixel arrangement size, so that the process is easy to be realized.

For example, the grayscale voltage adjusting module and the power voltage control module can be packaged as an IP, and be integrated into an IC together with the modified SPR algorithm, so as to perform a real-time compensation display for an image displayed by a partial transparent screen.

The display substrate provided by the embodiment of the present disclosure can further include one or a plurality of processors and one or a plurality of memories. The processor can process data signals and can include various computing architectures, such as a complex instruction set computer (CISC) architecture, a reduced instruction set computer (RISC) architecture, or an architecture that implements a combination of multiple instruction sets. The memory can store instructions executed by the processor and/or data. These instructions and/or data can include code for implementing some or all of the functions of one or a plurality of devices described in the embodiments of the present disclosure. For example, the memory includes a dynamic random access memory (DRAM), a static random access memory (SRAM), a flash memory, an optical memory, or any other memory well known to those skilled in the art.

In some embodiments of the present disclosure, at least one of the grayscale voltage adjusting portion and the power voltage adjusting portion includes code and program stored in a memory; the processor can execute the code and program to realize some or all of the functions of the grayscale voltage adjusting portion and/or the power voltage adjusting portion as described above.

In some embodiments of the present disclosure, the grayscale voltage adjusting portion and/or the power voltage adjusting portion can be special hardware devices for realizing some or all of the functions of the grayscale voltage adjusting portion and/or the power voltage adjusting portion as described above. For example, the grayscale voltage adjusting portion and/or the power voltage adjusting portion can be one circuit board or a combination of a plurality of circuit boards, for realizing the functions described above. In the embodiments of the present disclosure, the one circuit board or the combination of a plurality of circuit boards can include: (1) one or more processors; (2) one or more non-transitory computer readable memories connected to the processor(s); and (3) a firmware stored in the memory and executable by the processor.

Figure 9:
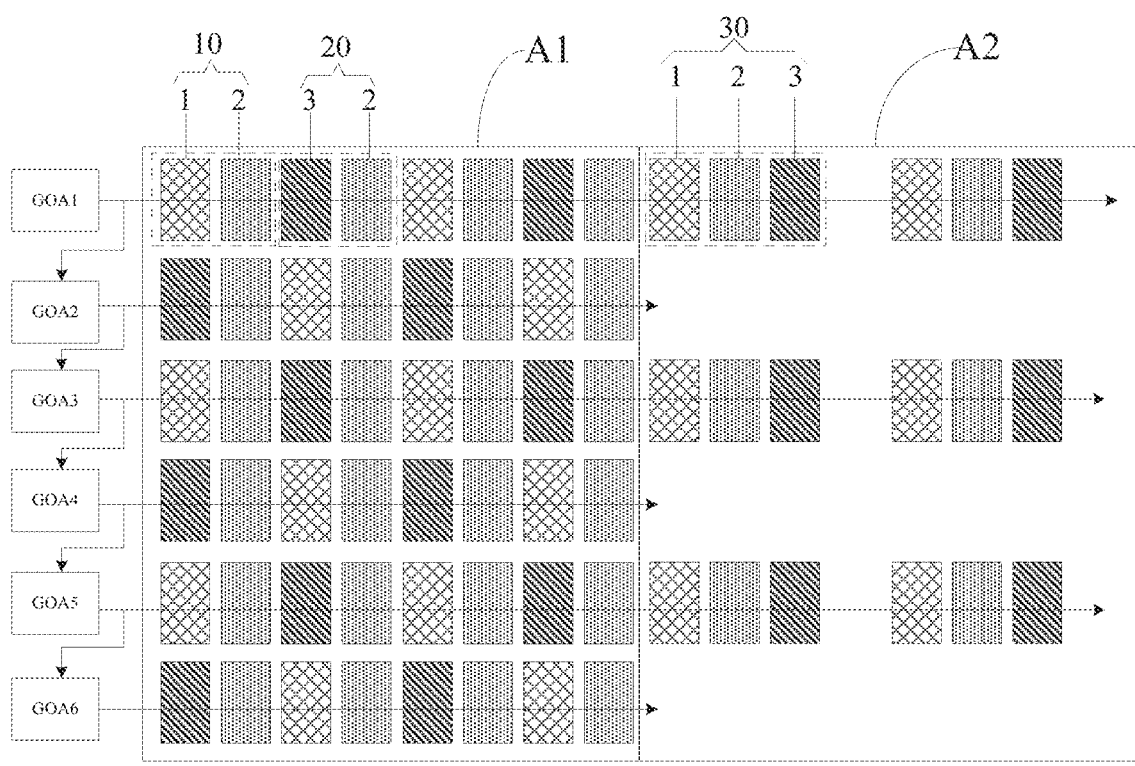
FIG. 9 is a demonstration diagram of a scanning process of a display substrate according to an embodiment of the present disclosure.
Figure 10:
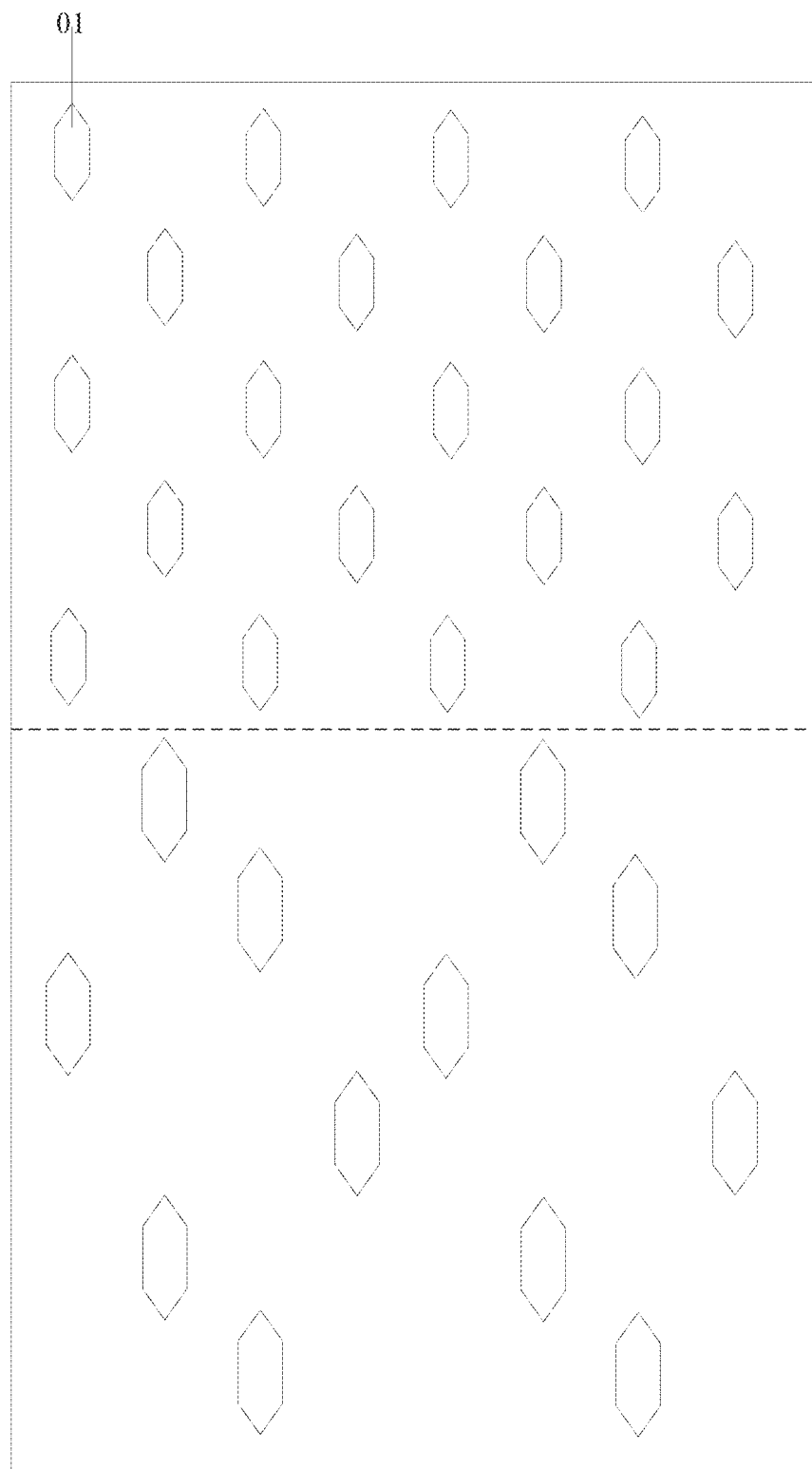

In a specific implementation, the display substrate provided by the embodiment of the present disclosure generally performs a progressive, row by row scanning in the first display sub-region during display. For example, as shown in FIG. 9, in the case where the first display sub-region A1 and the second display sub-region A2 are adjacent in the row direction, the gate driving circuits GOA1~GOA5 output signals row by row; but for the second display sub-region A2, only GOA1, GOA3, and GOA5 are required to output signals.

Based on the same inventive concept, the embodiment of the present disclosure also provides a driving method of driving any one of the display substrates shown in FIGS. 1B-1M, including:

S1301, receiving original image data;

S1302, for each sub-pixel in the first display sub-region, determining a target grayscale value of the sub-pixel according to an initial grayscale value of the sub-pixel in the original image data corresponding to the sub-pixel in the first display sub-region; for each sub-pixel in the second display sub-region, determining a target grayscale value of the sub-pixel according to the light emitting area of the sub-pixel in the second display sub-region, the pixel distribution density of the second display sub-region, and an initial grayscale value of the sub-pixel in the original image data corresponding to a region in which the sub-pixel in the second display sub-region is located;

S1303, driving each sub-pixel in the display substrate to display according to a target grayscale value thereof.

For example, for sub-pixels in the first display sub-region, in the case where one physical pixel in the first display sub-region corresponds to one pixel in the image data, the target grayscale value of a sub-pixel generally is the initial grayscale value of the sub-pixel. However, in the case where the number of the physical pixels in the first display area is less than the number of the pixels in the image data, there is a sub-pixel borrowing relationship during display, so that one sub-pixel in the first display sub-region may correspond to two or more pixels in the image data; therefore, the target grayscale value of the sub-pixel in the first display sub-region needs to be converted according to the initial grayscale value of a corresponding sub-pixel in the original image data.

For each sub-pixel in the second display sub-region, due to the low resolution, one physical pixel just corresponds to one pixel in the image data during display, and the target grayscale value of a sub-pixel generally is the initial grayscale value of the sub-pixel. However, in this way, there is a problem that, due to the low resolution of the second display sub-region, if a display is directly performed according to the initial grayscale value, the brightness of the second display sub-region will significantly differ from the brightness of the first display sub-region, and obvious dark stripes will be occurred at the boundary between the second display sub-region and the first display sub-region. In order to solve this problem, the driver provided by the embodiment of the present disclosure adjusts the grayscale of the sub-pixel in the second display sub-region according to the light emitting area of the sub-pixel and the pixel distribution density of the second display sub-region. For example, the larger the light emitting area of the sub-pixel is, the higher the overall brightness of the second display sub-region will be; and the more the sub-pixels are distributed in the second display sub-region, the higher the overall brightness of the second display sub-region will be.

It should be noted that, one physical pixel generally includes at least three sub-pixels of RGB.

In a specific implementation, in the case where the pixel arrangement in the first display sub-region is a Pentile arrangement, both the first sub-pixel and the third sub-pixel will be borrowed; as a result, during display, in general, one first sub-pixel corresponds to two pixels in the image data, one third sub-pixel corresponds to two pixels in the image data, and the second sub-pixel will not be borrowed; therefore, one second sub-pixel generally corresponds to one pixel in the image data.

Therefore, optionally, in the driving method provided by the embodiment of the present disclosure, for each sub-pixel in the first display sub-region, determining the target grayscale value of the sub-pixel may specifically include:

determining the target grayscale value X of the first sub-pixel in the first display sub-region based on the formula:

$$X = \left( \frac{x_1^{Gamma} + x_2^{Gamma}}{2} \right)^{\frac{1}{Gamma}},$$

where Gamma represents a gamma value of the display substrate, $x_1$ and $x_2$ are the initial grayscale values of two first sub-pixels in the original image data corresponding to the first sub-pixel in the first display sub-region, respectively;

determining the target grayscale value Y of the second sub-pixel in the first display sub-region as the initial grayscale value y of one second sub-pixel in the original image data corresponding to the second sub-pixel in the first display sub-region;

determining the target grayscale value Z of the third sub-pixel in the first display sub-region based on the formula:

$$Z = \left( \frac{z_1^{Gamma} + z_2^{Gamma}}{2} \right)^{\frac{1}{Gamma}},$$

where $z_1$ and $z_2$ are the initial grayscale values of two third sub-pixels in the original image data corresponding to the third sub-pixel in the first display sub-region, respectively.

In a specific implementation, in order to alleviate the dark stripes at the boundary between the second display sub-region and the first display sub-region, the brightness of the second display sub-region can be appropriately adjusted. The brightness is in direct proportional to both of the light emitting area and the pixel distribution density.

Therefore, optionally, in the driving method provided by the embodiment of the present disclosure, for each sub-pixel in the second display sub-region, determining the target grayscale value of the sub-pixel may specifically include:

determining the target grayscale value X of the sub-pixel in the second display sub-region based on the formula:

$$X = k*s*\rho \left( \frac{x_1^{Gamma} + x_2^{Gamma} + \ldots + x_n^{Gamma}}{n} \right)^{\frac{1}{Gamma}},$$

where n is valued as any integer from 1~N, N is the number of sub-pixels in the original image data corresponding to the sub-pixel in the second display sub-region, Gamma represents a gamma value of the display substrate, s represents a ratio of the light emitting area of the sub-pixel in the first display sub-region to the light emitting area of the sub-pixel in the second display sub-region, ρ represents a ratio of the pixel distribution density in the first display sub-region to the pixel distribution density in the second display sub-region, k is an error adjustment coefficient, and $x_n$ is the initial grayscale value of the n-th sub-pixel in the original image data corresponding to the sub-pixel in the second display sub-region.

In a specific implementation, the error adjustment coefficient k can be adjusted according to the actual display effect of the display substrate, which is not limited here.

In a specific implementation, assuming that in the second display sub-region, there are m third pixel units in one unit area, and j pixels in the image data of a corresponding area, then one third pixel unit in the second display sub-region corresponds to j/m pixels in the image data, i.e., N=j/m. The target grayscale value of the sub-pixel in the second display sub-region can be determined according to any one or more sub-pixels among the corresponding N sub-pixels in the image data. For example, N=4, then the target grayscale of a sub-pixel in the second display sub-region can be determined according to the initial grayscale value of any one or more sub-pixels among the 4 sub-pixels in the corresponding image data thereof. For example, when determining according to the initial grayscale value of one of the 4 sub-pixels, there will be: $X=k*s*\rho*x_i$, where $x_i$ represents the initial grayscale value of any one of the 4 sub-pixels. For example, when determining according to the initial grayscale values of two sub-pixels, there will be:

$$X = k*s*\rho \left( \frac{x_1^{Gamma} + x_2^{Gamma}}{2} \right)^{\frac{1}{Gamma}},$$

where $x_1$ and $x_2$ represent the initial grayscale values of any two of the 4 sub-pixels. For example, when determining according to the initial grayscale values of three sub-pixels, there will be:

$$X = k*s*\rho \left( \frac{x_1^{Gamma} + x_2^{Gamma} + x_3^{Gamma}}{3} \right)^{\frac{1}{Gamma}},$$

where $x_1$, $x_2$, and $x_3$ represent the initial grayscale values of any three of the four sub-pixels. For example, when determining according to the initial grayscale values of the four sub-pixels, there will be:

$$X = k*s*\rho \left( \frac{x_1^{Gamma} + x_2^{Gamma} + x_3^{Gamma} + x_4^{Gamma}}{4} \right)^{\frac{1}{Gamma}},$$

where $x_1$, $x_2$, $x_3$ and $x_4$ represent the initial grayscale values of the 4 sub-pixels.

Based on the same inventive concept, the embodiment of the present disclosure further provides a display device, including any one of the above display substrates provided by the embodiments of the present disclosure. The display device can be any product or component having a display function, such as a mobile phone, a tablet computer, a television, a displayer, a notebook computer, a digital photo frame, a navigator, etc. The implementation of the display device can be referred to the above-mentioned embodiments of the display substrate, and details will not be repeated here.

Optionally, the display device provided by the embodiment of the present disclosure further includes a driver for driving the display substrate. The driver of the display substrate can be, for example, an IC (Integrated Circuit), an external CPU (Central Processing Unit), a microprocessor, etc. And the driver is specifically configured for:

receiving original image data;

determining a target grayscale value of each sub-pixel in the first display sub-region according to an initial grayscale value of a sub-pixel in the original image data corresponding to the sub-pixel in the first display sub-region;

determining a target grayscale value of each sub-pixel in the second display sub-region according to: the light emitting area of the sub-pixel in the second display sub-region, the pixel distribution density of the second display sub-region, and an initial grayscale value of a sub-pixel in the original image data corresponding to a region in which the sub-pixel in the second display sub-region is located;

driving each sub-pixel in the display substrate to display according to the target grayscale value thereof.

Optionally, in the display device provided by the embodiment of the present disclosure, the driver can determine the target grayscale value of each sub-pixel in the first display sub-region by the following method, specifically including:

determining a target grayscale value X of a first sub-pixel in the first display sub-region based on the formula:

$$X = \left(\frac{x_1^{Gamma} + x_2^{Gamma}}{2}\right)^{\frac{1}{Gamma}},$$

where Gamma represents a gamma value of the display substrate, and Gamma is 2.2 in general; $x_1$ and $x_2$ are the initial grayscale values of two first sub-pixels in the original image data corresponding to the first sub-pixel in the first display sub-region, respectively;

determining a target grayscale value Y of the second sub-pixel in the first display sub-region as the initial grayscale value y of one second sub-pixel in the original image data corresponding to the second sub-pixel in the first display sub-region;

determining the target grayscale value Z of a third sub-pixel in the first display sub-region based on the formula:

$$Z = \left(\frac{z_1^{Gamma} + z_2^{Gamma}}{2}\right)^{\frac{1}{Gamma}},$$

where $z_1$ and $z_2$ are the initial grayscale values of two third sub-pixels in the original image data corresponding to the third sub-pixel in the first display sub-region, respectively.

In a specific implementation, in order to alleviate the dark stripes at the boundary between the second display sub-region and the first display sub-region, the brightness of the second display sub-region can be appropriately adjusted. The brightness is in direct proportional to both of the light emitting area and the pixel distribution density.

Therefore, optionally, in the display device provided by the embodiment of the present disclosure, the driver can determine the target grayscale value of each sub-pixel in the second display sub-region by the following method, specifically including:

determining the target grayscale value X of the sub-pixel in the second display sub-region based on the formula:

$$X = k * s * \rho \left(\frac{x_1^{Gamma} + x_2^{Gamma} + \ldots + x_n^{Gamma}}{n}\right)^{\frac{1}{Gamma}},$$

where n is valued as any integer from 1~N, N is the number of the sub-pixels in the original image data corresponding to the sub-pixel in the second display sub-region, Gamma represents a gamma value of the display substrate, s represents a ratio of the light emitting area of the sub-pixel in the first display sub-region to the light emitting area of the sub-pixel in the second display sub-region, p represents a ratio of the pixel distribution density in the first display sub-region to the pixel distribution density in the second display sub-region, k is an error adjustment coefficient, and $x_n$ is the initial grayscale value of the n-th sub-pixel in the original image data corresponding to the sub-pixel in the second display sub-region.

In a specific implementation, the error adjustment coefficient k can be adjusted according to the actual display effect of the display substrate, which is not limited here.

For example, the driving method provided by the embodiment of the present disclosure can be referred to the implementation of the driver in the above-mentioned display device, and details will not be described here.

In a specific implementation, in the display device provided by the embodiment of the present disclosure, the driver integrates the algorithms for target grayscale values of sub-pixels in each sub-region into the IC. During display, the driver determines the target grayscale value corresponding to each sub-pixel according to the received image data, and drives the display substrate to display according to the target grayscale value.

Furthermore, before the display substrate performs display according to the target grayscale value, a Demura algorithm processing is generally required to improve brightness uniformity. A specific Demura algorithm can refer to that in the prior art and will not be described in details here.

Based on the same inventive concept, the embodiment of the present disclosure further provides a high-precision metal mask for manufacturing any one of the above-mentioned display substrates provided by the embodiments of the present disclosure. The high-precision metal mask includes a plurality of opening regions, and the shapes and positions of the plurality of opening regions correspond to the shapes and positions of the first sub-pixels, the second sub-pixels or the third sub-pixels.

In a specific implementation, a sub-pixel generally includes an anode layer, a light emitting layer, and a cathode layer; and the light emitting layer is generally evaporated by using the above-mentioned high-precision metal mask. Taking the display substrate shown in FIG. 1L as an example, in a high-precision metal mask for forming the first sub-pixel, as shown in FIG. 1O, the shape and position of the opening region 01 correspond to the shape and position of the light emitting layer of the first sub-pixel 1 in the display substrate. Moreover, due to limitations of the process, the area of the opening region 01 is generally greater than the area of the corresponding light emitting layer. The principles of the high-precision metal mask for forming the second sub-pixel and the high-precision metal mask for forming the third sub-pixel are similar to that of the first sub-pixel, and details will not be described here again.

The embodiment of the present disclosure further provides a display method of any one of the display substrates shown in FIGS. 1N-1S, including:

S901, receiving original image data;

S902, for a pixel in the first display sub-region, performing display according to a grayscale value of a corresponding pixel in the original image data; for a pixel in the second display sub-region, determining the number N of corresponding pixels in the original image data according to a ratio of the pixel distribution density of the first display sub-region to the pixel distribution density of the second display sub-region, and performing display according to the grayscale value of one or more pixel among the N pixels in the original image data corresponding to the position of the pixel in the second display sub-region.

In a specific implementation, according to the formula of the pixel distribution density mentioned above, in the case where the ratio of the pixel distribution density of the first display sub-region to the pixel distribution density of the second display sub-region is n, one pixel in the second display sub-region corresponds to n*n pixels in the original image data, that is, N=n*n.

Optionally, in the display method provided by the embodiment of the present disclosure, for a pixel in the second display sub-region, display is performed according to an average grayscale value of a plurality of pixels among the N pixels in the original image data corresponding to the position of the pixel in the second display sub-region. For example, N=4, that is, each pixel in the second display sub-region corresponds to 4 pixels in the original image data. Then for each pixel in the second display sub-region, display can be performed according to the average grayscale value of k pixels among the 4 pixels in the original image data corresponding to the pixel in the second display sub-region, and k=2, 3 or 4. Taking k=4 as an example, assuming that each pixel in the second display sub-region includes a first sub-pixel, a second sub-pixel and a third sub-pixel, then during display, a grayscale value corresponding to the first sub-pixel is $X1=(x1+x2+x3+x4)/4$, where $x1\sim x4$ represent the grayscale values of the first sub-pixels of the 4 pixels in the original image data corresponding to the pixel in the second display sub-region, respectively; similarly, during display, a grayscale value corresponding to the second sub-pixel is $Y1=(y1+y2+y3+y4)/4$, where $y1\sim y4$ represent the grayscale values of the second sub-pixels of the 4 pixels in the original image data corresponding to the pixel in the second display sub-region, respectively; during display, a grayscale value corresponding to the third sub-pixel is $Z1=(z1+z2+z3+z4)/4$, wherein $z1\sim z4$ represent the grayscale values of the third sub-pixels of the 4 pixels in the original image data corresponding to the pixel in the second display sub-region, respectively.

Optionally, in the display substrate provided by the embodiment of the present disclosure, for each pixel in the second display sub-region, display is performed according to the grayscale value of a pixel with the highest brightness among the N pixels in the original image data corresponding to the position of the pixel in the second display sub-region.

Optionally, in the display substrate provided by the embodiment of the present disclosure, for each pixel in the second display sub-region, display is performed according to the grayscale value of a pixel with the medium brightness among the N pixels in the original image data corresponding to the position of the pixel in the second display sub-region.

Optionally, in the display substrate provided by the embodiment of the present disclosure, for each pixel in the second display sub-region, display is performed according to the N pixels in the original image data corresponding to the position of the pixel in the second display sub-region, and a relative positional relationships between the pixel in the second display sub-region and the N pixels in the original image data.

Similarly, taking N=4 as an example, i.e. each pixel in the second display sub-region corresponds to 4 pixels in the original image data. Assuming that each pixel in the second display sub-region includes a first sub-pixel, a second sub-pixel and a third sub-pixel, then during display, a grayscale value corresponding to the first sub-pixel in the second display sub-region is $X1=(k1*x1+k2*x2+k3*x3+k4*x4)/4$, where $x1\sim x4$ represent the grayscale values of the first sub-pixels of the 4 pixels in the original image data corresponding to the pixel in the second display sub-region, respectively; similarly, during display, a grayscale value corresponding to the second sub-pixel in the second display sub-region is $Y1=(k1*y1+k2*y2+k3*y3+k4*y4)/4$, where $y1\sim y4$ represent the grayscale values of the second sub-pixels of the 4 pixels in the original image data corresponding to the pixel in the second display sub-region, respectively; during display, a grayscale value corresponding to the third sub-pixel is $Z1=(k1*z1+k2*z2+k3*z3+k4*z4)/4$, wherein $z1\sim z4$ represent the grayscale values of the third sub-pixels of the 4 pixels in the original image data corresponding to the pixel in the second display sub-region, respectively. Among them, $k1\sim k4$ are weight coefficients, which are determined by the distances between the position of the pixel in the second display sub-region and the corresponding 4 pixels in the original image data, respectively. The larger the distance is, the smaller the weight coefficient will be.

Optionally, in the display substrate provided by the embodiment of the present disclosure, for each pixel in the second display sub-region, display is performed according to the grayscale value of any one of the N pixels in the original image data corresponding to the position of the pixel in the second display sub-region. The display principle complies with the quantification of the human visual system, so no flicker will be occurred, the integrated circuit (IC) does not need to be redesigned, and the cost is low.

Optionally, in the display method provided by the embodiment of the present disclosure, in the case where a ratio of the pixel distribution density of the first display sub-region to the pixel distribution density of the second display sub-region is n, n is an integer greater than 1;

each pixel in the second display sub-region corresponds to n*n pixels arranged in a matrix in the original image data.

In a specific implementation, generally, n=2, that is, the pixel distribution density of the first display sub-region is 2 times that of the second display sub-region. Of course, according to practical applications, n can also take other values, which is not limited here.

For example, taking n=2 as an example, as shown in FIG. 11, each pixel in the second display sub-region corresponds to 2 rows and 2 columns of pixels arranged in a matrix in the original image data respectively. In FIG. 11, 4 pixels in a dashed box are the pixels corresponding to one pixel in the second display sub-region.

Optionally, in the display method provided by the embodiment of the present disclosure, for each pixel in the second display sub-region, one pixel at a same position among the corresponding n*n pixels in the original image data can be selected as a reference pixel, and each pixel in the second display sub-region performs display according to the grayscale value of a corresponding reference pixel thereof.

Similarly, taking n=2 as an example, as shown in FIG. 12A, for each pixel in the second display sub-region, the pixel at the position of the first row and the first column among the corresponding 2*2 pixels in the original image data can be selected as the reference pixel. Alternatively, as shown in FIG. 12B, for each pixel in the second display sub-region, the pixel at the position of the first row and the second column among the corresponding 2*2 pixels in the original image data can be selected as the reference pixel. Alternatively, as shown in FIG. 12C, for each pixel in the second display sub-region, the pixel at the position of the second row and the first column among the corresponding 2*2 pixels in the original image data can be selected as the reference pixel. As shown in FIG. 12D, for each pixel in the second display sub-region, the pixel at the position of the second row and the second column among the corresponding 2*2 pixels in the original image data can be selected as the reference pixel.

In a specific implementation, in the display method provided by the embodiment of the disclosure, each pixel in the second display sub-region performs display according to the grayscale value of the corresponding reference pixel thereof, specifically including: the first sub-pixel performs display according to the grayscale value of the first sub-pixel in the corresponding reference pixel, the second sub-pixel performs display according to the grayscale value of the second sub-pixel in the corresponding reference pixel, and the third sub-pixel performs display according to the grayscale value of the third sub-pixel in the corresponding reference pixel.

In a specific implementation, the ratio of the pixel distribution density of the first display sub-region to the pixel distribution density of the second display sub-region may not be an integer. For example, in the case where the ratio of the pixel distribution density of the first display sub-region to the pixel distribution density of the second display sub-region is m, where m=n+s, n is an integer greater than or equal to 1, and s is a decimal number between 0 and 1, then each pixel in the second display sub-region corresponds to n*n pixels arranged in a matrix in the original image data; alternatively, each pixel in the second display sub-region corresponds to n*(n+1) pixels arranged in a matrix in the original image data; alternatively, each pixel in the second display sub-region corresponds to (n+1)*(n+1) pixels arranged in a matrix in the original image data. The principle of the specific implementation is as same as that of the above case where m=n, and details will not be repeated here.

In the display method provided by the embodiment of the present disclosure, for each pixel in the first display sub-region, display is performed according to the grayscale value of a corresponding pixel thereof in the original image data. A specific implementation can refer to related technologies and will not be described in details here.

In a specific implementation, in the display method provided by the embodiment of the present disclosure, the algorithm for obtaining the grayscale value of each pixel according to the original image data can be integrated in an IC, an external central processing unit (CPU) or a microprocessor, etc., and of course, may also be integrated in a separately provided driver connected to each pixel, which is not limited here.

In a specific implementation, in the display method provided by the embodiment of the present disclosure, when pixels on the display substrate perform display according to the corresponding pixels thereof in the original image data, in order to optimize the display effect, it is generally necessary to perform processing by an image processing module such as SPR and by Demura algorithm, before performing imaging on the display screen.

The embodiment of the present disclosure also provides a driving method for driving any one of the display substrates shown in FIGS. 2B-2L, including:

S1001, receiving original image data;

S1002, determining a target grayscale value of each sub-pixel in the first display sub-region according to an initial grayscale value of a sub-pixel in the original image data corresponding to the sub-pixel in the first display sub-region; determining a target grayscale value of each sub-pixel in the transition display sub-region according to the pixel distribution density of the transition display sub-region and an initial grayscale value of a sub-pixel in the original image data corresponding to a region in which the sub-pixel in the transition display sub-region is located; determining a target grayscale value of each sub-pixel in the second display sub-region according to the light emitting area of the sub-pixel in the second display sub-region, the pixel distribution density of the second display sub-region, and an initial grayscale value of a sub-pixel in the original image data corresponding to a region in which the sub-pixel in the second display sub-region is located;

S1003, driving each sub-pixel in the display substrate to display according to the target grayscale value thereof.

For example, for sub-pixels in the first display sub-region, in the case where one physical pixel in the first display sub-region corresponds to one pixel in the image data, the target grayscale value of the sub-pixel in the first display sub-region generally is the initial grayscale value thereof. However, in the case where the number of the physical pixels in the first display sub-region is less than the number of the pixels in the image data, there is a sub-pixel borrowing relationship during display, so that one sub-pixel in the first display sub-region may correspond to two or more pixels in the image data; therefore, the target grayscale value of the sub-pixel in the first display sub-region needs to be converted according to the initial grayscale value of a corresponding sub-pixel in the original image data.

For each sub-pixel in the second display sub-region, due to the low resolution, one physical pixel just corresponds to one pixel in the image data during display, and the target grayscale value of a sub-pixel in the second display sub-region generally is the initial grayscale value of the sub-pixel. However, in this way, there is a problem that, due to the low resolution of the second display sub-region, if a display is directly performed according to the initial grayscale value, the brightness of the second display sub-region will significantly differ from the brightness of the first display sub-region, and obvious dark stripes will be occurred at the boundary between the second display sub-region and the first display sub-region. In order to solve this problem, the driving method provided by the embodiment of the present disclosure can adjust the grayscale of the sub-pixel in the second display sub-region according to the light emitting area of the sub-pixel and the pixel distribution density of the second display sub-region. For example, the larger the light emitting area of the sub-pixel is, the higher the overall brightness of the second display sub-region will be; and the more the sub-pixels are distributed in the second display sub-region, the higher the overall brightness of the second display sub-region will be.

For each sub-pixel in the transition display sub-region, one physical pixel just corresponds to one pixel in the image data during display. Because the pixel distribution density of the transition display sub-region is between the pixel distribution density of the second display sub-region and the pixel distribution density of the first display sub-region, a theoretical brightness of the transition display sub-region is between a theoretical brightness of the first display sub-region and a theoretical brightness of the second display sub-region. During display, the brightness of each sub-pixel in the transition display sub-region can be set as an average brightness value of the corresponding sub-pixels in the image data according to the pixel distribution density of the transition display sub-region.

It should be noted that, one physical pixel generally includes at least three sub-pixels of RGB.

In a specific implementation, in the case where the pixel arrangement in the first display sub-region is a Pentile arrangement, both the first sub-pixel and the third sub-pixel will be borrowed; as a result, during display, in general, one first sub-pixel corresponds to two pixels in the image data, one third sub-pixel corresponds to two pixels in the image data, and the second sub-pixel will not be borrowed; therefore, one second sub-pixel generally corresponds to one pixel in the image data. Therefore, optionally, in the driving method provided by the embodiment of the present disclosure, for each sub-pixel in the first display sub-region, determining the target grayscale value of the sub-pixel may specifically include:

determining the target grayscale value X of the first sub-pixel in the first display sub-region based on the formula:

$$X = \left(\frac{x_1^{Gamma} + x_2^{Gamma}}{2}\right)^{\frac{1}{Gamma}},$$

where Gamma represents a gamma value of the display substrate, $x_1$ and $x_2$ are the initial grayscale values of two first sub-pixels in the original image data corresponding to the first sub-pixel in the first display sub-region, respectively;

determining the target grayscale value Y of the second sub-pixel in the first display sub-region as the initial grayscale value y of one second sub-pixel in the original image data corresponding to the second sub-pixel in the first display sub-region;

determining the target grayscale value Z of the third sub-pixel in the first display sub-region based on the formula:

$$Z = \left(\frac{z_1^{Gamma} + z_2^{Gamma}}{2}\right)^{\frac{1}{Gamma}},$$

where $z_1$ and $z_2$ are the initial grayscale values of two third sub-pixels in the original image data corresponding to the third sub-pixel in the first display sub-region, respectively.

In a specific implementation, in order to alleviate the dark stripes at the boundary between the second display sub-region and the first display sub-region, the brightness of the second display sub-region can be appropriately adjusted. The brightness is in direct proportional to both of the light emitting area and the pixel distribution density. Therefore, optionally, in the driving method provided by the embodiment of the present disclosure, for each sub-pixel in the second display sub-region, determining the target grayscale value of the sub-pixel may specifically include:

determining the target grayscale value X of the sub-pixel in the second display sub-region based on the formula:

$$X = k*s*\rho\left(\frac{x_1^{Gamma} + x_2^{Gamma} + \ldots + x_n^{Gamma}}{n}\right)^{\frac{1}{Gamma}},$$

where n is valued as any integer from 1~N, N is the number of the sub-pixels in the original image data corresponding to the sub-pixel in the second display sub-region, Gamma represents a gamma value of the display substrate, s represents a ratio of the light emitting area of the sub-pixel in the first display sub-region to the light emitting area of the sub-pixel in the second display sub-region, ρ represents a ratio of the pixel distribution density in the first display sub-region to the pixel distribution density in the second display sub-region, k is an error adjustment coefficient, and $x_n$ is the initial grayscale value of the n-th sub-pixel in the original image data corresponding to the sub-pixel in the second display sub-region.

In a specific implementation, the error adjustment coefficient k can be adjusted according to the actual display effect of the display substrate, which is not limited here.

In a specific implementation, assuming that in the second display sub-region, there are m third pixel units in one unit area, and j pixels in the image data of a corresponding area, then one third pixel unit in the second display sub-region corresponds to j/m pixels in the image data, i.e., N=j/m. Then, the target grayscale value of the sub-pixel in the second display sub-region can be determined according to any one or more sub-pixels among the corresponding N sub-pixels in the image data. For example, N=4, then the target grayscale of a sub-pixel in the second display sub-region can be determined according to the initial grayscale value of any one or more sub-pixels among the 4 sub-pixels in the corresponding image data thereof. For example, when determining according to the initial grayscale value of one of the 4 sub-pixels, there will be: $X=k*s*\rho*x_i$, where $x_i$ represents the initial grayscale value of any one of the 4 sub-pixels. For example, when determining according to the initial grayscale values of two sub-pixels, there will be:

$$X = k*s*\rho\left(\frac{x_1^{Gamma} + x_2^{Gamma}}{2}\right)^{\frac{1}{Gamma}},$$

where $x_1$ and $x_2$ represent the initial grayscale values of any two of the 4 sub-pixels. For example, when determining according to the initial grayscale values of three sub-pixels, there will be:

$$X = k*s*\rho\left(\frac{x_1^{Gamma} + x_2^{Gamma} + x_3^{Gamma}}{3}\right)^{\frac{1}{Gamma}},$$

where $x_1$, $x_2$, and $x_3$ represent the initial grayscale values of any three of the four sub-pixels. For example, when determining according to the initial grayscale values of the four sub-pixels, there will be:

$$X = k*s*\rho\left(\frac{x_1^{Gamma} + x_2^{Gamma} + x_3^{Gamma} + x_4^{Gamma}}{4}\right)^{\frac{1}{Gamma}},$$

where $x_1$, $x_2$, $x_3$ and $x_4$ represent the initial grayscale values of the 4 sub-pixels.

Optionally, in the driving method provided by the embodiment of the present disclosure, for each sub-pixel in the transition display sub-region, determining the target grayscale value of the sub-pixel may specifically include: determining the target grayscale value X of the sub-pixel in the transition display sub-region based on the formula:

$$X = k*s*\rho\left(\frac{x_1^{Gamma} + x_2^{Gamma} + \ldots + x_N^{Gamma}}{N}\right)^{\frac{1}{Gamma}},$$

where N is the number of the sub-pixels in the original image data corresponding to the sub-pixel in the transition display sub-region, Gamma represents a gamma value of the display substrate, s represents a ratio of the light emitting area of the sub-pixel in the first display sub-region to the light emitting area of the sub-pixel in the transition display sub-region, ρ represents a ratio of the pixel distribution density in the first display sub-region to the pixel distribution density in the transition display sub-region, k is an error adjustment coefficient, and $X_1$~$X_N$ are the initial grayscale values of the N sub-pixel in the original image data corresponding to the sub-pixel in the transition display sub-region.

In a specific implementation, assuming that in the transition display sub-region, there are m fourth pixel units in one unit area, and j pixels in the image data of a corresponding area, then one fourth pixel unit in the transition display sub-region corresponds to j/m pixels in the image data, i.e., N=j/m. The target grayscale value of the sub-pixel in the transition display sub-region can be determined according to any one or more sub-pixels among the corresponding N sub-pixels in the image data.

Alternatively, optionally, in the driving method provided by the embodiment of the present disclosure, for each sub-pixel in the transition display sub-region, determining the target grayscale value of the sub-pixel may specifically include:

determining the target grayscale value X of the first sub-pixel in the transition display sub-region based on the formula:

$$X = k*s*\rho\left(\frac{x_1^{Gamma} + x_2^{Gamma}}{2}\right)^{\frac{1}{Gamma}},$$

where Gamma represents a gamma value of the display substrate, $x_1$ and $x_2$ are the initial grayscale values of two first sub-pixels in the original image data corresponding to the first sub-pixel in the transition display sub-region, respectively;

determining the target grayscale value Y of the second sub-pixel in the transition display sub-region based on the formula: Y=k*s*ρ*y, where y represents the initial grayscale value of one second sub-pixels in the original image data corresponding to the second sub-pixel in the transition display sub-region;

determining the target grayscale value Z of the third sub-pixel in the transition display sub-region based on the formula:

$$Z = k*s*\rho\left(\frac{z_1^{Gamma} + z_2^{Gamma}}{2}\right)^{\frac{1}{Gamma}},$$

where $z_1$ and $z_2$ are the initial grayscale values of two third sub-pixels in the original image data corresponding to the third sub-pixel in the transition display sub-region, respectively.

Among them, s represents a ratio of the light emitting area of the sub-pixel in the first display sub-region to the light emitting area of the sub-pixel in the transition display sub-region, p represents a ratio of the pixel distribution density in the first display sub-region to the pixel distribution density in the transition display sub-region, and k is an error adjustment coefficient.

That is to say, in the transition display sub-region, the algorithm of the target grayscale value corresponding to each sub-pixel is adjusted according to the ratio of the light emitting area of the sub-pixel in the first display sub-region to the light emitting area of the sub-pixel in the transition display sub-region and the ratio of the pixel distribution density in the first display sub-region to the pixel distribution density in the transition display sub-region, based on the algorithm of the target grayscale value corresponding to each sub-pixel in the first display sub-region.

Based on the same inventive concept, the embodiment of the present disclosure further provides a display device, including any one of the above display substrates provided by the embodiments of the present disclosure. The display device can be any product or component having a display function, such as a mobile phone, a tablet computer, a television, a displayer, a notebook computer, a digital photo frame, a navigator, etc. The implementation of the display device can be referred to the above-mentioned embodiments of the display substrate, and details will not be repeated here.

Optionally, the display device provided by the embodiment of the present disclosure further includes a driver configured for driving the display substrate, and the driver of the display substrate can be, for example, an IC, or an external CPU, a microprocessor, or the like. And the driver can be configured for:

receiving original image data;

for each sub-pixel in the first display sub-region, determining a target grayscale value of the sub-pixel according to an initial grayscale value of the sub-pixel in the original image data corresponding to the sub-pixel in the first display sub-region; for each sub-pixel in the second display sub-region, determining a target grayscale value of the sub-pixel according to the light emitting area of the sub-pixel in the second display sub-region, the pixel distribution density of the second display sub-region, and an initial grayscale value of the sub-pixel in the original image data corresponding to a region in which the sub-pixel in the second display sub-region is located;

driving each sub-pixel in the display substrate to display according to a target grayscale value thereof.

Optionally, in the display device provided by the embodiment of the present disclosure, the driver can determine the target grayscale value of each sub-pixel in the first display sub-region by the following method, specifically including:

determining a target grayscale value X of a first sub-pixel in the first display sub-region based on the formula:

$$X = \left(\frac{x_1^{Gamma} + x_2^{Gamma}}{2}\right)^{\frac{1}{Gamma}},$$

where Gamma represents a gamma value of the display substrate, and Gamma is 2.2 in general; $x_1$ and $x_2$ are the initial grayscale values of two first sub-pixels in the original image data corresponding to the first sub-pixel in the first display sub-region, respectively;

determining a target grayscale value Y of the second sub-pixel in the first display sub-region as the initial grayscale value y of one second sub-pixel in the original image data corresponding to the second sub-pixel in the first display sub-region;

determining the target grayscale value Z of a third sub-pixel in the first display sub-region based on the formula:

$$Z = \left(\frac{z_1^{Gamma} + z_2^{Gamma}}{2}\right)^{\frac{1}{Gamma}},$$

where $z_1$ and $z_2$ are the initial grayscale values of two third sub-pixels in the original image data corresponding to the third sub-pixel in the first display sub-region, respectively.

In a specific implementation, in order to alleviate the dark stripes at the boundary between the second display sub-region and the first display sub-region, the brightness of the second display sub-region can be appropriately adjusted. The brightness is in direct proportional to both of the light emitting area and the pixel distribution density. Therefore, optionally, in the display device provided by the embodiment of the present disclosure, the driver can determine the target grayscale value of each sub-pixel in the second display sub-region by the following method, specifically including:

determining the target grayscale value X of the sub-pixel in the second display sub-region based on the formula:

$$X = k*s*\rho\left(\frac{x_1^{Gamma} + x_2^{Gamma} + \ldots + x_n^{Gamma}}{n}\right)^{\frac{1}{Gamma}},$$

where n is valued as any integer from 1~N, N is the number of the sub-pixels in the original image data corresponding to the sub-pixel in the second display sub-region, Gamma represents a gamma value of the display substrate, s represents a ratio of the light emitting area of the sub-pixel in the first display sub-region to the light emitting area of the sub-pixel in the second display sub-region, ρ represents a ratio of the pixel distribution density in the first display sub-region to the pixel distribution density in the second display sub-region, k is an error adjustment coefficient, and $x_n$ is the initial grayscale value of the n-th sub-pixel in the original image data corresponding to the sub-pixel in the second display sub-region.

In a specific implementation, the error adjustment coefficient k can be adjusted according to the actual display effect of the display substrate, which is not limited here.

Optionally, in the display device provided by the embodiment of the present disclosure, for each sub-pixel in the transition display sub-region, the driver can determine the target grayscale value of the sub-pixel by the following method, specifically including: determining the target grayscale value X of the sub-pixel in the transition display sub-region based on the formula:

$$X = k*s*\rho\left(\frac{x_1^{Gamma} + x_2^{Gamma} + \ldots + x_N^{Gamma}}{N}\right)^{\frac{1}{Gamma}},$$

where N is the number of the sub-pixels in the original image data corresponding to the sub-pixel in the transition display sub-region, Gamma represents a gamma value of the display substrate, s represents a ratio of the light emitting area of the sub-pixel in the first display sub-region to the light emitting area of the sub-pixel in the transition display sub-region, ρ represents a ratio of the pixel distribution density in the first display sub-region to the pixel distribution density in the transition display sub-region, k is an error adjustment coefficient, and $X_1$~$X_N$ are the initial grayscale values of the N sub-pixel in the original image data corresponding to the sub-pixel in the transition display sub-region.

Alternatively, optionally, in the display device provided by the embodiment of the present disclosure, for each sub-pixel in the transition display sub-region, the driver can determine the target grayscale value of the sub-pixel by the following method, specifically including:

determining the target grayscale value X of the first sub-pixel in the transition display sub-region based on the formula:

$$X = k*s*\rho\left(\frac{x_1^{Gamma} + x_2^{Gamma}}{2}\right)^{\frac{1}{Gamma}},$$

where Gamma represents a gamma value of the display substrate, $x_1$ and $x_2$ are the initial grayscale values of two first sub-pixels in the original image data corresponding to the first sub-pixel in the transition display sub-region, respectively;

determining the target grayscale value Y of the second sub-pixel in the transition display sub-region based on the formula: Y=k*s*ρ*y, where y represents the initial grayscale value of one second sub-pixels in the original image data corresponding to the second sub-pixel in the transition display sub-region;

determining the target grayscale value Z of the third sub-pixel in the transition display sub-region based on the formula:

$$Z = k*s*\rho\left(\frac{z_1^{Gamma} + z_2^{Gamma}}{2}\right)^{\frac{1}{Gamma}},$$

where $z_1$ and $z_2$ are the initial grayscale values of two third sub-pixels in the original image data corresponding to the third sub-pixel in the transition display sub-region, respectively.

Among them, s represents a ratio of the light emitting area of the sub-pixel in the first display sub-region to the light emitting area of the sub-pixel in the transition display sub-region, ρ represents a ratio of the pixel distribution density in the first display sub-region to the pixel distribution density in the transition display sub-region, and k is an error adjustment coefficient.

For example, the driving method of the driver provided by the embodiment of the present disclosure can be referred to the implementation of the driving method of the above-mentioned display device, and details will not be described here.

In a specific implementation, in the display device provided by the embodiment of the present disclosure, the driver integrates the algorithms for target grayscale values of sub-pixels in each sub-region into the IC. During display, the driver determines the target grayscale value corresponding to each sub-pixel according to the received image data, and drives the display substrate to display according to the target grayscale value.

Furthermore, before the display substrate performs display according to the target grayscale value, a Demura algorithm processing is generally required to improve brightness uniformity. A specific Demura algorithm can refer to that in the prior art and will not be described in detail here.

It should be noted that, for the sake of clarity, in accompanying drawings for illustrating the embodiment(s) of the present disclosure, the thickness and size of a layer or a structure may be enlarged. It should be understood that, in the case in which a component or element such as a layer, film, area, substrate or the like is referred to be "on" or "under" another component or element, it may be directly on or under the another component or element or a component or element is interposed therebetween.

In case of no conflict, features in one embodiment or in different embodiments of the present disclosure can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A full-screen display device, comprising:
   a display substrate having a light emitting side and comprising:
   a first display sub-region comprising a first pixel unit and a second pixel unit, wherein the first pixel unit comprises a first sub-pixel and a second sub-pixel, and the second pixel unit comprises a second sub-pixel and a third sub-pixel; and
   a second display sub-region comprising a repeating unit comprising a third pixel unit and a first transparent pixel, wherein the third pixel unit comprises a first sub-pixel, a second sub-pixel, and a third sub-pixel, and wherein the first transparent pixel is not provided with a light emitting functional layer and allows ambient light to transmit; and
   an under-screen camera attached onto a side of the display substrate opposite to the light emitting side and configured to receive ambient light passing through the second display sub-region for imaging, wherein an orthographic projection of the under-screen camera on the display substrate falls within the second display sub-region and has an overlap with the first transparent pixel,
   wherein the first transparent pixel is configured such that a pixel density of the second display sub-region is smaller than that of the first display sub-region, and a light transmittance of ambient light of the second display sub-region is greater than that of the first display sub-region,
   wherein an area of the first transparent pixel is greater than or equal to a sum of areas of the first sub-pixel, the second sub-pixel, and the third sub-pixel in the third pixel unit,
   wherein the first pixel unit and the second pixel unit disposed adjacently in the first display sub-region constitutes a first repeating unit, and the first repeating unit is configured to be driven in a sub-pixel borrowing manner,
   the third pixel unit and the first transparent pixel disposed adjacently in the second display sub-region constitutes a second repeating unit, and the second repeating unit is configured to be driven in a manner in which no sub-pixel is borrowed,
   the first sub-pixel, the second sub-pixel, and the third sub-pixel in the third pixel unit have substantially the same first shape, and the first sub-pixel, the second sub-pixel, and the third sub-pixel in the first pixel unit and the second pixel unit have substantially the same second shape, and
   the first shape is different from the second shape.

2. The full-screen display device of claim 1, wherein at least one of the first shape or the second shape is a substantially regular shape.

3. The full-screen display device of claim 2, wherein the first shape is substantially a rectangular shape, the rectangular shape has a long side and a short side, and a sum of short sides of two of the first sub-pixel, the second sub-pixel, and the third sub-pixel in the third pixel unit is less than or equal to the long side of the remaining one of the first sub-pixel, the second sub-pixel, and the third sub-pixel in the third pixel unit.

4. The full-screen display device of claim 1, wherein connecting lines of centers of the first sub-pixel, the second sub-pixel, and the third sub-pixel in the first pixel unit and the second pixel unit that are adjacent are substantially presented as a quadrangle.

5. The full-screen display device of claim 4, wherein the quadrangle is a parallelogram.

6. The full-screen display device of claim 1, wherein the first display sub-region comprises a plurality of first pixel units and a plurality of second pixel units, so that in the first display sub-region, a plurality of first sub-pixels are continuously arranged in a first direction to be in a first sub-pixel row, a plurality of second sub-pixels are continuously arranged in the first direction to be in a second sub-pixel row, and a plurality of third sub-pixels are continuously arranged in the first direction to be in a third sub-pixel row; and
   in a second direction intersecting with the first direction, the first sub-pixel row, the second sub-pixel row, and the third sub-pixel row in the first display sub-region are alternately arranged.

7. The full-screen display device of claim 6, wherein sub-pixels of the same color in the first sub-pixel row, the second sub-pixel row, and the third sub-pixel row in the first display sub-region are arranged at approximately equal intervals along the first direction.

8. The full-screen display device of claim 1, wherein the second display sub-region comprises a plurality of third pixel units and a plurality of first transparent pixels, so that the first transparent pixel and two of the first sub-pixel, the second sub-pixel, and the third sub-pixel in the second display sub-region are alternately arranged in a first direction, and the first transparent pixel and the remaining one of the first sub-pixel, the second sub-pixel, and the third sub-pixel in the second display sub-region are also alternately arranged in the first direction, and the plurality of first transparent pixels also extend in the first direction and in a second direction intersecting with the first direction, respectively, so as to be in a first transparent pixel row and a first transparent pixel column, respectively.

9. The full-screen display device of claim 8, wherein sub-pixels of the same color among the first sub-pixel, the second sub-pixel, and the third sub-pixel in the second display sub-region are arranged at approximately equal intervals along the first direction and along the second direction.

10. The full-screen display device of claim 1, wherein at least two of the first sub-pixel, the second sub-pixel, and the third sub-pixel in the third pixel unit have different areas.

11. The full-screen display device of claim 1, wherein the first sub-pixel, the second sub-pixel, and the third sub-pixel in the first pixel unit and the second pixel unit have substantially the same area.

12. The full-screen display device of claim 1, wherein connecting lines of centers of the first sub-pixel, the second sub-pixel, and the third sub-pixel in the third pixel unit are substantially presented as a triangle.

13. The full-screen display device of claim 1, wherein the second sub-pixel is a green sub-pixel, one of the first sub-pixel and the third sub-pixel is a red sub-pixel, and the other one is a blue sub-pixel.

14. A full-screen display device, comprising:
a display substrate having a light emitting side and comprising:
a first display sub-region comprising a first pixel unit and a second pixel unit, wherein the first pixel unit comprises a first sub-pixel and a second sub-pixel, and the second pixel unit comprises a second sub-pixel and a third sub-pixel; and
a second display sub-region comprising a repeating unit comprising a third pixel unit and a first transparent pixel, wherein the third pixel unit comprises a first sub-pixel, a second sub-pixel, and a third sub-pixel, and wherein the first transparent pixel is not provided with a light emitting functional layer and allows ambient light to transmit; and an under-screen camera attached onto a side of the display substrate opposite to the light emitting side and configured to receive ambient light passing through the second display sub-region for imaging, wherein an orthographic projection of the under-screen camera on the display substrate falls within the second display sub-region and has an overlap with the first transparent pixel, wherein the first transparent pixel is configured such that a light transmittance of ambient light of the second display sub-region is greater than that of the first display sub-region, wherein an area of the first transparent pixel is greater than or equal to a sum of areas of the first sub-pixel, the second sub-pixel, and the third sub-pixel in the third pixel unit, wherein the second display sub-region is in a circular shape, and the first display sub-region is formed to surround the second display sub-region, wherein the first pixel unit and the second pixel unit disposed adjacently in the first display sub-region constitutes a first repeating unit, and the first repeating unit is configured to be driven in a sub-pixel borrowing manner, the third pixel unit and the first transparent pixel disposed adjacently in the second display sub-region constitutes a second repeating unit, and the second repeating unit is configured to be driven in a manner in which no sub-pixel is borrowed, the first sub-pixel, the second sub-pixel, and the third sub-pixel in the third pixel unit have substantially the same first shape, and the first sub-pixel, the second sub-pixel, and the third sub-pixel in the first pixel unit and the second pixel unit have substantially the same second shape, and the first shape is different from the second shape.

15. The full-screen display device of claim 14, wherein at least one of the first shape or the second shape is a substantially regular shape.

16. The full-screen display device of claim 15, wherein the first shape is substantially a rectangular shape, the rectangular shape has a long side and a short side, and a sum of short sides of two of the first sub-pixel, the second sub-pixel, and the third sub-pixel in the third pixel unit is less than or equal to the long side of the remaining one of the first sub-pixel, the second sub-pixel, and the third sub-pixel in the third pixel unit.

\* \* \* \* \*